(12) United States Patent
Kashima et al.

(10) Patent No.: US 9,929,317 B2
(45) Date of Patent: Mar. 27, 2018

(54) DEEP ULTRAVIOLET LED AND METHOD FOR MANUFACTURING THE SAME

(71) Applicants: MARUBUN CORPORATION, Tokyo (JP); TOSHIBA KIKAI KABUSHIKI KAISHA, Tokyo (JP); RIKEN, Saitama (JP); ULVAC, INC., Kanagawa (JP); TOKYO OHKA KOGYO CO., LTD., Kanagawa (JP)

(72) Inventors: Yukio Kashima, Tokyo (JP); Eriko Matsuura, Tokyo (JP); Mitsunori Kokubo, Shizuoka (JP); Takaharu Tashiro, Shizuoka (JP); Takafumi Ookawa, Shizuoka (JP); Hideki Hirayama, Saitama (JP); Noritoshi Maeda, Saitama (JP); Masafumi Jo, Saitama (JP); Ryuichiro Kamimura, Shizuoka (JP); Yamato Osada, Shizuoka (JP); Satoshi Shimatani, Kanagawa (JP)

(73) Assignees: MARUBUN CORPORATION, Tokyo (JP); TOSHIBA KIKAI KABUSHIKI KAISHA, Tokyo (JP); RIKEN, Saitama (JP); ULVAC, INC., Kanagawa (JP); TOKYO OHKA KOGYO CO., LTD., Kanagawa (JP)

( * ) Notice: Subject to any disclaimer, the term of this patent is extended or adjusted under 35 U.S.C. 154(b) by 0 days.

(21) Appl. No.: 15/540,510

(22) PCT Filed: Jul. 29, 2015

(86) PCT No.: PCT/JP2015/071453
§ 371 (c)(1),
(2) Date: Jun. 28, 2017

(87) PCT Pub. No.: WO2016/113935
PCT Pub. Date: Jul. 21, 2016

(65) Prior Publication Data
US 2017/0358712 A1    Dec. 14, 2017

(30) Foreign Application Priority Data

Jan. 16, 2015  (JP) .................................. 2015-007108

(51) Int. Cl.
*H01L 33/00* (2010.01)
*H01L 33/40* (2010.01)
(Continued)

(52) U.S. Cl.
CPC ............ *H01L 33/405* (2013.01); *H01L 33/32* (2013.01); *H01L 33/52* (2013.01); *H01L 2933/005* (2013.01); *H01L 2933/0016* (2013.01)

(58) Field of Classification Search
CPC ........ H01L 33/405; H01L 33/32; H01L 33/52
(Continued)

(56) References Cited

U.S. PATENT DOCUMENTS

| 5,337,328 A | 8/1994 | Lang et al. |
| 5,955,749 A | 9/1999 | Joannopoulos et al. |

(Continued)

FOREIGN PATENT DOCUMENTS

| CN | 103354956 | 10/2013 |
| DE | 102009057780 | 6/2001 |

(Continued)

OTHER PUBLICATIONS

International Search Report issued in corresponding International Application No. PCT/JP2016/082397 (3 pages), dated Mar. 30, 2016.
(Continued)

*Primary Examiner* — Tu-Tu Ho
(74) *Attorney, Agent, or Firm* — Hamre, Schumann, Mueller & Larson, P.C.

(57) ABSTRACT

Provided is a deep ultraviolet LED with a design wavelength λ, including an Al reflecting electrode layer, an ultrathin metal layer, and a transparent p-AlGaN contact layer that are sequentially arranged from a side opposite to a substrate, and a photonic crystal periodic structure provided in the range of
(Continued)

the thickness direction of the transparent p-AlGaN contact layer. The photonic crystal periodic structure has a photonic band gap.

26 Claims, 45 Drawing Sheets

(51) Int. Cl.
  *H01L 33/32* (2010.01)
  *H01L 33/52* (2010.01)
(58) Field of Classification Search
  USPC .......................................................... 257/98
  See application file for complete search history.

(56) References Cited

U.S. PATENT DOCUMENTS

| | | | |
|---|---|---|---|
| 7,520,742 B2 | 4/2009 | Motowaki et al. | |
| 7,687,811 B2 | 3/2010 | Jang et al. | |
| 8,405,103 B2 | 3/2013 | Lee et al. | |
| 8,419,995 B2 | 4/2013 | Yoneda et al. | |
| 8,703,837 B2 | 4/2014 | Kawaguchi | |
| 8,731,350 B1* | 5/2014 | Lin | G02B 6/136 |
| | | | 359/337.21 |
| 9,005,502 B2 | 4/2015 | Chiba et al. | |
| 9,073,102 B2 | 7/2015 | Yoshida | |
| 9,263,649 B2 | 2/2016 | Koike et al. | |
| 9,349,918 B2 | 5/2016 | Kashima et al. | |
| 9,577,164 B2* | 2/2017 | Tsujimoto | H01L 33/22 |
| 2002/0167013 A1 | 11/2002 | Iwasaki et al. | |
| 2004/0016936 A1 | 1/2004 | Tanaka et al. | |
| 2004/0113166 A1 | 6/2004 | Tadatomo et al. | |
| 2004/0114652 A1 | 6/2004 | Yoshikawa | |
| 2004/0206962 A1 | 10/2004 | Erchak et al. | |
| 2004/0252509 A1 | 12/2004 | Lin | |
| 2004/0264903 A1 | 12/2004 | Dridi et al. | |
| 2006/0043400 A1 | 3/2006 | Erchak et al. | |
| 2006/0255341 A1 | 11/2006 | Pinnington et al. | |
| 2006/0284187 A1 | 12/2006 | Wierer et al. | |
| 2007/0081253 A1 | 4/2007 | Yamauchi | |
| 2007/0177644 A1 | 8/2007 | Corzine | |
| 2007/0257269 A1 | 11/2007 | Cho et al. | |
| 2008/0024053 A1 | 1/2008 | Fujimoto et al. | |
| 2008/0061304 A1 | 3/2008 | Huang et al. | |
| 2008/0258160 A1 | 10/2008 | Do | |
| 2009/0134425 A1 | 5/2009 | Nagai | |
| 2009/0184334 A1 | 7/2009 | Lee et al. | |
| 2010/0072501 A1 | 3/2010 | Wakai et al. | |
| 2010/0140643 A1 | 6/2010 | Cho et al. | |
| 2010/0237372 A1 | 9/2010 | Kim et al. | |
| 2011/0068676 A1 | 3/2011 | Jeon et al. | |
| 2011/0309326 A1 | 12/2011 | Gaska et al. | |
| 2012/0027038 A1 | 2/2012 | Noda et al. | |
| 2012/0112165 A1 | 5/2012 | Charlton et al. | |
| 2012/0224147 A1 | 9/2012 | Tomiyama et al. | |
| 2012/0228653 A1 | 9/2012 | Ishida et al. | |
| 2012/0247950 A1 | 10/2012 | Kaida et al. | |
| 2012/0261642 A1 | 10/2012 | Bergenek et al. | |
| 2013/0009167 A1 | 1/2013 | Tan et al. | |
| 2013/0026531 A1 | 1/2013 | Seo et al. | |
| 2013/0037820 A1 | 2/2013 | Tsukihara et al. | |
| 2013/0043500 A1 | 2/2013 | Orita | |
| 2013/0069034 A1 | 3/2013 | Hirayama | |
| 2013/0146916 A1 | 6/2013 | Yamamoto | |
| 2013/0222770 A1 | 8/2013 | Tomiyama | |
| 2013/0320301 A1 | 12/2013 | Seo et al. | |
| 2013/0328013 A1 | 12/2013 | Inazu et al. | |
| 2014/0057377 A1 | 2/2014 | Kamimura et al. | |
| 2014/0084317 A1 | 3/2014 | Lee et al. | |
| 2014/0151733 A1 | 6/2014 | Koike et al. | |
| 2014/0167066 A1 | 6/2014 | Kashima et al. | |
| 2015/0044417 A1 | 2/2015 | Koike | |
| 2015/0214448 A1 | 7/2015 | Lee et al. | |
| 2016/0042102 A1 | 2/2016 | Kashima et al. | |
| 2016/0133785 A1 | 5/2016 | Kashima et al. | |

FOREIGN PATENT DOCUMENTS

| | | |
|---|---|---|
| EP | 1526583 | 4/2005 |
| EP | 2690650 | 1/2014 |
| EP | 2827361 | 1/2015 |
| EP | 2942818 | 11/2015 |
| JP | 2002305328 | 10/2002 |
| JP | 2007109689 | 4/2004 |
| JP | 2004200209 | 7/2004 |
| JP | 2005012160 | 1/2005 |
| JP | 2006196658 | 7/2006 |
| JP | 2006276388 | 10/2006 |
| JP | 2006523953 | 10/2006 |
| JP | 2007036186 | 2/2007 |
| JP | 2007294789 | 11/2007 |
| JP | 2007305998 | 11/2007 |
| JP | 2008030235 | 2/2008 |
| JP | 2008053425 | 3/2008 |
| JP | 2008098526 | 4/2008 |
| JP | 2008117922 | 5/2008 |
| JP | 2008538658 | 10/2008 |
| JP | 2008311317 | 12/2008 |
| JP | 2009033180 | 2/2009 |
| JP | 4329374 | 9/2009 |
| JP | 2009267263 | 11/2009 |
| JP | 2010074008 | 4/2010 |
| JP | 2010074090 | 4/2010 |
| JP | 2010135798 | 6/2010 |
| JP | 200981469 | 10/2010 |
| JP | 4610863 | 1/2011 |
| JP | 2011086853 | 4/2011 |
| JP | 2011228513 | 11/2011 |
| JP | 2012186414 | 9/2012 |
| JP | 2013009002 | 1/2013 |
| JP | 2013120829 | 6/2013 |
| JP | 2013530537 | 7/2013 |
| JP | 5315513 | 10/2013 |
| JP | 2014068010 | 4/2014 |
| JP | 201541763 | 3/2015 |
| JP | 5757512 | 7/2015 |
| JP | 2015195388 | 11/2015 |
| KR | 20090001903 | 1/2009 |
| KR | 20110131212 | 12/2011 |
| KR | 20120117892 | 10/2012 |
| KR | 20130055015 | 5/2013 |
| KR | 20140133607 | 11/2014 |
| TW | 201535782 | 9/2015 |
| WO | 2008041161 | 4/2008 |
| WO | 2009148138 | 12/2009 |
| WO | 2011049018 | 4/2011 |
| WO | 2011104969 | 9/2011 |
| WO | 2011159993 | 12/2011 |
| WO | 2012067080 | 5/2012 |
| WO | 2012127660 | 9/2012 |
| WO | 2013008556 | 1/2013 |
| WO | 2013132993 | 9/2013 |
| WO | 2015008776 | 1/2015 |
| WO | 2013137176 | 8/2015 |
| WO | 2015133000 | 9/2015 |
| WO | 2016113935 | 7/2016 |

OTHER PUBLICATIONS

International Search Report issued in corresponding International Application No. PCT/JP2016/075756 (3 pages), dated Nov. 8, 2016.
Supplementary European Search Report issued in European Application No. 16861100.2 dated Jul. 17, 2017 (12 pages).
International search report and Written Opinion for the International application No. PCT/JP2015/071453, dated Sep. 29, 2015 (9 pages).
Hirayama et al.: "Recent progress and future prospects of ALgaN-based high-efficiency deep-ultraviolet light-emitting diodes"; Japanese Journal of Applied Physics, vol. 53, 2014, pp. 1-10.

(56) References Cited

OTHER PUBLICATIONS

Shinji Matsui: "Current Nano-imprint processing technologies"; Monthly Display, 2005, vol. 11, No. 5, pp. 82-89 (partial English translation).

Nakamatsu et al.: "Bilayer Resist Method for Room-Temperature Nanoimprint Lithography"; Japanese Journal of Applied Physics, 2004, vol. 43, No. 6B, pp. 4050-4053.

Korean Office Action for Korean application No. 2015-7005308, dated Oct. 21, 2015 (6 pages).

Extended European Search Report issued in the European Patent Application No. 14841324.8 dated Oct. 23, 2015 (6 pages).

International search report for International application No. PCT/JP2014/068864 dated Sep. 9, 2014 (4 pages).

Office Action dated Jun. 1, 2015 in Korean Application No. 2015-7005308 (6 pages).

T. Nakashima et al.: "Improvment of the light extraction efficiency in 350-nm-emission UV-LED," Proceedings of the [[6]]60th Lecture Presentation in Spring of the Japan Society of Applied Physics, 2013, 29p-G21-10, 2 pages total (English translation provided).

Crest Research Area of the Strategic Basic Research Programs: "Light/Photon Science and Technology toward Creation of New Function," Report of Termination of Research for Research Subject: "Research of 230-350mm Band in AlGaN-based Deep Ultraviolet High-Efficiency Light Emitting Device," Research period: Oct. 2007 to Mar. 2013, 53 pages total (Partial EnglishTranslation provided).

Delbeke et al.: "Rigorous electromagnetic analysis of dipole in periodically corrugated layers: the grating-assisted resonant-cavity light-emitting diode." J. Opt. Soc. AM. A, 2002, vol. 64, No. 19, No. 5, pp. 871-880.

Gourley et al.: "Optical properties of two-dimensional photonic lattices fabricated as honeycomb nanostructures in compound semiconductors," Applied Physics Letters, 1994, vol. 64, No. 6, pp. 687-689.

Xie et al.: "Optimization design and fabrication of photonic crystal waveguides based on SOI using 248nm deep UV lithography," Proceedings of SPIE, 2004, vol. 5280, pp. 798-804.

Japan Society for the Promotion of Science: "Wide-gap semiconductor/electronic device, No. 162 committee"; The 74th Workshop Document: Development of DUVLED by UV Craftory, Co., Ltd., dated Apr. 22, 2011.

Japanese Office Action for Japanese Application No. 2015-559356, dated Apr. 26, 2016. (5 pages).

International Search Report issued in Japanese Application No. PCT/JP2015/084461 dated Jan. 12, 2016 (10 pages).

Choi et al.: "Design of an LED Chip Structure with an Integrated Two-dimensional Photonic Crystal to Enhance the light-extraction Efficiency"; Journal of Korean Physical Society, 2014, vol. 94, No. 10, pp. 1425-1429.

Lai et al.: "Directional light extraction enhancement from GaN-based film-transferred photonic crystal light-emitting diodes"; Applied Physics Letters, 2009, vol. 64, pp. 123106-1 to 123106-3 (4 pages).

Orita et al.: "High-Extraction-Efficiency blue Light-Emitting Diode using Extended-Pitch Photonic Crystal"; 2004, vol. 43, No. 8B, pp. 5809-5813.

Ding et al.: "Improving the Vertical light-Extraction Efficiency of GaN-Based Thin-Film Flip-Chip LED's With p-slide Deep-Hole Photonic Crystals"; Journal of Display Technology, 2014, vol. 10, No. 11, pp. 909-916.

Kashima et al.: "The micro machining process technology of nano imprint and dry etcing to improve the efficiency of notride LED"; IEICE Technical Report, 2014, vol. 114, No. 336, pp. 27-32.

Chinese Office Action dated Dec. 19, 2016 for Chinese Patent Application Serial No. 201480002228.2, 3 pages.

U.S. Appl. No. 14/426,328, filed Mar. 5, 2015.
U.S. Appl. No. 14/777,176, filed Sep. 15, 2015.
U.S. Appl. No. 15/526,860, filed May 15, 2017.

\* cited by examiner

Fig. 1A
(a)
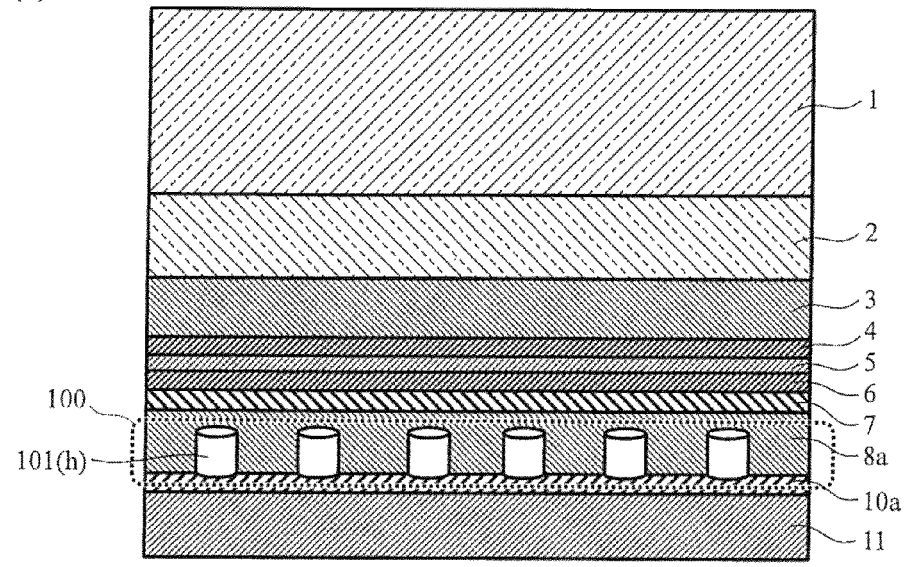
(b)
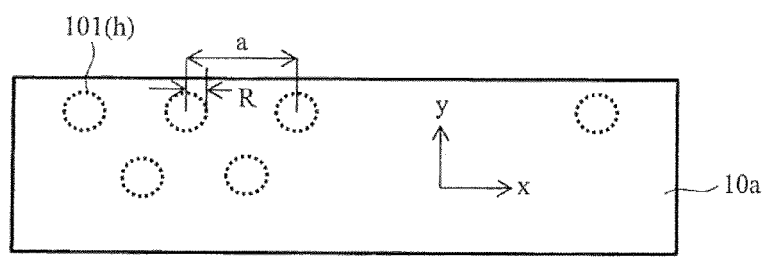
1 Sapphire Substrate
2 AlN Buffer Layer
3 n-AlGaN Layer
4 Barrier Layer
5 Quantum Well Layer
6 Barrier Layer
7 Electron Blocking Layer
8a Transparent p-AlGaN Contact Layer
10a Ultrathin Ni Layer
11 Al Reflecting Electrode Layer
100 Photonic Crystal Periodic Structure
101(h) Circular Voids (Columnar Structures or Holes)

1 Sapphire Substrate
2 AlN Buffer Layer
3 n-AlGaN Layer
4 Barrier Layer
5 Quantum Well Layer
6 Barrier Layer
7 Electron Blocking Layer
8a Transparent p-AlGaN Contact Layer
10a Ultrathin Ni Layer
11 Al Reflecting Electrode Layer
100a Photonic Crystal Periodic Structure
101a(h) Circular Voids (Columnar Structures or Holes)

Fig. 2
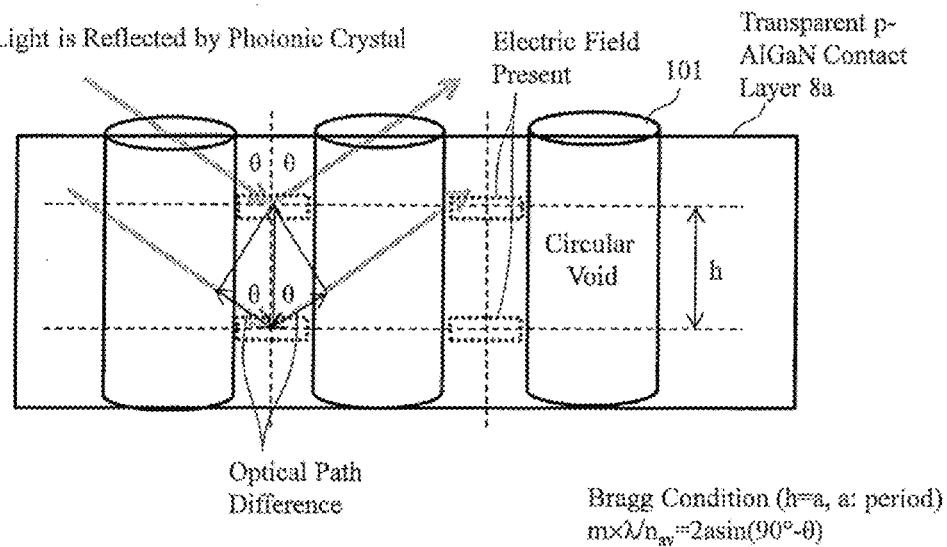
(a) TE Light is Reflected by Photonic Crystal
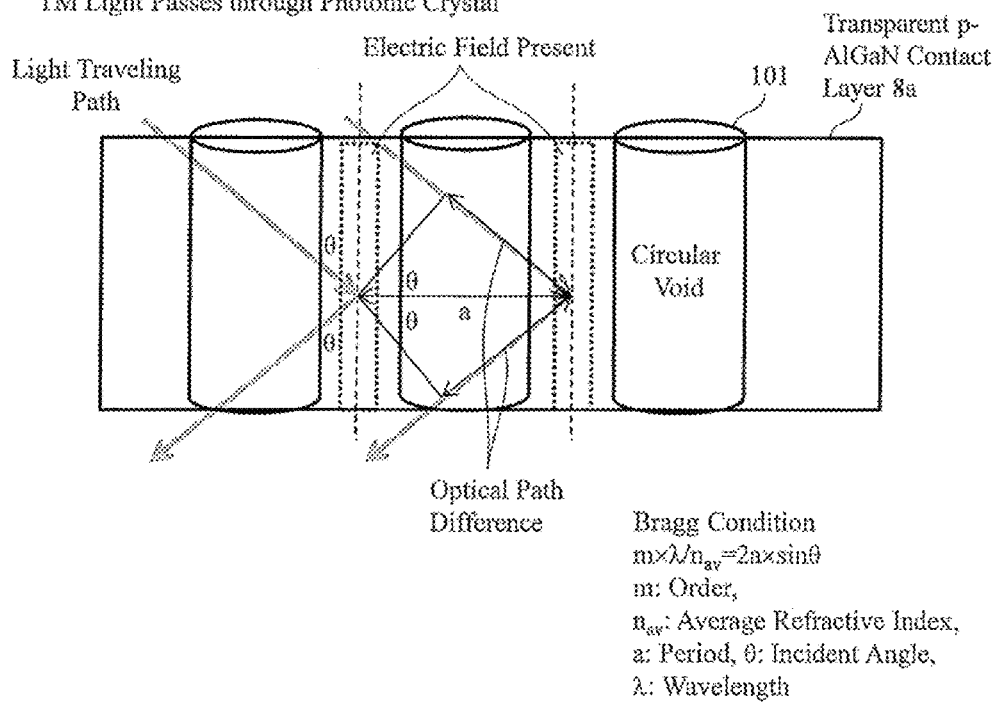
(b) TM Light Passes through Photonic Crystal TE Light TM Light 1 Sapphire Substrate
2 AlN Buffer Layer
3 n-AlGaN Layer
4 Barrier Layer
5 Quantum Well Layer
6 Barrier Layer
7 Electron Blocking Layer
8 p-AlGaN Layer
9 p-GaN Contact Layer
10 Ni Layer
11 Al Reflecting Electrode Layer 1 Sapphire Substrate
2 AlN Buffer Layer
3 n-AlGaN Layer
4 Barrier Layer
5 Quantum Well Layer
6 Barrier Layer
7 Electron Blocking Layer
8a Transparent p-AlGaN Contact Layer
11 Al Reflecting Electrode Layer 1 Sapphire Substrate
2 AlN Buffer Layer
3 n-AlGaN Layer
4 Barrier Layer
5 Quantum Well Layer
6 Barrier Layer
7 Electron Blocking Layer
8a Transparent p-AlGaN Contact Layer
10 Ni Layer
11 Al Reflecting Electrode Layer 1 Sapphire Substrate
2 AlN Buffer Layer
3 n-AlGaN Layer
4 Barrier Layer
5 Quantum Well Layer
6 Barrier Layer
7 Electron Blocking Layer
8 p-AlGaN Layer
9 p-GaN Contact Layer
10 Ni Layer
11 Al Reflecting Electrode Layer
100 Photonic Crystal Periodic Structure
101(h) Circular Voids (Columnar Structures or Holes)

1 Sapphire Substrate
2 AlN Buffer Layer
3 n-AlGaN Layer
4 Barrier Layer
5 Quantum Well Layer
6 Barrier Layer
7 Electron Blocking Layer
8a Transparent p-AlGaN Contact Layer
11 Al Reflecting Electrode Layer
100 Photonic Crystal Periodic Structure
101(h) Circular Voids (Columnar Structures or Holes)

1 Sapphire Substrate
2 AlN Buffer Layer
3 n-AlGaN Layer
4 Barrier Layer
5 Quantum Well Layer
6 Barrier Layer 7 Electron Blocking Layer
8a Transparent p-AlGaN Contact Layer
10 Ni Layer
11 Al Reflecting Electrode Layer
100 Photonic Crystal Periodic Structure
101(h) Circular Voids (Columnar Structures or Holes)

Fig. 5

(a)
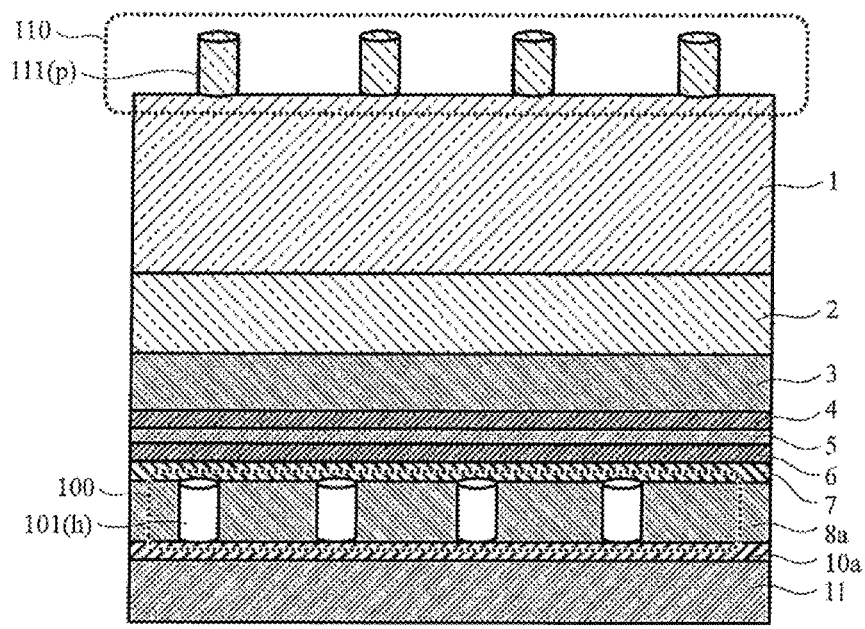

(b)
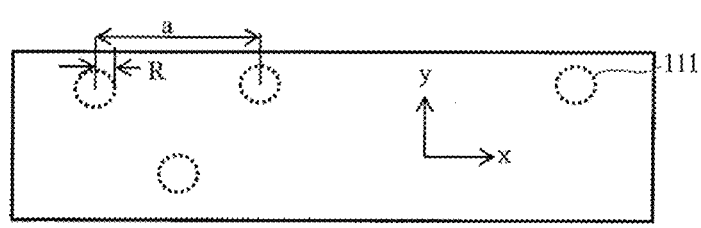

1 Sapphire Substrate
2 AlN Buffer Layer
3 n-AlGaN Layer
4 Barrier Layer
5 Quantum Well Layer
6 Barrier Layer
7 Electron Blocking Layer
8a Transparent p-AlGaN Contact Layer 10a Ultrathin Ni Layer
11 Al Reflecting Electrode Layer
100 Photonic Crystal Periodic Structure
101(h) Circular Voids (Columnar Structures or Holes)
110 Photonic Crystal Periodic Structure
111(p) Holes (Columnar Structures or Pillars)

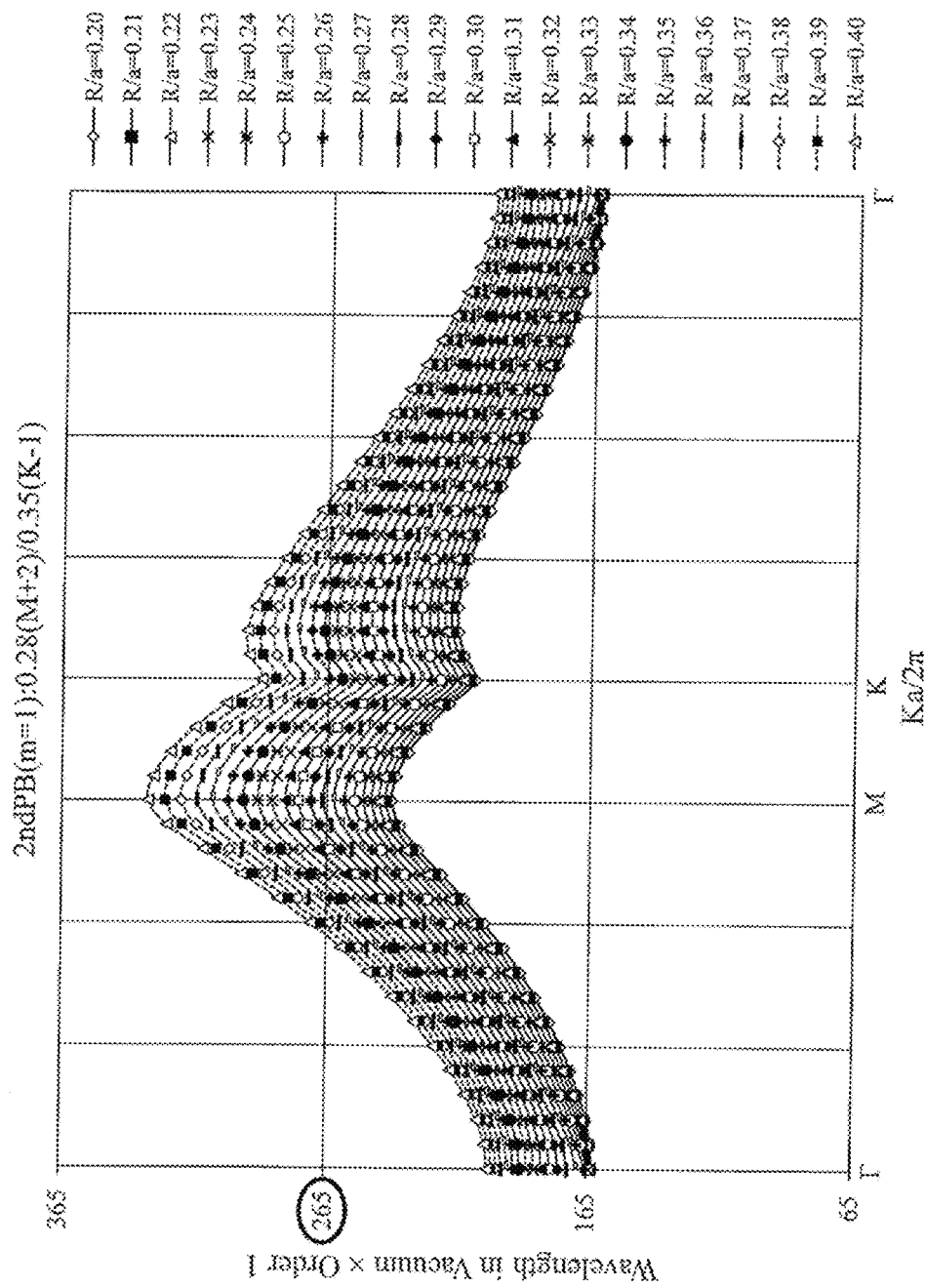

Fig. 11A
Stationary Wave of $2_{nd}$ PB
when R/a=0.35 (Order m=1)
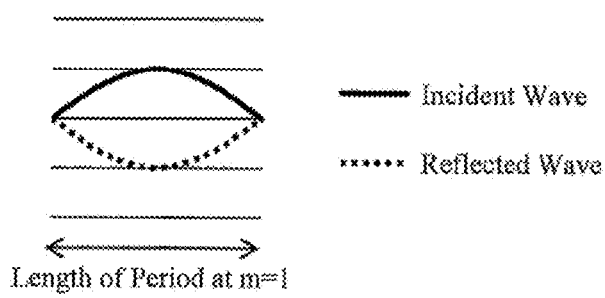
Stationary Wave of $2_{nd}$ PB when R/a=0.35 (Order m=3)
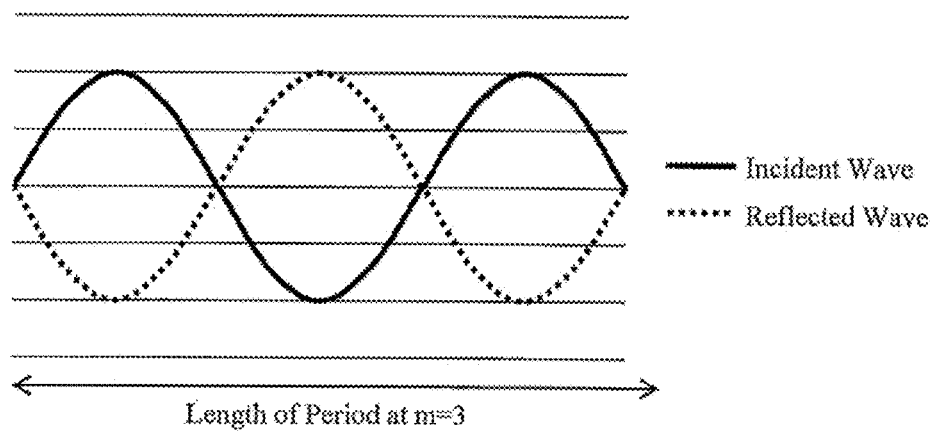
A stationary wave is generated at the order m=1 when R/a=0.35. If the length of the period is proportional to the order m, a stationary wave with m anti-nodes is generated.

Fig. 11B
Stationary Wave of $4_{th}$ PB at Order m=1:
No Stationary Waves Are Generated at Any R/a in Range of $0.20 \leq R/a \leq 0.40$
Conditions of Stationary Wave of $4_{th}$ PB (Order m=3):
Length of Period at m=3 Should Have Five Anti-Nodes
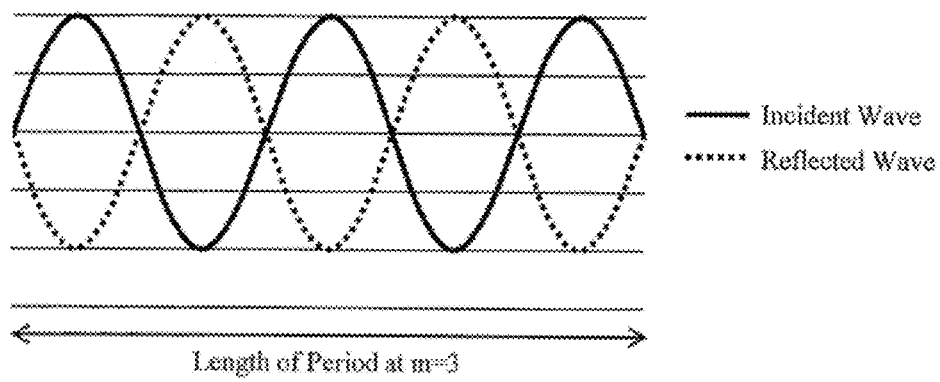
Length of Period at m=3
Conditions of Stationary Wave of $4_{th}$ PB (Order m=3):
Length of Period at m=3 Should Have Six Anti-Nodes
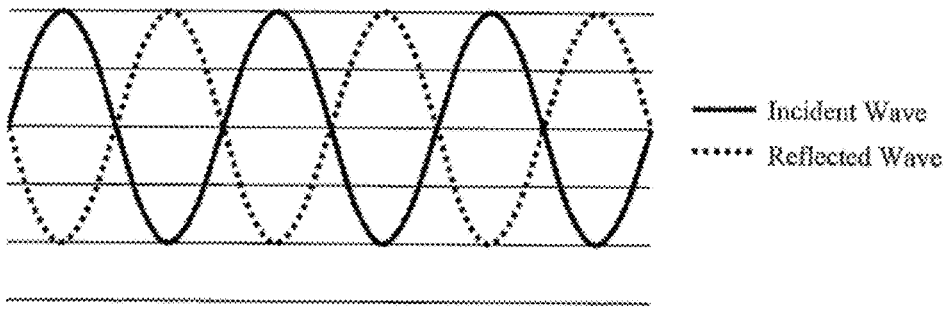

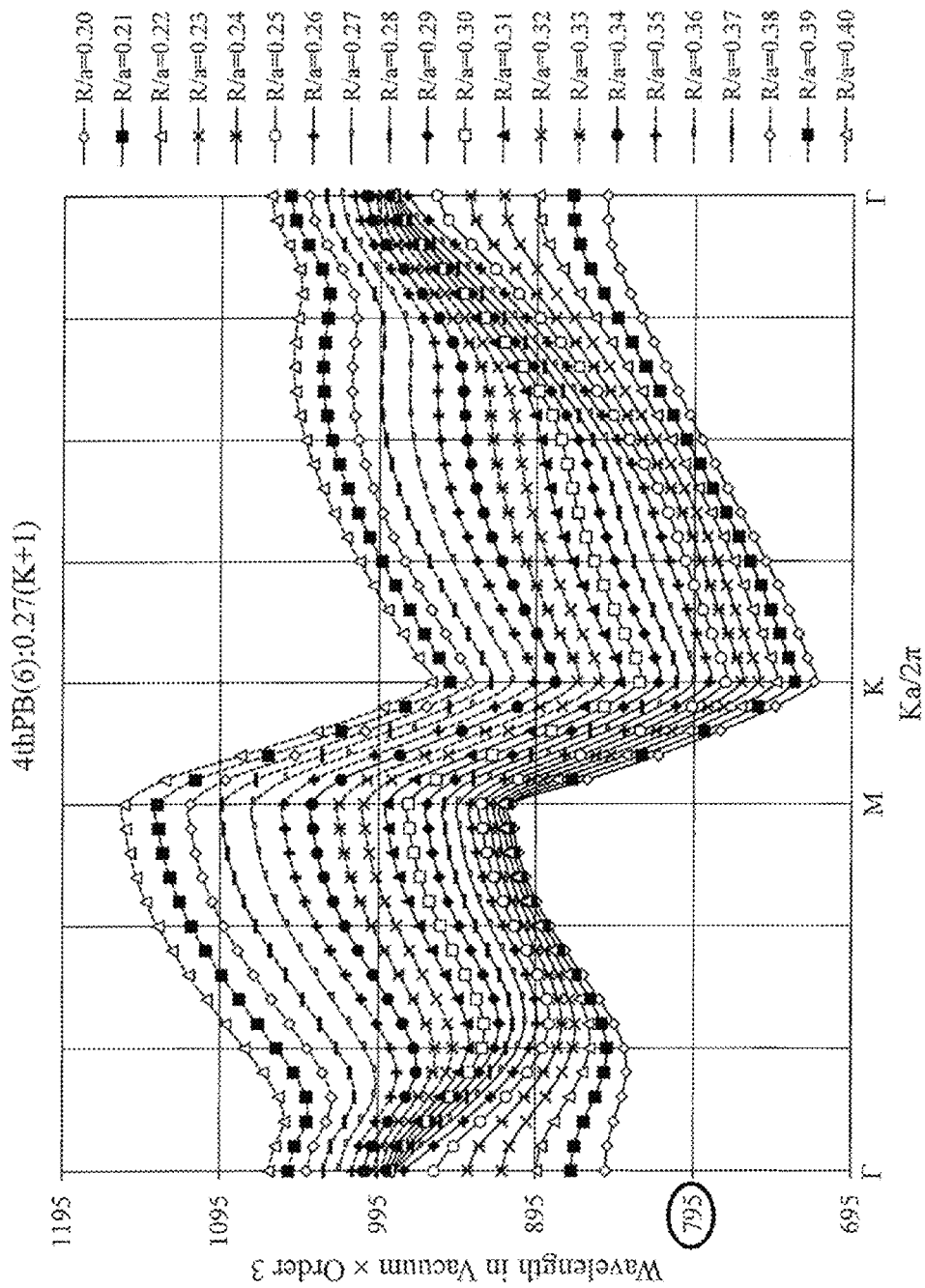

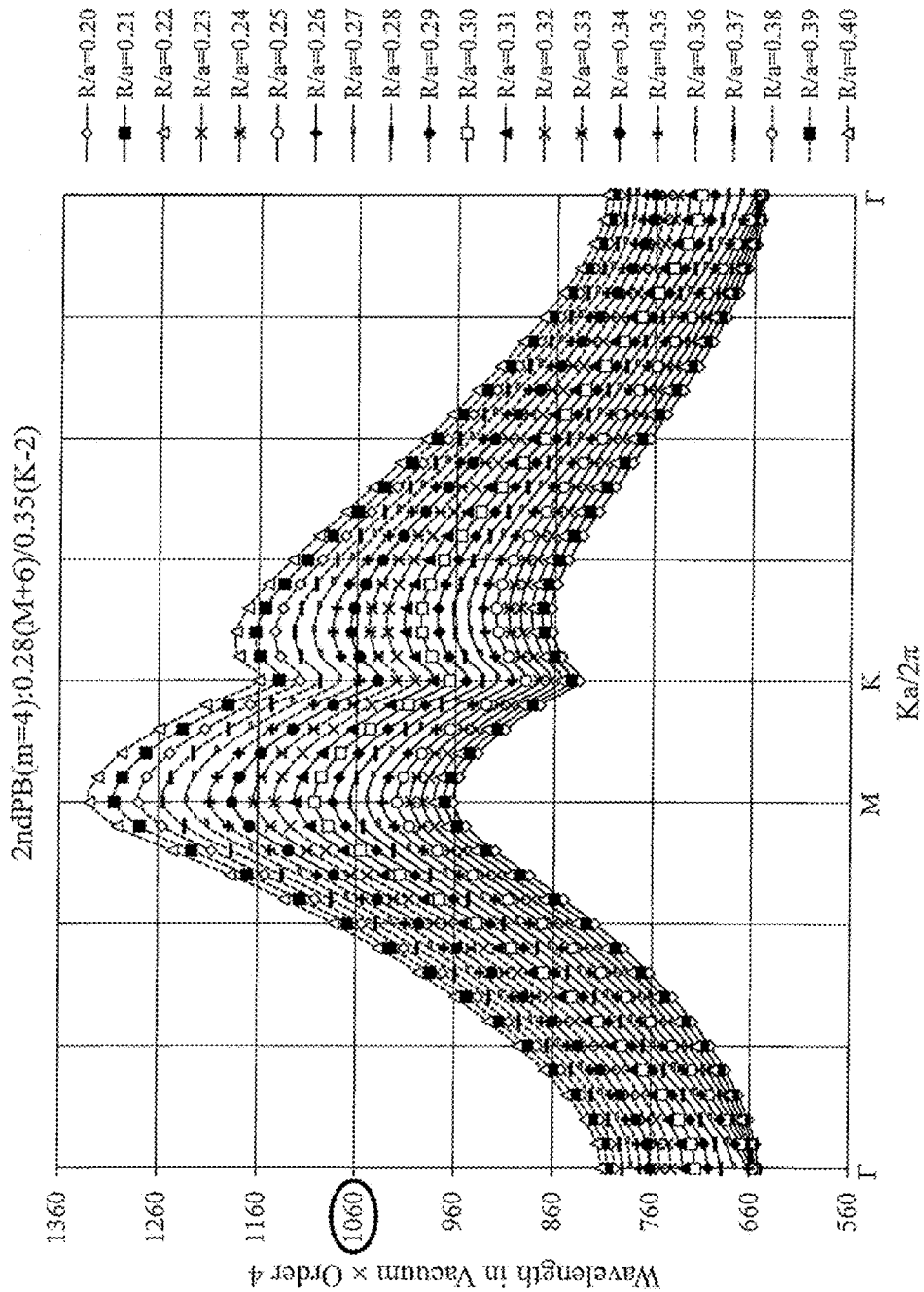

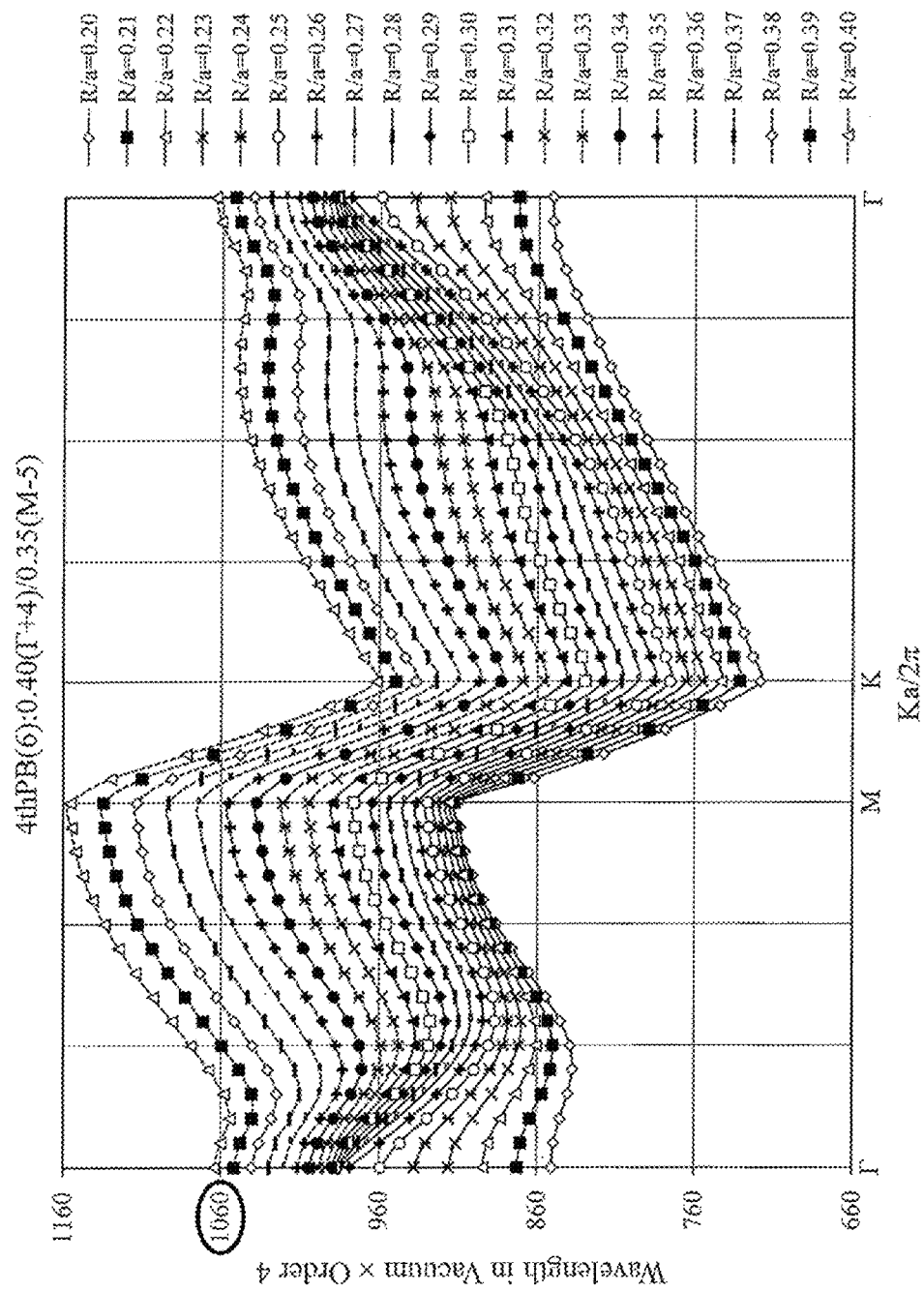

Fig. 14A

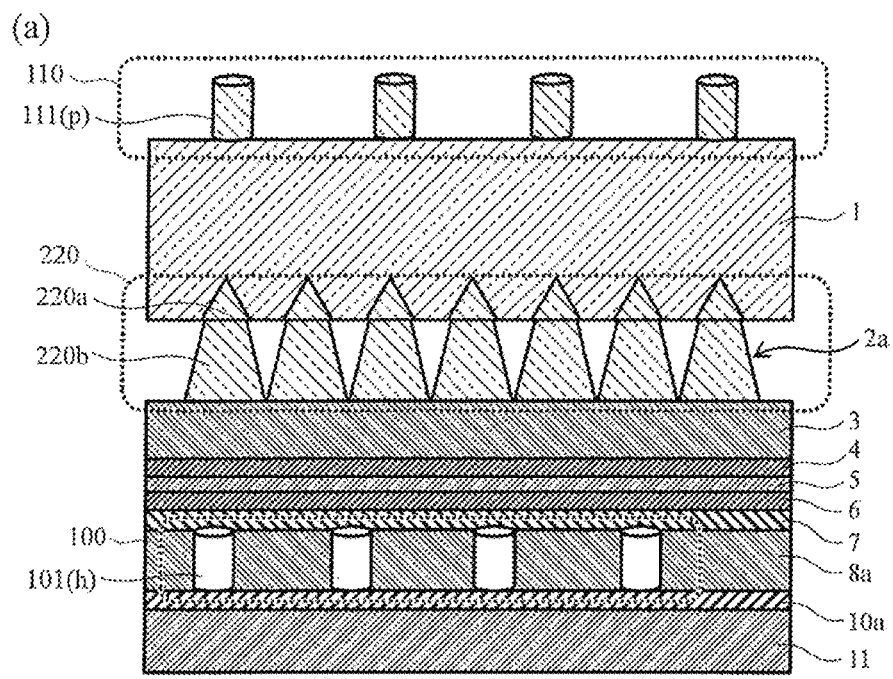

(a)

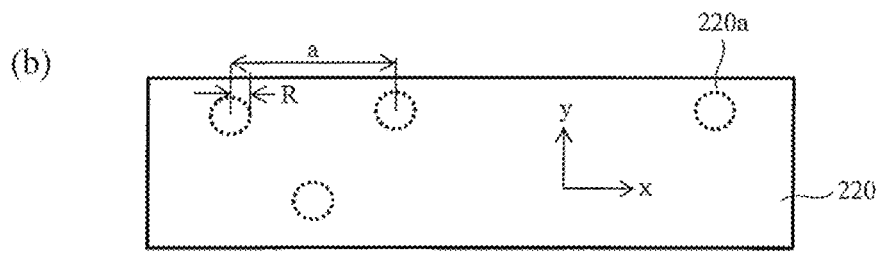

(b)

1  Sapphire Substrate
2a AlN Buffer Layer
3  n-AlGaN Layer
4  Barrier Layer
5  Quantum Well Layer
6  Barrier Layer
7  Electron Blocking Layer
8a Transparent p-AlGaN Contact Layer
10a Ultrathin Ni Layer
11 Al Reflecting Electrode Layer 100 Photonic Crystal Periodic Structure
101(h) Circular Voids (Columnar Structures or Holes)
110 Photonic Crystal Periodic Structure
111(p) Holes (Columnar Structures or Pillars)
220 Nano-PSS and Connected-Pillar Periodic Structure
220a Nano-PSS Periodic Structure (Conical Holes)
220b AlN Connected Pillars 1 Sapphire Substrate
3 n-AlGaN Layer
4 Barrier Layer
5 Quantum Well Layer
6 Barrier Layer
7 Electron Blocking Layer
8a Transparent p-AlGaN Contact Layer
10a Ultrathin Ni Layer
11 Al Reflecting Electrode Layer
110 Photonic Crystal Periodic Structure
220a PSS Periodic Structure (Conical Holes)
220b AlN Connected Pillars

Fig. 15A

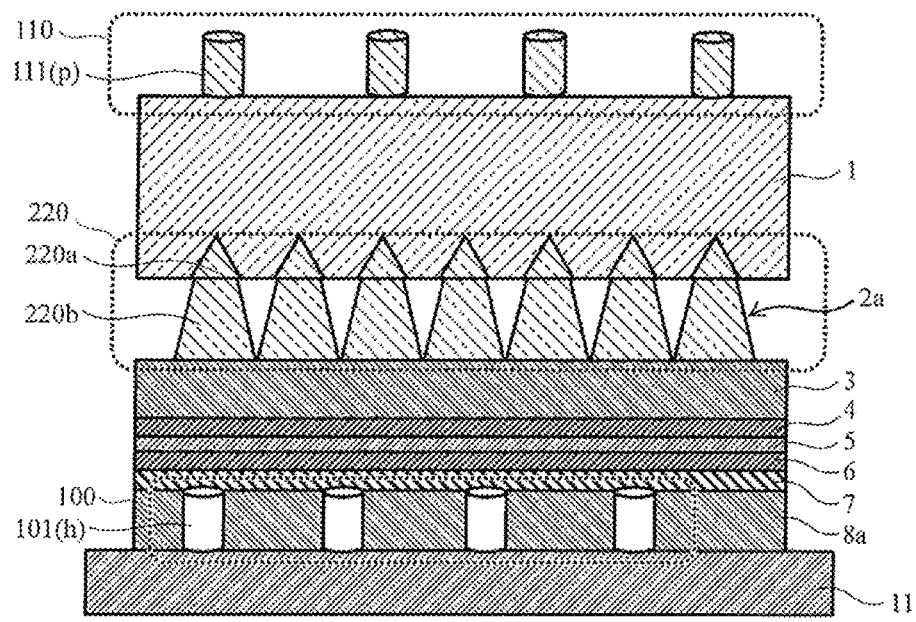

1 Sapphire Substrate
2a AlN Buffer Layer
3 n-AlGaN Layer
4 Barrier Layer
5 Quantum Well Layer
6 Barrier Layer
7 Electron Blocking Layer
8a Transparent p-AlGaN Contact Layer
11 Al Reflecting Electrode Layer 100 Photonic Crystal Periodic Structure
101(h) Circular Voids (Columnar Structures or Holes)
110 Photonic Crystal Periodic Structure
111(p) Holes (Columnar Structures or Pillars)
220 Nano-PSS and Connected-Pillar Periodic Structure
220a PSS Periodic Structure (Conical Holes)
220b AlN Connected Pillars

Fig. 15B

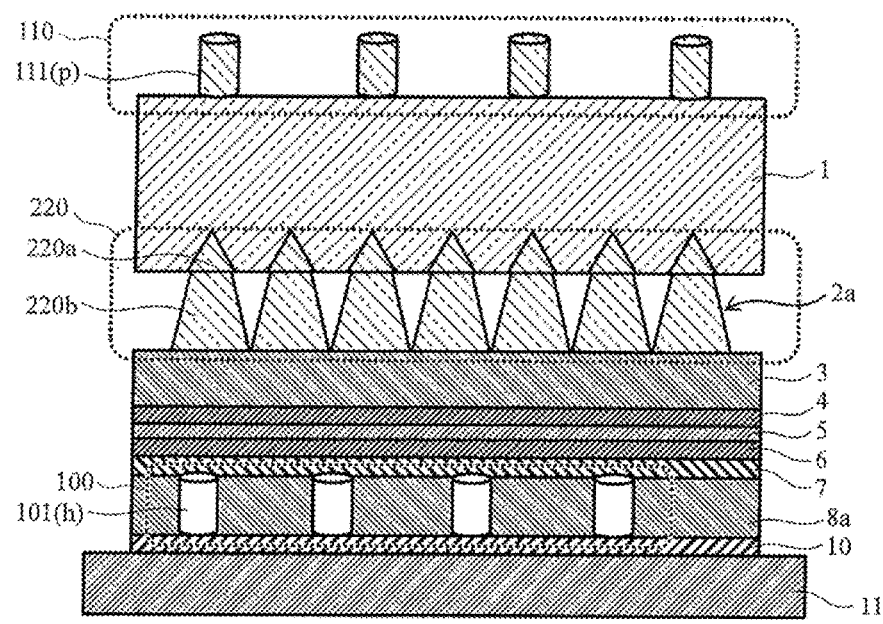

1 Sapphire Substrate
2a AlN Buffer Layer
3 n-AlGaN Layer
4 Barrier Layer
5 Quantum Well Layer
6 Barrier Layer
7 Electron Blocking Layer
8a Transparent p-AlGaN Contact Layer
10 Ni Layer
11 Al Reflecting Electrode Layer 100 Photonic Crystal Periodic Structure
101(h) Circular Voids (Columnar Structures or Holes)
110 Photonic Crystal Periodic Structure
111(p) Holes (Columnar Structures or Pillars)
220 Nano-PSS and Connected-Pillar Periodic Structure
220a PSS Periodic Structure (Conical Holes)
220b AlN Connected Pillars

Fig. 15C

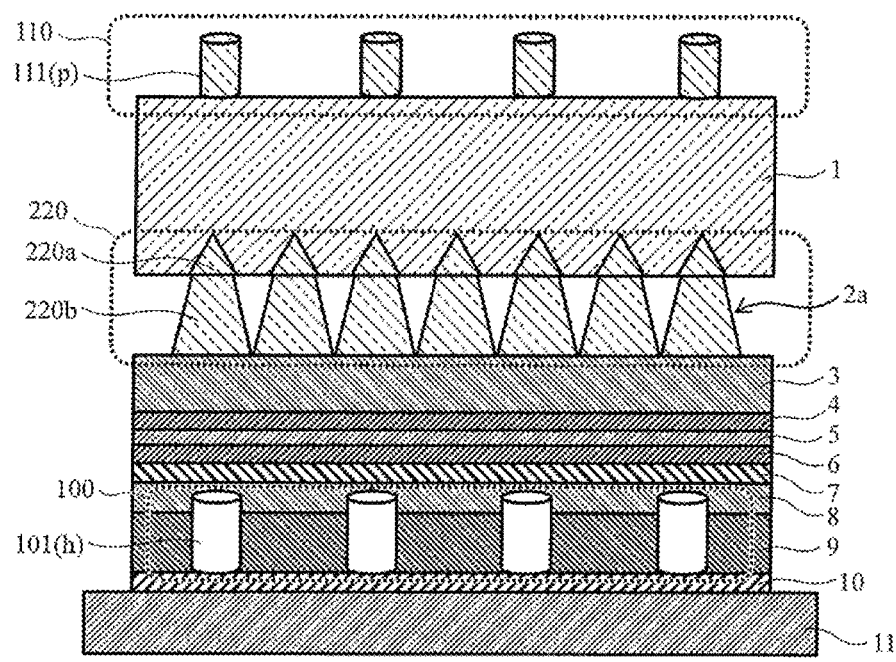

1 Sapphire Substrate
2a AlN Buffer Layer
3 n-AlGaN Layer
4 Barrier Layer
5 Quantum Well Layer
6 Barrier Layer
7 Electron Blocking Layer
8 p-AlGaN Layer
9 p-GaN Contact Layer
10 Ni Layer
11 Al Reflecting Electrode Layer 100 Photonic Crystal Periodic Structure
101(h) Circular Voids (Columnar Structures or Holes)
110 Photonic Crystal Periodic Structure
111(p) Holes (Columnar Structures or Pillars)
220 Nano-PSS and Connected-Pillar Periodic Structure
220a PSS Periodic Structure (Conical Holes)
220b AlN Connected Pillars 2a AlN Buffer Layer
3 n-AlGaN Layer
4 Barrier Layer
5 Quantum Well Layer
6 Barrier Layer
7 Electron Blocking Layer
8a Transparent p-AlGaN Contact Layer 10a Ultrathin Ni Layer
11 Al Reflecting Electrode Layer
31 Support Substrate
100 Photonic Crystal Periodic Structure
101(h) Circular Voids (Columnar Structures or Holes)
220b AlN Connected Pillars

Fig. 17A

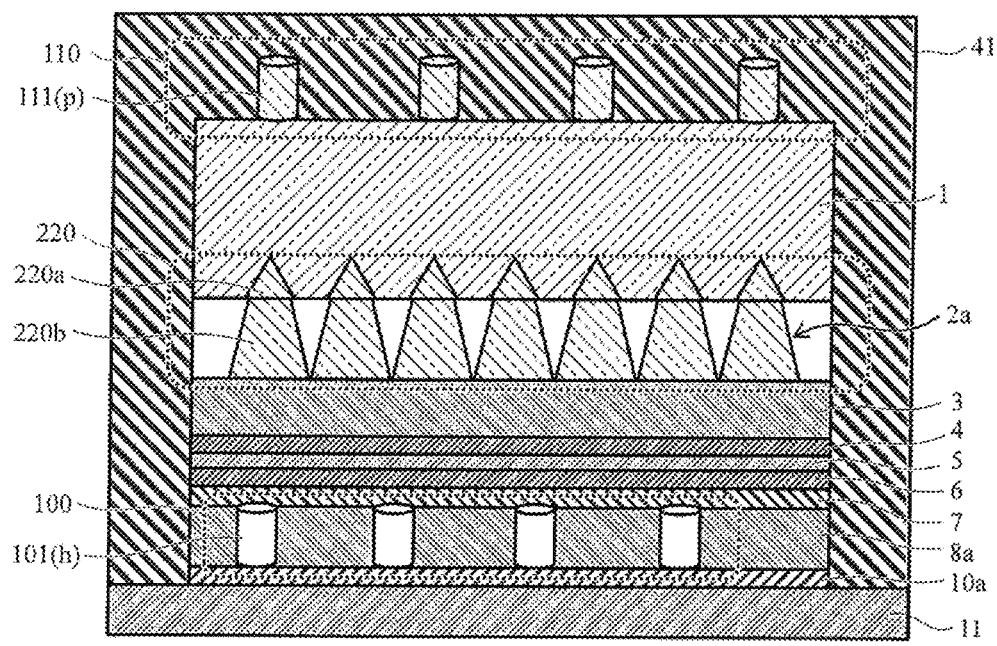

1 Sapphire Substrate
2a AlN Buffer Layer
3 n-AlGaN Layer
4 Barrier Layer
5 Quantum Well Layer
6 Barrier Layer
7 Electron Blocking Layer
8a Transparent p-AlGaN Contact Layer
10a Ultrathin Ni Layer
11 Al Reflecting Electrode Layer 41 Resin for Encapsulation
100 Photonic Crystal Periodic Structure
101(h) Circular Voids (Columnar Structures or Holes)
110 Photonic Crystal Periodic Structure
111(p) Holes (Columnar Structures or Pillars)
220 Nano-PSS and Connected-Pillar Periodic Structure
220a PSS Periodic Structure (Conical Holes)
220b AlN Connected Pillars 2a AlN Buffer Layer
3 n-AlGaN Layer
4 Barrier Layer
5 Quantum Well Layer
6 Barrier Layer
7 Electron Blocking Layer
8a Transparent p-AlGaN Contact Layer
10a Ultrathin Ni Layer 11 Al Reflecting Electrode Layer
31 Support Substrate
51 Resin for Encapsulation
100 Photonic Crystal Periodic Structure
101(h) Circular Voids (Columnar Structures or Holes)
220b AlN Connected Pillars

Fig. 18A

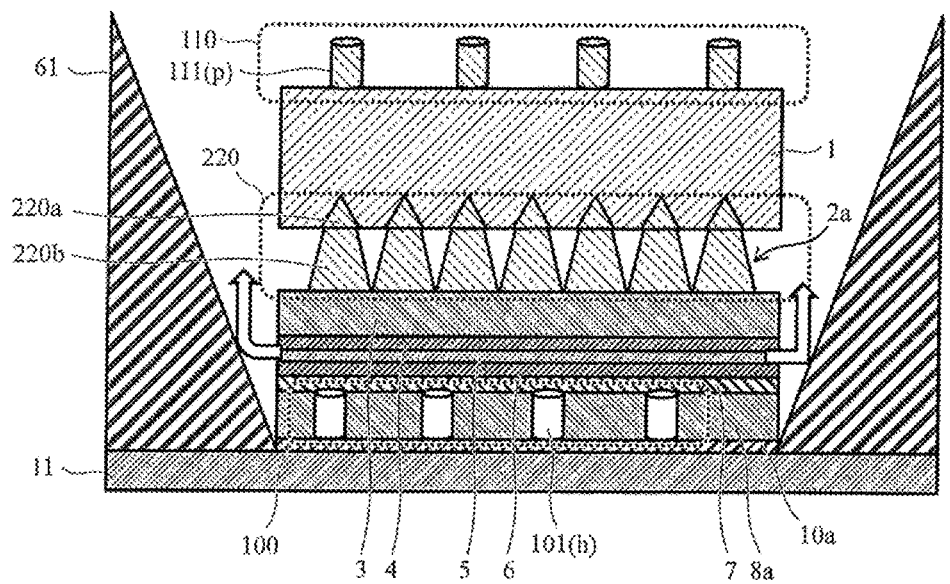

1 Sapphire Substrate
2a AlN Buffer Layer
3 n-AlGaN Layer
4 Barrier Layer
5 Quantum Well Layer
6 Barrier Layer
7 Electron Blocking Layer
8a Transparent p-AlGaN Contact Layer
10a Ultrathin Ni Layer
11 Al Reflecting Electrode Layer 61 Al Reflecting Film (on Outer Side of Sidewall)
100 Photonic Crystal Periodic Structure
101(h) Circular Voids (Columnar Structures or Holes)
110 Photonic Crystal Periodic Structure
111(p) Holes (Columnar Structures or Pillars)
220 Nano-PSS and Connected-Pillar Periodic Structure
220a PSS Periodic Structure (Conical Holes)
220b AlN Connected Pillars

Fig. 18B

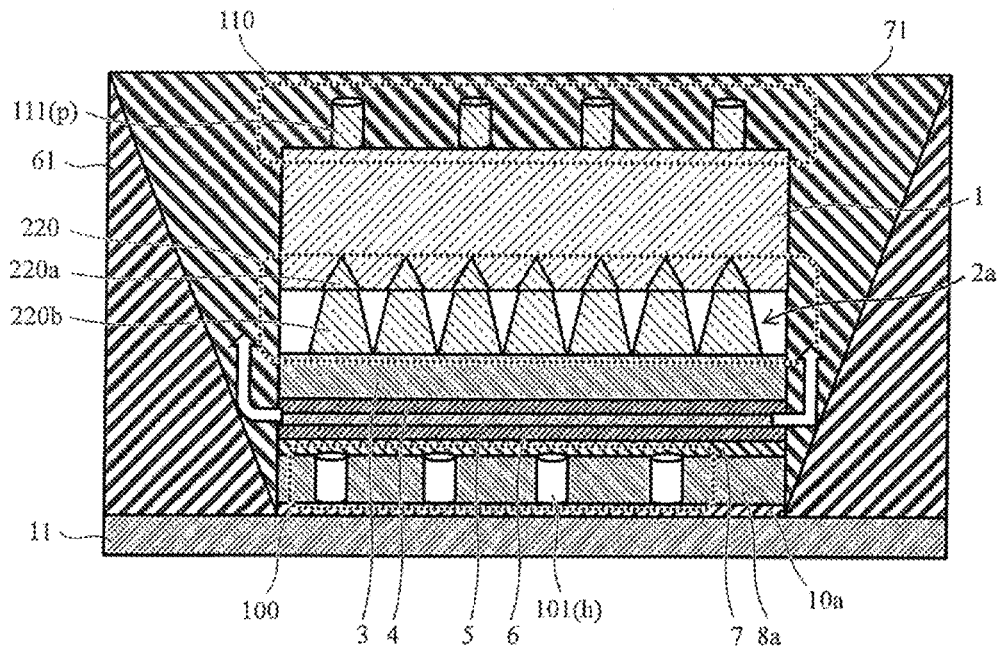

1  Sapphire Substrate
2a AlN Buffer Layer
3  n-AlGaN Layer
4  Barrier Layer
5  Quantum Well Layer
6  Barrier Layer
7  Electron Blocking Layer
8a Transparent p-AlGaN Contact Layer
10a Ultrathin Ni Layer
11 Al Reflecting Electrode Layer 61 Al Reflecting Film (on Outer Side of Sidewall)
71 Resin for Encapsulation
100 Photonic Crystal Periodic Structure
101(h) Circular Voids (Columnar Structures or Holes)
110 Photonic Crystal Periodic Structure
111(p) Holes (Columnar Structures or Pillars)
220 Nano-PSS and Connected-Pillar Periodic Structure
220a PSS Periodic Structure (Conical Holes)
220b AlN Connected Pillars

Fig. 19A

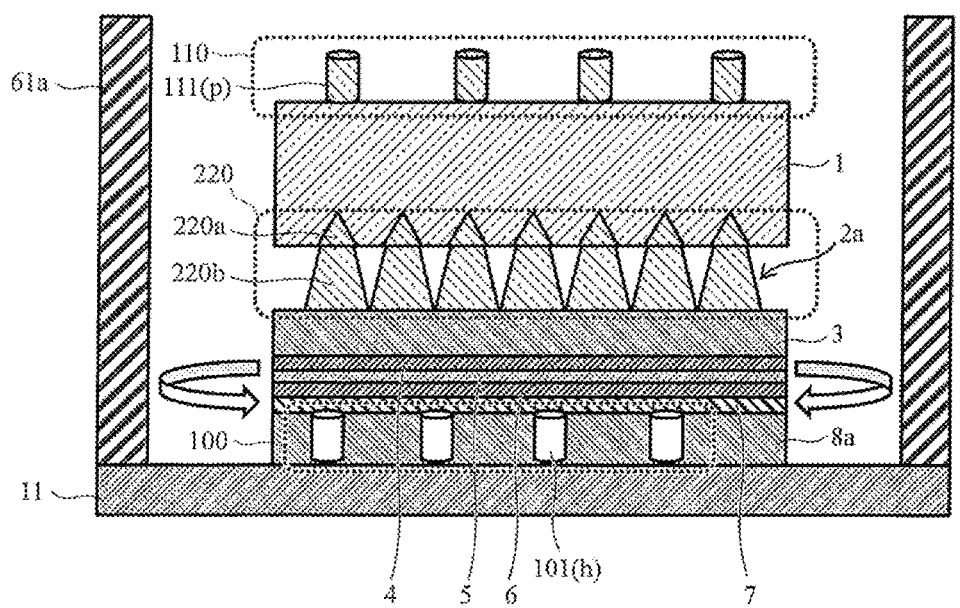

1 Sapphire Substrate
2a AlN Buffer Layer
3 n-AlGaN Layer
4 Barrier Layer
5 Quantum Well Layer
6 Barrier Layer
7 Electron Blocking Layer
8a Transparent p-AlGaN Contact Layer
11 Al Reflecting Electrode Layer 61a Al Reflecting Film (on Outer Side of Sidewall)
100 Photonic Crystal Periodic Structure
101(h) Circular Voids (Columnar Structures or Holes)
110 Photonic Crystal Periodic Structure
111(p) Holes (Columnar Structures or Pillars)
220 Nano-PSS and Connected-Pillar Periodic Structure
220a PSS Periodic Structure (Conical Holes)
220b AlN Connected Pillars

Fig. 19B

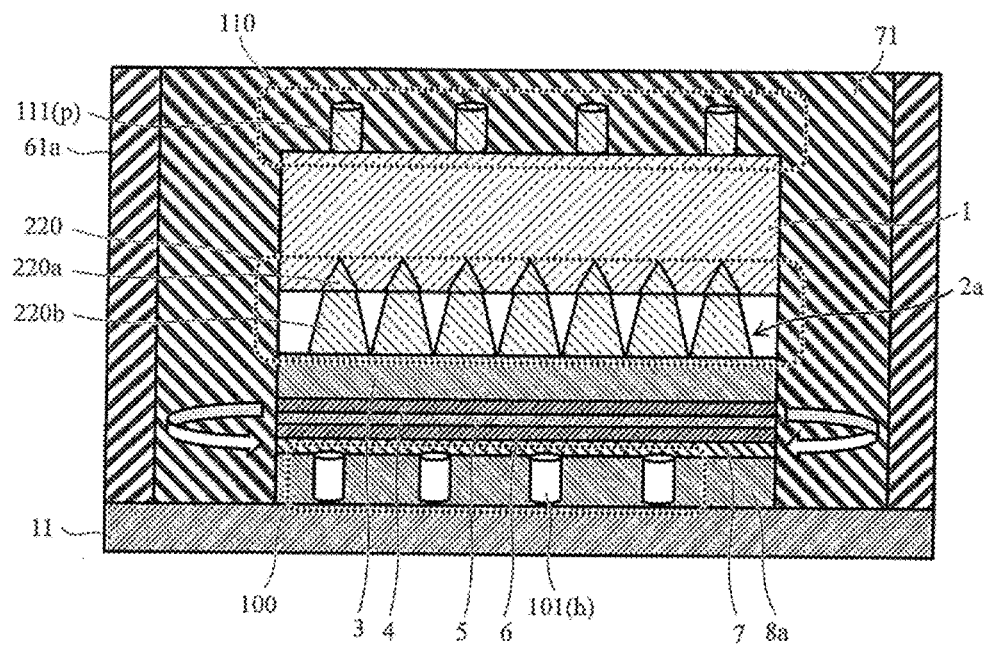

1 Sapphire Substrate
2a AlN Buffer Layer
3 n-AlGaN Layer
4 Barrier Layer
5 Quantum Well Layer
6 Barrier Layer
7 Electron Blocking Layer
8a Transparent p-AlGaN Contact Layer
11 Al Reflecting Electrode Layer
61a Al Reflecting Film (on Outer Side of Sidewall)

71 Resin for Encapsulation
100 Photonic Crystal Periodic Structure
101(h) Circular Voids (Columnar Structures or Holes)
110 Photonic Crystal Periodic Structure
111(p) Holes (Columnar Structures or Pillars)
220 Nano-PSS and Connected-Pillar Periodic Structure
220a PSS Periodic Structure (Conical Holes)
220b AlN Connected Pillars 1 Sapphire Substrate
2 AlN Buffer Layer
3 n-AlGaN Layer
4 Barrier Layer
5 Quantum Well Layer
6 Barrier Layer
7 Electron Blocking Layer
8 p-AlGaN Layer
9 p-GaN Contact Layer
10 Ni Layer
11 Al (or Au) Reflecting Electrode Layer

US 9,929,317 B2

DEEP ULTRAVIOLET LED AND METHOD FOR MANUFACTURING THE SAME

TECHNICAL FIELD

The present invention relates to a technology of an AlGaN-based deep ultraviolet LED.

BACKGROUND ART

In recent years, deep ultraviolet LEDs with a light emission wavelength of around 265 nm have attracted attention for use in a variety of applications, such as sterilization and water purification. FIG. 22 is a cross-sectional view illustrating an exemplary structure of a typical conventional deep ultraviolet LED. In the LED illustrated in FIG. 22, light emitted from a quantum well layer 5 is emitted in the upward direction (toward the air) via a barrier layer 4, an n-AlGaN layer 3, an AlN buffer layer 2, and a sapphire substrate 1. At this time, part of the light is totally internally reflected due to the difference in the refractive index among the n-AlGaN layer 3, the AlN buffer layer 2, the sapphire substrate 1, and the air in accordance with the Snell's law, and the reflected light then travels in the direction toward an Al (or Au) reflecting electrode layer 11, but the light is almost entirely absorbed by a p-GaN contact layer 9 or a Ni layer 10 and thus is lost inside the LED.

Meanwhile, light emitted from the quantum well layer 5 and propagating in the downward direction is also absorbed by the p-GaN contact layer 9 or the Ni layer 10 and thus is lost almost entirely.

Therefore, with the structure illustrated in FIG. 22, more than 50% of light is lost inside the LED. At this time, the external quantum efficiency (EQE) is about 5% and the light extraction efficiency (LEE) is about 10%.

Patent Literature 1 discloses providing a projection/recess structure on an upper surface or a side surface of a sapphire substrate in order to suppress total internal reflection and improve the light extraction efficiency by about 20%.

Meanwhile, as a new method for improving the light extraction efficiency, there has been introduced a technique of forming a photonic crystal periodic structure, which has a period of about equal to the wavelength of light, in a light extraction layer. The photonic crystal periodic structure is formed at the interface between two structures with different refractive indices, and typically has projections and recesses mainly made of pillar structures or hole structures. In a region where such a periodic structure is formed, the existence of light is prohibited and thus total reflection is suppressed. It is known that using such a structure can improve the light extraction efficiency (see Patent Literature 2).

In addition, non Patent Literature 1 indicated below has reported that replacing a p-GaN contact layer, which absorbs deep ultraviolet light, with a p-AlGaN contact layer, which is transparent to deep ultraviolet light, and further forming a Ni layer as thin as possible, for example, to a thickness of about 1 nm can improve the light extraction efficiency by 1.7 times.

CITATION LIST

Patent Literature

Patent Literature 1: JP 2014-68010 A
Patent Literature 2: JP 5315513 B

Non Patent Literature

Non Patent Literature 1: OPTRONICS (February, 2014) No. 386, published in Feb. 10, 2014, 56 (General Description), "Increase in light extraction efficiency of AlGaN deep ultraviolet LED with the use of a transparent element," pp. 58-66.

SUMMARY OF INVENTION

Technical Problem

In Patent Literature 1, suppression of absorption of light propagating in the upward direction (toward the substrate side) in FIG. 22 has been partially improved.

However, an improvement of the luminous efficacy has not been fundamentally achieved because light that is emitted from the quantum well layer and propagates in the downward direction (toward the reflecting electrode side) in FIG. 22 is almost entirely absorbed by the p-GaN contact layer or the Ni layer.

The photonic crystals formed in the light emitting element described in Patent Literature 2 are intended to improve the light extraction efficiency, but Patent Literature 2 does not disclose a specific structure for suppressing absorption of light by the p-GaN contact layer or the Ni layer.

Meanwhile, in non Patent Literature 1, absorption of light propagating in the downward direction (toward the reflecting electrode side) in FIG. 22 has been improved, but the reflectivity of the Ni (1 nm)/Al reflecting electrode is still about 70%. Thus, there still remains a problem that light is absorbed to some extent.

It is an object of the present invention to further improve the light extraction efficiency of a deep ultraviolet LED by suppressing absorption of light propagating in the upward and downward directions.

Solution to Problem

According to a first aspect of the present invention, there is provided a deep ultraviolet LED with a design wavelength $\lambda$, including, sequentially arranged from a side opposite to a substrate, an Al reflecting electrode layer, an ultrathin Ni layer (about 1 nm) for forming an Ohmic contact therewith, and a transparent p-AlGaN contact layer, which is transparent to light with the design wavelength $\lambda$; and including a photonic crystal periodic structure provided at least in the range of the thickness direction of the transparent p-AlGaN contact layer, in a region of from the transparent p-AlGaN contact layer and including an interface between the ultrathin Ni layer and the Al reflecting electrode layer. The photonic crystal periodic structure has a photonic band gap.

The photonic crystal periodic structure has columnar voids (with a refractive index of 1.0) having a large difference in the refractive index from a refractive index of 2.60 of the transparent p-AlGaN contact layer with respect to light with a wavelength of 265 nm and thus has a photonic band gap. Therefore, the photonic crystal periodic structure reflects TE light with the wavelength $\lambda$ and such effect becomes prominent in proportion to the size of the photonic band gap. Further, as the distance from the quantum well layer to the photonic crystal periodic structure is shorter, the solid angle becomes wider and the reflection effect thus becomes prominent.

Meanwhile, TM light passes through the photonic crystal periodic structure and reaches the ultrathin Ni layer and the Al reflecting electrode layer. However, as there is no photonic band gap for TM light, the transmissivity of the TM light is low and thus absorption of TM light by the Al reflecting electrode layer is significantly suppressed. Therefore, light propagating in the downward direction, that is, toward the reflecting electrode layer can be reflected almost totally.

According to a second aspect of the present invention, since the reflecting structure can ignore absorption of deep ultraviolet light, it is possible to fully utilize a variety of methods for improving the light extraction efficiency as seen in blue LEDs or white LEDs, for example, and advantageous effects thereof. Specifically, such methods include a method for improving the light extraction efficiency by providing a projection/recess structure, such as photonic crystals (PhC), at an interface with a given refractive index and thus suppressing total internal reflection, improving the light extraction efficiency by peeling the sapphire substrate off the LED and thus increasing the light extraction area of the semiconductor layer portion, and a method for improving the light extraction efficiency by encapsulating the entire LED element in resin and thus suppressing total internal reflection.

According to a third aspect of the present invention, there is provided a method for producing a deep ultraviolet LED, including a step of preparing a stacked structure with a design wavelength λ that includes, sequentially arranged from a side opposite to a substrate, an Al reflecting electrode layer, an ultrathin Ni layer, and a transparent p-AlGaN contact layer; a step of preparing a mold for forming a photonic crystal periodic structure to be provided at least in the range of the thickness direction of the transparent p-AlGaN contact layer, in a region of from the transparent p-AlGaN contact layer and including an interface between the ultrathin Ni layer and the Al reflecting electrode layer, forming a projection/recess structure such as photonic crystals at an interface between two layers with different refractive indices, forming another projection/recess structure such as photonic crystals on a light extraction plane of a semiconductor layer portion that is obtained by peeling the sapphire substrate off the LED, or encapsulating the entire LED element in resin and forming a projection/recess structure such as photonic crystals at an interface therein; a step of forming a resist layer on the stacked structure and imprinting a structure of the mold to the resist layer; and a step of sequentially etching the stacked structure using the resist layer as a mask, thereby forming a periodic structure such as photonic crystals.

The present specification contains the descriptions of the specification and/or drawings of the Japanese patent application JP 2015-007108 that serves as a basis for priority claim of the present application.

Advantageous Effects of Invention

According to the present invention, the light extraction efficiency of a deep ultraviolet LED can be drastically improved.

BRIEF DESCRIPTION OF DRAWINGS

FIG. 1A is a cross-sectional view illustrating an exemplary structure of a deep ultraviolet LED in accordance with a first embodiment of the present invention.

FIG. 2 illustrate images of views of TE light and TM light that have become incident on a photonic crystal (hole).

FIG. 3A is a graph illustrating the relationships between a PBG for TE light and R/a.

FIG. 3B is a graph illustrating the relationship between a PBG for TM light and R/a.

FIG. 5 are views each illustrating an exemplary structure of a deep ultraviolet LED obtained by providing photonic crystals at two positions of a structure based on a transparent p-AlGaN contact layer and an ultrathin Ni layer. Specifically, FIG. 5 are views each illustrating an example in which a second photonic crystal periodic structure is provided on a sapphire substrate with the structure in FIG. 4E, and FIGS. 5(a) and 5(b) are a cross-sectional view and a plan view, respectively.

FIG. 10A is a graph illustrating a photonic band structure for $\lambda_v$ and $ka/2\pi$ at the order m=1 that is obtained through conversion of the ordinate axis ($\omega a/2\pi c$) of a second photonic band ($2_{nd}$ d PB) satisfying the Bragg condition into the wavelength $\lambda_v$ in a vacuum.

FIG. 11A is a view illustrating R/a determined at the order m=3, specifically, a condition where the second photonic band ($2_{nd}$ PB) when R/a=0.35 (order m=1) generates a stationary wave.

FIG. 11B is a view illustrating R/a determined at the order m=3, specifically, a condition where the fourth photonic band ($4_{th}$ PB) at R/a generates a stationary wave.

FIG. 12C is a graph illustrating a photonic band structure where the ordinate axis indicates $3\lambda_v$ and the abscissa axis indicates $ka/2\pi$ that is obtained through conversion of the ordinate axis ($\omega a/2\pi c$) of the fourth photonic band ($4_{th}$ PB) satisfying the Bragg condition into the wavelength $\lambda_v$ in a vacuum and multiplying the result by 6.

FIG. 13A is a graph illustrating a photonic band structure where the ordinate axis indicates $4\lambda_v$ and the abscissa axis indicates $ka/2\pi$ that is obtained through conversion of the ordinate axis ($\omega a/2\pi c$) of the second photonic band ($2_{nd}$ PB) satisfying the Bragg condition into the wavelength $\lambda_v$ in a vacuum and multiplying the result by the order (m=4) that is an integer.

FIG. 13B is a graph illustrating a photonic band structure where the ordinate axis indicates $4\lambda_v$ and the abscissa axis indicates $ka/2\pi$ that is obtained through conversion of the ordinate axis ($\omega a/2\pi c$) of the fourth photonic band ($4_{th}$ PB) satisfying the Bragg condition into the wavelength $\lambda_v$ in a vacuum and multiplying the result by 6.

FIGS. 14A(a) and 14A(b) are a cross-sectional view and a plan view, respectively, of a deep ultraviolet LED obtained by providing photonic crystals at two positions of a structure based on a transparent p-AlGaN contact layer and an ultrathin Ni layer and further providing nano-PSS-derived AlN connected pillars therein.

FIG. 15A is a cross-sectional view illustrating a computation model of a deep ultraviolet LED obtained by providing first and second photonic crystals in a structure based on a transparent p-AlGaN contact layer, and further providing nano-PSS-derived AlN connected pillars therein.

FIG. 15B is a cross-sectional view illustrating a computation model of a deep ultraviolet LED obtained by providing first and second photonic crystals in a structure based on a transparent p-AlGaN contact layer and a Ni layer (10 nm), and further providing nano-PSS-derived AlN connected pillars therein.

FIG. 15C is a cross-sectional view illustrating a computation model of a deep ultraviolet LED obtained by providing first and second photonic crystals in a structure of a conventional deep ultraviolet LED, and further providing nano-PSS-derived AlN connected pillars therein.

FIG. 17A is a cross-sectional view of a deep ultraviolet LED obtained by providing first and second photonic crystals in a structure based on a transparent p-AlGaN contact layer and an ultrathin Ni layer, and further providing nano-PSS-derived AlN connected pillars therein, and then encapsulating the LED in resin.

FIG. 18A is a cross-sectional view of a deep ultraviolet LED obtained by providing first and second photonic crystals in a structure based on a transparent p-AlGaN contact layer and an ultrathin Ni layer, and further providing a nano-PSS-derived AlN connected pillar structure therein, and then providing an Al reflecting film structure.

FIG. 18B is a cross-sectional view of a deep ultraviolet LED obtained by encapsulating the structure in FIG. 18A in resin.

FIG. 19A is a cross-sectional view illustrating a computation model of a deep ultraviolet LED obtained by providing first and second photonic crystals in a structure based on a transparent p-AlGaN contact layer, and further providing a nano-PSS-derived AlN connected pillar structure therein, and then providing an Al reflecting film structure.

FIG. 19B is a cross-sectional view of a deep ultraviolet LED obtained by encapsulating the structure in FIG. 19A in resin.

DESCRIPTION OF EMBODIMENTS

Figure 1B:
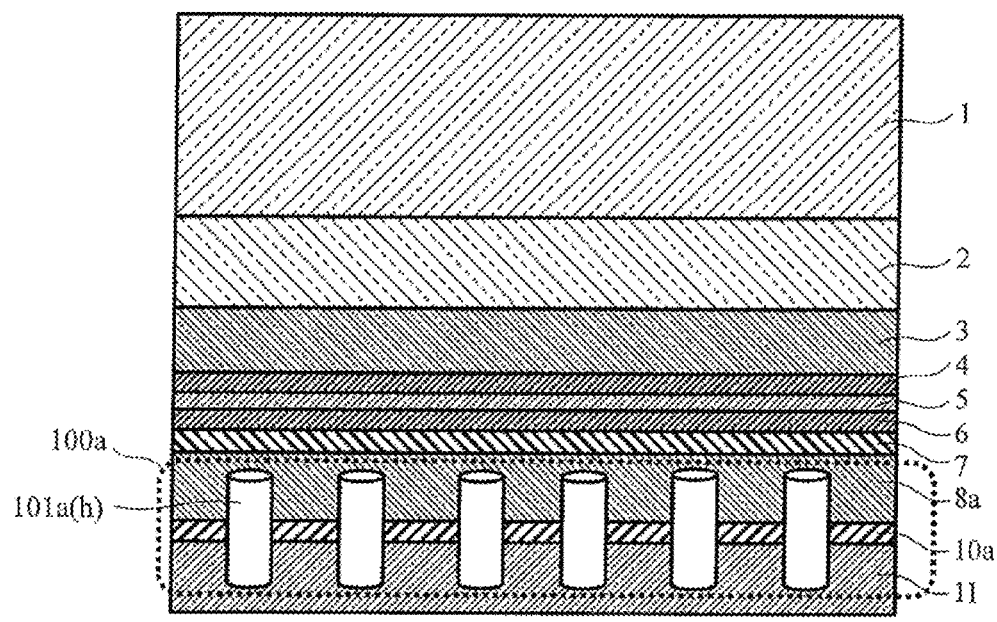
FIG. 1B is a cross-sectional view illustrating an exemplary structure of a deep ultraviolet LED in accordance with a modified example of FIG. 1A.

Hereinafter, embodiments of the present invention will be described in detail with reference to the drawings.

First Embodiment

FIG. 1A(a) illustrates the structure of an AlGaN-based deep ultraviolet LED with a design wavelength $\lambda$ of 265 nm as an example of a deep ultraviolet LED in accordance with a first embodiment of the present invention. As illustrated in FIG. 1A(a), an AlGaN-based deep ultraviolet LED in accordance with this embodiment includes, sequentially from the top of the view, a sapphire substrate 1, an AlN buffer layer 2, an n-AlGaN layer 3, a barrier layer 4, a quantum well layer 5, a barrier layer 6, an electron blocking layer 7, a transparent p-AlGaN contact layer 8a, an ultrathin Ni layer 10a, and an Al reflecting electrode layer 11. In addition, a photonic crystal periodic structure 100 is provided in the range of the thickness direction of the transparent p-AlGaN layer 8a. In addition, the photonic crystal periodic structure 100 is a reflecting photonic crystal periodic structure adapted to reflect light with the wavelength λ by having circular voids (columnar structures or holes) 101(h) and thus having a photonic band gap.

As illustrated as xy plan views in FIGS. 1A(a) and 1A(b), the reflecting photonic crystal periodic structure 100 has a hole structure in which columnar structures 101(h) each having an cylindrical shape, for example, having a lower refractive index than that of the transparent p-AlGaN contact layer 8a, such as the air, and having a circular cross-section with a radius R are formed in a triangular lattice pattern with a period of a along the x-direction and the y-direction. The columnar structures 101(h) are structures that do not reach the interface between the transparent p-AlGaN contact layer 8a and the electron blocking layer 7. This is because, unless about 50 nm of the photonic crystal periodic structure 100 is left, the electron blocking layer 7 may become damaged due to dry etching.

As a modified example of this embodiment seen from a perspective of the actual device production process, it is also possible to provide a structure in which the columnar structures 101a(h) reach the inside of the Al reflecting electrode layer 11 by penetrating the ultrathin Ni layer 10a but do not reach the interface between the Al reflecting electrode layer 11 and the air, as illustrated in FIG. 1B.

In the aforementioned structure, TE light and TM light of deep ultraviolet light with a wavelength of 265 nm emitted from the quantum well layer 5 propagate through the medium while being elliptically polarized. The degree of polarization is 0.07, and the intensity ratio of TE light/TM light is 1.17. The photonic crystal periodic structure 100 has a photonic band gap, and is formed as two structures, which are the transparent p-AlGaN contact layer 8a and the air, having different refractive indices in a bottom surface portion. Provided that the average refractive index of the structures is $n_{av}$ ($n_{av}$ is a function of the period a and the radius R of the circular void) and the period is a, when the photonic crystal periodic structure satisfies the Bragg scattering condition indicated by the following Formula (1), TE light that has become incident on the photonic crystal periodic structure is reflected, while TM light is passed through the photonic crystal periodic structure (see FIGS. 2 (a) and 2 (b)).

$$m\lambda/n_{av}=2a \quad (1)$$

Then, using R/a, which is the ratio of the radius R to the period a of each circular void, the design wavelength λ, and dielectric constants $\in_1$ and $\in_2$ of the two structures corresponding to the respective refractive indices $n_1$ and $n_2$, photonic band structures for TE light and TM light are analyzed using the plane wave expansion method. Specifically, the dielectric constants $\in_1$ and $\in_2$ are input to the Maxwell's wave equation indicated by the following Formulae (2) and (3) to compute eigen values.

[Math. 1]

TE light (2)

$$\sum_{G'} \varepsilon^{-1}(G-G')(k+G)*(k+G')H(G') = \omega^2/c^2 H(G)$$

[Math. 2]

TM light (3)

$$\sum_{G'} \varepsilon^{-1}(G-G')|k+G||k+G'|E'(G') = \omega^2/c^2 E'(G)$$

Herein, E'=|k+G|E(G), ∈ denotes the relative dielectric constant, G denotes the reciprocal lattice vector, k denotes the wave number, ω denotes the frequency, c denotes the light velocity, and E denotes the electric field.

Figure 3A:
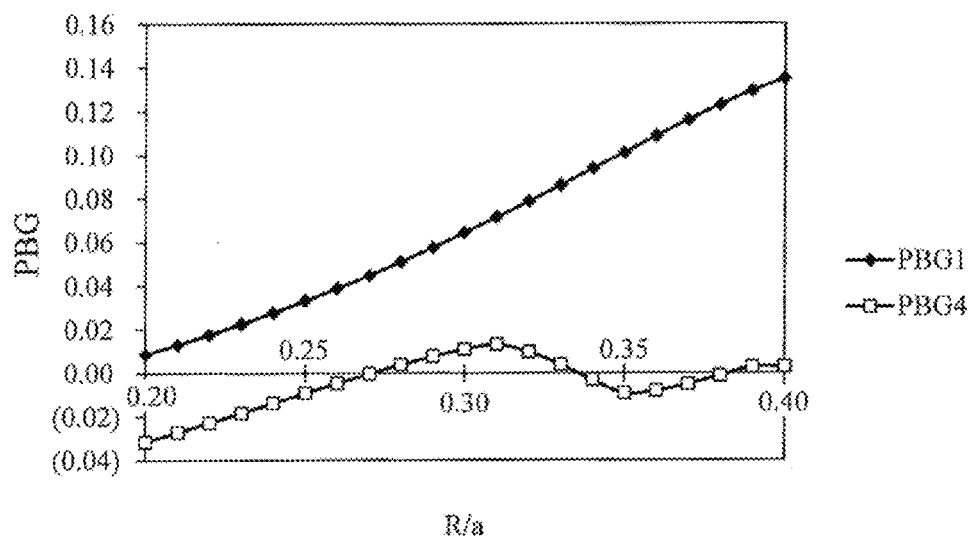

R/a is a variable, and a photonic band structure for TE light is determined by changing R/a in increments of 0.01 in the range of 0.20≤R/a≤0.40. Then, assuming that a photonic band gap between a first photonic band ($1_{st}$ PB) and a second photonic band ($2_{nd}$ PB) is PBG 1 and a photonic band gap between a seventh photonic band ($7_{th}$ PB) and an eighth photonic band ($8_{th}$ PB) is PBG 4, the relationship between each PBG and R/a is determined. FIG. 3A illustrates the results.

Figure 3B:
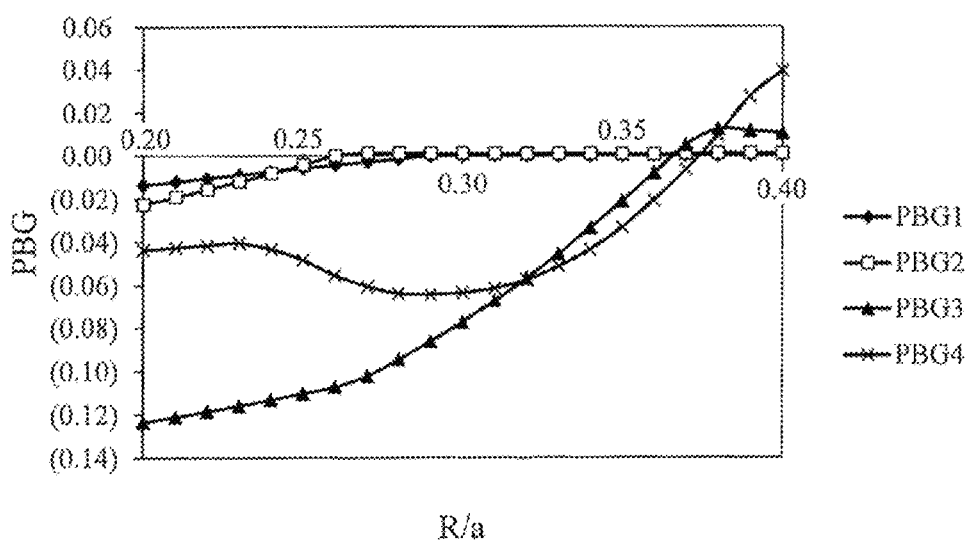

Similarly, a photonic band structure for TM light is determined, and assuming that a PBG between a $1_{st}$ PB and a $2_{nd}$ PB is PBG 1, a PBG between a $3_{rd}$ PB and a $4_{th}$ PB is PBG 2, a PBG between a $5_{th}$ PB and a $6_{th}$ PB is a PBG 3; and a PBG between a $7_{th}$ PB and an $8_{th}$ PB is PBG 4, the relationship between each PBG and R/a is determined. FIG. 3B illustrates the results.

The state density (ρ) of photonic crystals indicates how many photons can exist at which frequency. In a uniform medium, the state density increases monotonously with respect to the frequency. However, in photonic crystals, ρ(ω)=0 in the frequency region of a photonic band gap. This is due to the reason that the state density changes sharply around the photonic band gap and that the group velocity of shark peaks in the other frequency regions is zero. A representative point of symmetry at which the group velocity becomes zero is a point M where two waves change the propagation direction of light due to Bragg diffraction so as to form stationary waves. The abrupt rate of change of the state density is substantially proportional to the size of the photonic band gap.

Herein, the relationship between the size of a photonic band gap and the reflection/transmission effect, and the rate of change of the light extraction efficiency (LEE) of a deep ultraviolet LED are analyzed using the FDTD method so as to obtain the diameter d, the period a, and the depth h of the photonic crystals with which the rate of change of LEE becomes maximum.

Figure 8A:
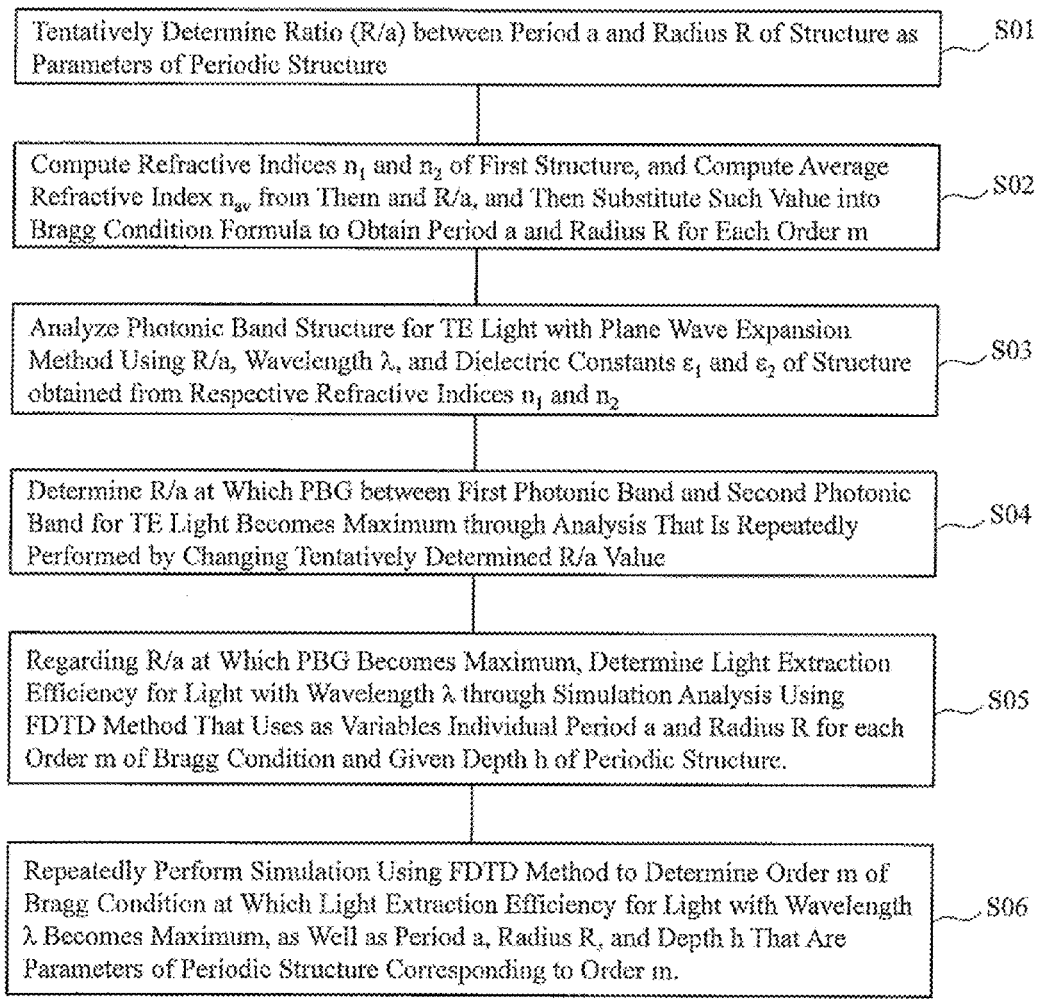
FIG. 8A is a flowchart illustrating an exemplary computation simulation process for determining a first photonic crystal periodic structure in accordance with the first embodiment of the present invention.

FIG. 8A illustrates a more detailed process flow.
(Step S01)
The ratio (R/a) between the period a and the radius R of the structure, which are parameters of the periodic structure, is tentatively determined.
(Step S02)
The refractive indices $n_1$ and $n_2$ of a first structure are computed, and the average refractive index $n_{av}$ is computed from them and R/a, and then, the average refractive index $n_{av}$ is substituted into the formula of the Bragg condition so as to obtain the period a and the radius R for each order m.
(Step S03)

A photonic band structure for TE light is analyzed with the plane wave expansion method using R/a, the wavelength λ, and the dielectric constants ∈₁ and ∈₂ of the structure obtained from the respective refractive indices $n_1$ and $n_2$.
(Step S04)

R/a at which the PBG between the first photonic band and the second photonic band for TE light becomes maximum is determined through analysis that is repeatedly performed by changing the tentatively determined R/a value.
(Step S05)

Regarding R/a at which the PBG becomes maximum, the light extraction efficiency for light with the wavelength λ is determined through a simulation analysis using the FDTD method that uses as variables the individual period a and radius R corresponding to each order m of the Bragg condition and a given depth h of the periodic structure.
(Step S06)

Simulation using the FDTD method is repeatedly performed so as to determine the order m of the Bragg condition at which the light extraction efficiency for light with the wavelength λ becomes maximum, as well as the period a, the radius R, and the depth h that are parameters of the periodic structure corresponding to the order m.

It is acceptable as long as such values are determined by selecting the order m at which the values of the wavelength λ and the period a are close to each other in the Bragg scattering formula (Formula (1)). In addition, the depth h is desirably greater than or equal to the period a as illustrated in FIG. 2.

Next, this embodiment will be described more specifically.

First, for setting the parameters of the photonic crystals, the order m of the Bragg scattering formula (Formula (1): $m\lambda/n_{av}=2a$) is determined.

For example, $n_{av}$ when R/a=0.40 is computed using the following formula.

$$n_{av}=[n_2^2+(n_1^2-n_2^2)(2\pi/3^{0.5})(R/a)^2]^{0.5}=1.848 \quad (4)$$

Herein, $n_1$=1.0 and $n_2$=2.60.

Next, λ=265 nm, $n_{av}$=1.848, and m=1 are substituted into Formula (1) so that the period a=71.7 nm at m=1 is determined.

Since the period of the photonic crystals is desirably close to the light emission wavelength, the order m=4 at which the period a=288 nm is selected. In addition, as illustrated in FIG. 2, the depth h is desirably greater than or equal to the period a. Therefore, h=300 nm.

TABLE 1

| Structure | Al Content [%] | Thickness [nm] | Refractive Index | Extinction Coefficient |
|---|---|---|---|---|
| Al Reflecting Electrode | | 160 | 0.217 | 3.219 |
| Transparent p-AlGaN Contact Layer | 75 | 350 | 2.60 | |
| Electron Blocking Layer | 95 | 40 | 2.38 | |
| Barrier Layer | 75 | 10 | 2.60 | |
| Quantum Well Layer | 60 | 10 | 2.78 | |
| Barrier Layer | 75 | 10 | 2.60 | |
| n-AlGaN Buffer Layer | 75 | 500 | 2.60 | |
| AlN Buffer Layer | | 1500 | 2.35 | |
| Sapphire Substrate | | 4500 | 1.84 | |

Wavelength: 265 nm
Degree of Polarization: 0.07

Next, computation models in Table 1 were created through designing of photonic crystals by determining the diameter d and the period a for each R/a by changing R/a as a variable in increments of 0.01 in the range of 0.20≤R/a≤0.40, so that the rate of change of LEE was determined using the FDTD method.

TABLE 2

Rate of Change of LEE [%] (Order m = 4)

| Structure | Diameter(nm)/Period(nm) | Rate of Change of LEE (Total) | Rate of Change of LEE (Axial Direction) |
|---|---|---|---|
| Flat | — | | |
| R/a = 0.20 | 90/226 | 28% | 190% |
| R/a = 0.21 | 96/228 | 32% | 216% |
| R/a = 0.22 | 101/229 | 30% | 228% |
| R/a = 0.23 | 106/229 | 37% | 243% |
| R/a = 0.24 | 112/233 | 33% | 243% |
| R/a = 0.25 | 118/235 | 30% | 213% |
| R/a = 0.26 | 124/238 | 32% | 199% |
| R/a = 0.27 | 130/240 | 31% | 228% |
| R/a = 0.28 | 136/243 | 35% | 175% |
| R/a = 0.29 | 143/246 | 29% | 197% |
| R/a = 0.30 | 149/249 | 29% | 197% |
| R/a = 0.31 | 156/252 | 32% | 178% |
| R/a = 0.32 | 164/256 | 31% | 184% |
| R/a = 0.33 | 172/260 | 35% | 206% |
| R/a = 0.34 | 180/264 | 43% | 178% |
| R/a = 0.35 | 188/269 | 36% | 175% |
| R/a = 0.36 | 197/274 | 36% | 178% |
| R/a = 0.37 | 206/279 | 38% | 144% |
| R/a = 0.38 | 216/285 | 42% | 216% |
| R/a = 0.39 | 227/291 | 46% | 259% |
| R/a = 0.40 | 239/298 | 42% | 242% |
| R/a = 0.40(h = 400 nm) | 239/298 | 40% | 168% |

Herein, h=300 nm, and the rate of change of LEE=(output 2−output 1)/output 1.

Herein, the output 1 is an output of a structure without photonic crystals (flat structure), and the output 2 is an output of a structure with a photonic crystal periodic structure. Each output was determined using a radiation pattern (far field). Further, the rate of change of LEE was determined through comparison of the entire output of the LED element with an output in the axial direction (angles of 5° to 20°) (see Table 2).

Figure 24:
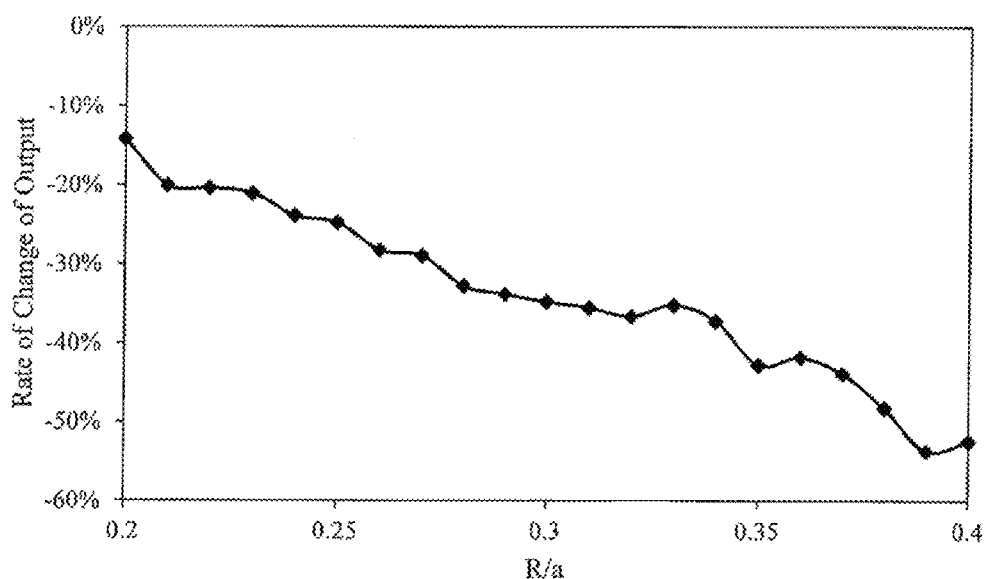
FIG. 24 is a graph illustrating the rate of change of output at the interface between an Al reflecting electrode and a transparent p-AlGaN contact layer.

In addition, a monitor for a near field was disposed at the interface between the Al reflecting electrode and the transparent p-AlGaN contact layer in Table 1. This is in order to detect light that has leaked out without being totally reflected by the photonic crystals. The output of the photonic crystal structure corresponding to each R/a was compared with the output of the structure without photonic crystals (flat structure) so as to determine the rate of change (see FIG. 24). With an increase in R/a, the rate of change of light that has leaked out without being reflected by the photonic crystals decreases. Accordingly, absorption and loss of light by the Al reflecting electrode can be suppressed. Consequently, the LEE increases with an increase in R/a.

The wavelength of a light source used was set to 265 nm and the degree of polarization was set to 0.07. It should be noted that an ultrathin Ni layer (1 nm) was omitted due to the limitations of computational resources. From the analysis results in Table 2, it is found that the rate of change of LEE is substantially proportional to the value of R/a. It is also found that the value of R/a is substantially proportional to the size of the photonic band gap for TE light (see FIG. 3A). Such a phenomenon can be explained as follows. That is, since the PBG 1 for TE light is proportional to the value of R/a, the reflection effect is maximum when R/a=0.40.

Meanwhile, for TM light (see FIG. 3B), there is almost no bandgap between the PBG 1 and the PBG 2, but a small bandgap can be confirmed between the PBG 3 and the PBG 4 in the range of 0.38≤R/a≤0.40. Thus, a slight amount of light is passed and reaches the Al reflecting electrode (with a reflectivity of 90%).

In this case, a slight amount of light is absorbed by the Al reflecting electrode (with a reflectivity of 90%), and the light extraction efficiency (LEE) thus decreases slightly. However, since the reflection effect for TE light is dominant, no problem arises. Further, when the rate of change of LEE in the axial direction (angles of 5° to 20°) is compared, the effects of the photonic crystals are prominent. Therefore, an almost perfect reflection effect is obtained, and with such effect, it has become possible to devise the structure for improving the light extraction efficiency of a variety of LEDs such as blue and white LEDs.

Hereinafter, a specific structure that uses the technology of a deep ultraviolet LED in accordance with the first embodiment and advantageous effects thereof will be described in detail.

As computation models analyzed with the FDTD method, FIGS. 4A to 4F illustrate exemplary specific structures with a design wavelength of 265 nm and a degree of polarization of 0.07. In addition, Table 3 shows the thickness of each structure used.

Figure 4A:
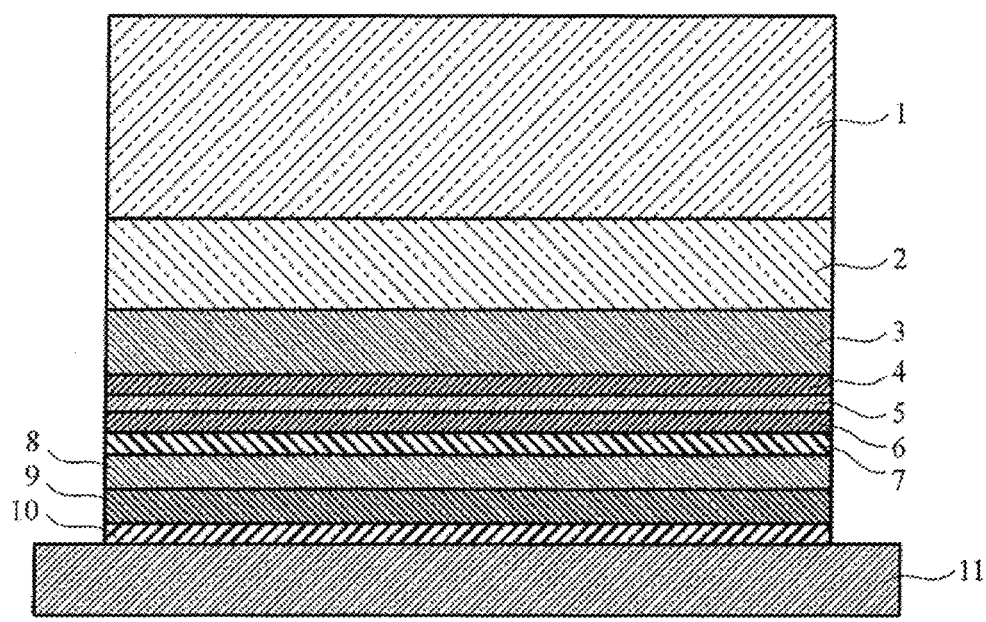
FIG. 4A is a cross-sectional view illustrating a computation model of a conventional deep ultraviolet LED.
Figure 4B:
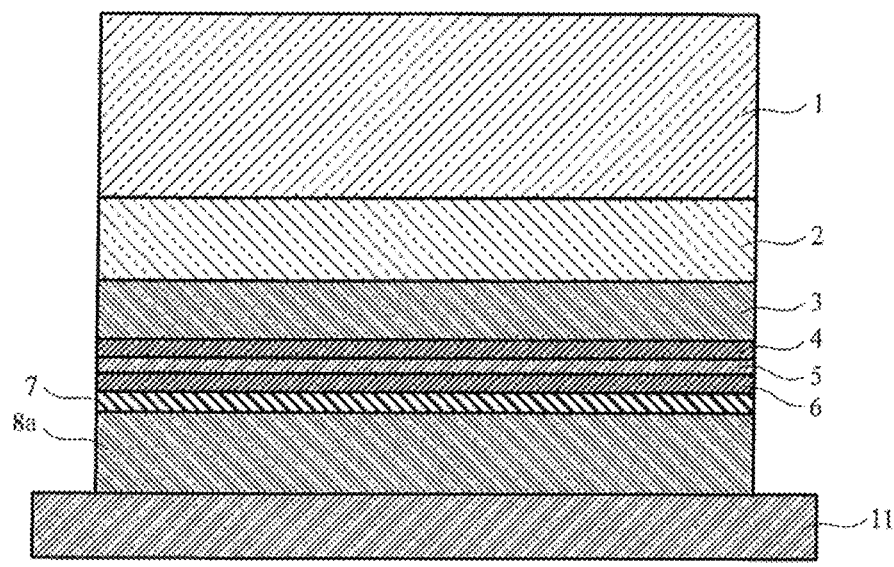
FIG. 4B is a cross-sectional view illustrating a computation model of a deep ultraviolet LED with a transparent p-AlGaN contact layer.
Figure 4C:
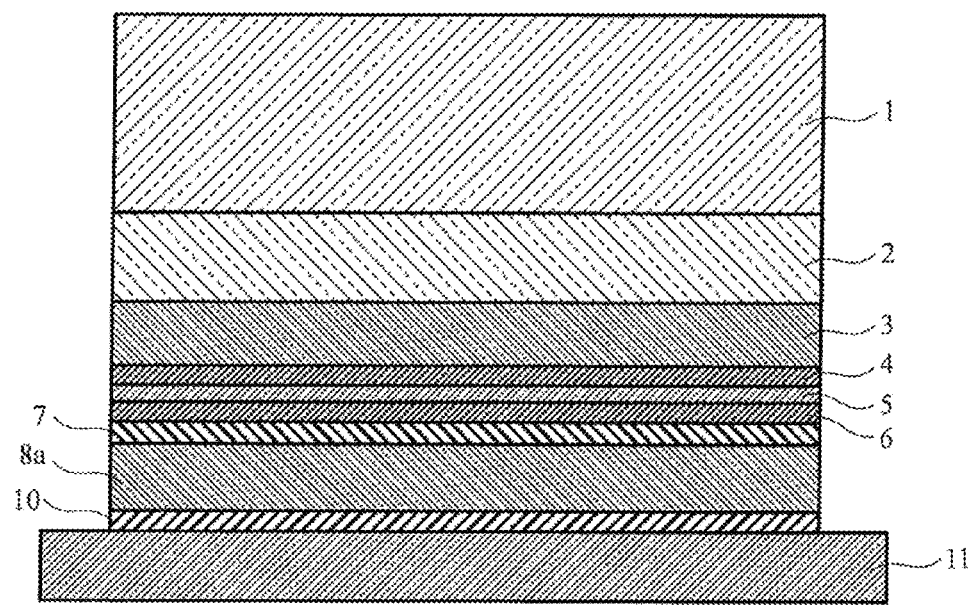
FIG. 4C is a cross-sectional view illustrating a computation model of a deep ultraviolet LED with a transparent p-AlGaN contact layer and a Ni layer (10 nm).

FIG. 4C illustrates a structure created to estimate the output decrease rate relative to the structure in FIG. 4B due to absorption when the thickness of the Ni layer 10 is increased to 10 am. Specifically, the structure has the same structure as that in FIG. 4B in a portion of from the sapphire substrate 1 to the transparent p-AlGaN contact layer 8a and has, below the transparent p-AlGaN contact layer 8a, the Ni layer 10 and the Al reflecting electrode 11.

Figure 4D:
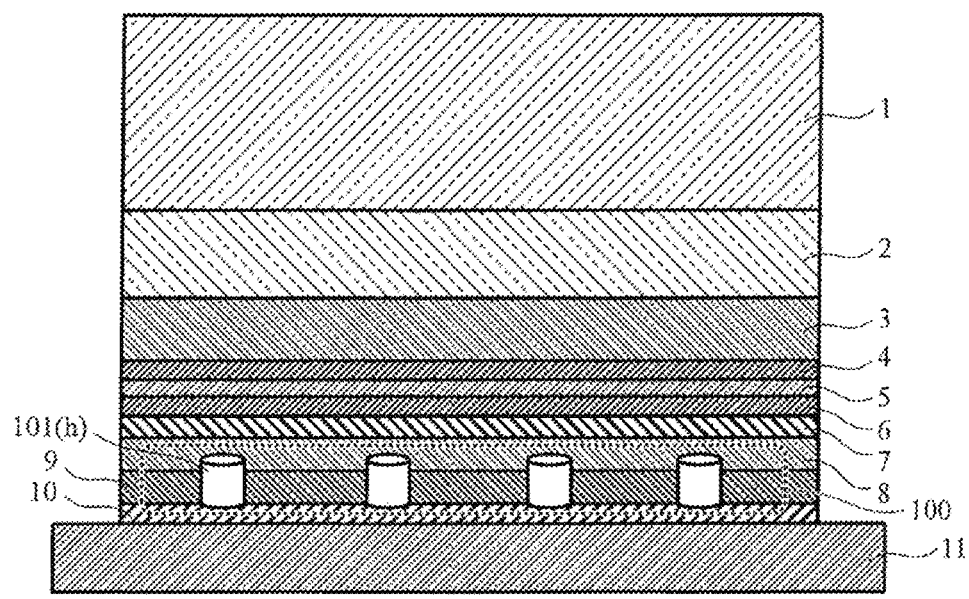
FIG. 4D is a cross-sectional view illustrating a computation model of the structure in FIG. 4A provided with a photonic crystal periodic structure.

FIG. 4D illustrates an example in which a photonic crystal periodic structure 100 (circular voids 101(h) with R/a=0.40) is provided in the structure in FIG. 4A. The circular voids 101(h) are located in a region of from the p-AlGaN layer 8 to the interface between the p-GaN contact layer 9 and the Ni layer 10, and have a depth of 300 nm.

Figure 4E:
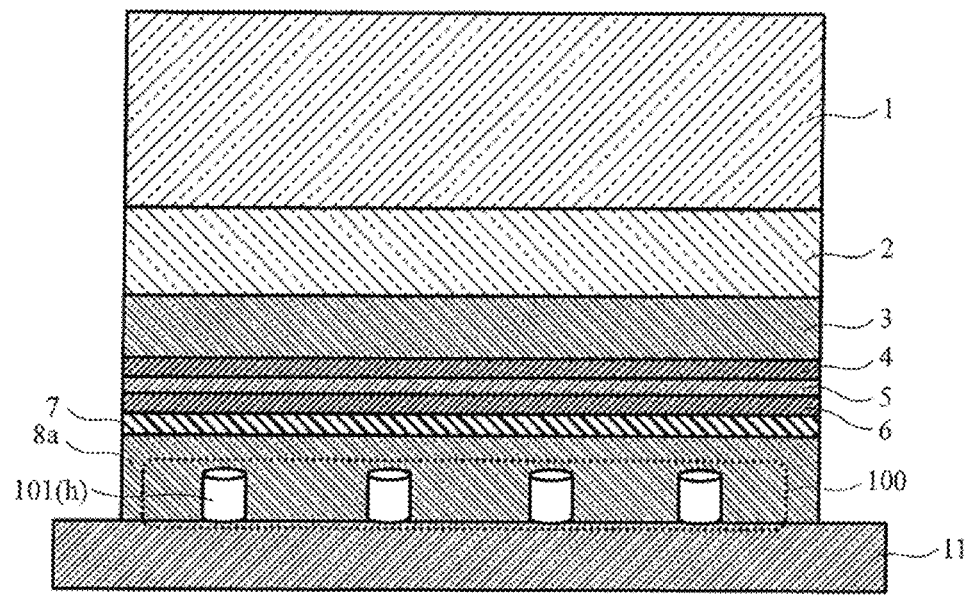
FIG. 4E is a cross-sectional view illustrating a computation model of the structure in FIG. 4B provided with a photonic crystal periodic structure.

FIG. 4E illustrates an example in which a photonic crystal periodic structure 100 (circular voids 101(h) with R/a=0.40) is provided in the structure in FIG. 4B. The circular voids 101(h) are located in a region of from the transparent p-AlGaN contact layer 8a to the interface between the transparent p-AlGaN contact layer 8a and the Al reflecting electrode 11, and have a depth of 300 nm.

Figure 4F:
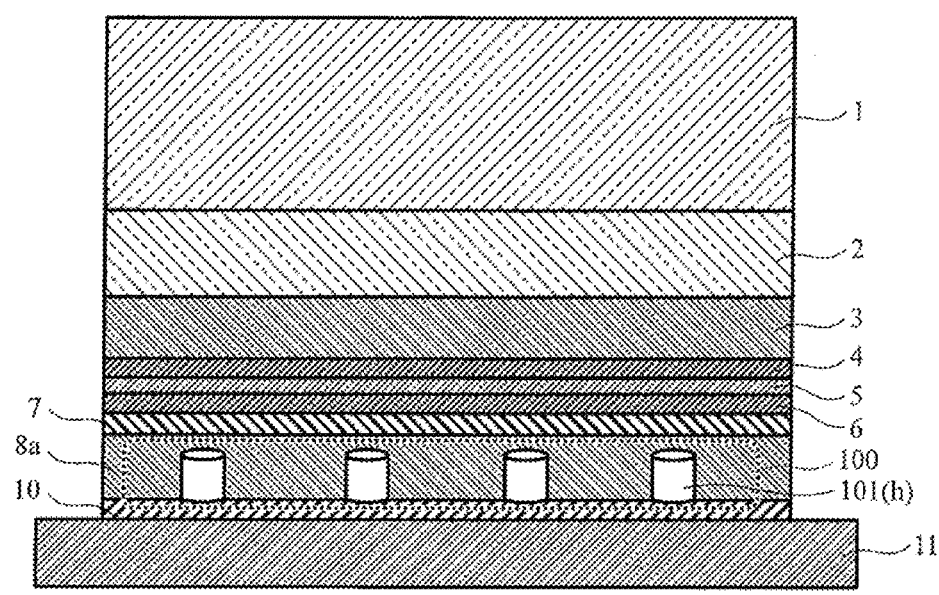
FIG. 4F is a cross-sectional view illustrating a computation model of the structure in FIG. 4C provided with a photonic crystal periodic structure.

FIG. 4F illustrates a structure in which a photonic crystal periodic structure 100 (circular voids 101(h) with R/a=0.40) is provided in the structure in FIG. 4C. The circular voids 101(h) are located in a region of from the transparent p-AlGaN contact layer 8a to the interface between the transparent p-AlGaN contact layer 8a and the Ni layer 10, and have a depth of 300 nm.

The output value of each structure was determined in a far field.

The output magnification of the output value of each of the new structures relative to the output value of the conventional structure in FIG. 4A was determined. Further, regarding each of the structures in FIGS. 4B and 4E for which the output magnification was computed with an ultrathin Ni layer with a thickness of 1 nm omitted due to limitations of computational resources, a value obtained through correction of the output magnification by subtracting therefrom a magnification corresponding to an output decrease of 7% for an ultrathin Ni layer with a thickness of 1 nm, as determined through another analysis, is shown. The light extraction efficiency (LEE) of the conventional structure in FIG. 4A was 10%, and the LEE of each of the other structures was determined through multiplication by a correction magnification (see Table 4).

TABLE 3

|  | Structure in FIG. 4A | Structure in FIG. 4B | Structure in FIG. 4C | Structure in FIG. 4D | Structure in FIG. 4E | Structure in FIG. 4F |
| --- | --- | --- | --- | --- | --- | --- |
| Sapphire Substrate | 10 μm | 10 μm | 10 μm | 10 μm | 10 μm | 10 μm |
| AlN Buffer Layer | 4 μm | 4 μm | 4 μm | 4 μm | 4 μm | 4 μm |
| n-AlGaN Layer | 1.4 μm | 1.4 μm | 1.4 μm | 1.4 μm | 1.4 μm | 1.4 μm |
| Barrier Layer | 10 nm | 10 nm | 10 nm | 10 nm | 10 nm | 10 nm |
| Quantum Well Layer | 10 nm | 10 nm | 10 nm | 10 nm | 10 nm | 10 nm |
| Barrier Layer | 10 nm | 10 nm | 10 nm | 10 nm | 10 nm | 10 nm |
| Electron Blocking Layer | 40 nm | 40 nm | 40 nm | 40 nm | 40 nm | 40 nm |
| p-AlGaN Layer | 200 nm | — | — | 200 nm | — | — |
| Transparent p-AlGaN Contact Layer | — | 350 nm | 350 nm | — | 350 nm | 350 nm |
| p-GaN Contact Layer | 200 nm | — | — | 200 nm | — | — |
| Photonic Crystals in Contact Layer | — | — | — | 300 nm | 300 nm | 300 nm |
| Ni Layer | 10 nm | — | 10 nm | 10 nm | — | 10 nm |
| Al Reflecting Electrode | 150 nm | 210 nm | 200 nm | 150 nm | 210 nm | 200 nm |
| Total | 16,030 nm | 16,030 nm | 16,030 nm | 16,030 nm | 16,030 nm | 16,030 nm |

Wavelength: 265 nm
Degree of Polarization: 0.07

Figure 22:
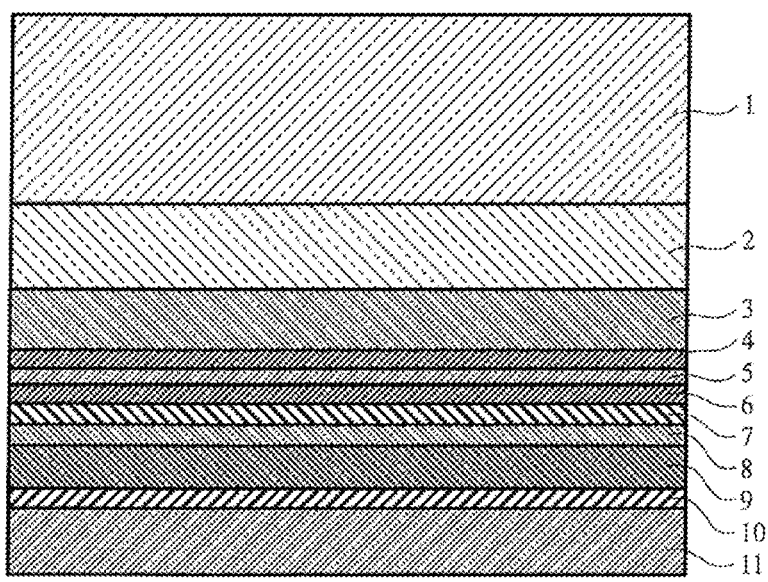
FIG. 22 is a cross-sectional view illustrating the structure of a typical conventional deep ultraviolet LED.

FIG. 4A is a view illustrating a specific example of the LED with a conventional structure illustrated in FIG. 22. The LED includes, sequentially from the top of the view, a sapphire substrate 1, an AlN buffer layer 2, an n-AlGaN layer 3, a barrier layer 4, a quantum well layer 5, a barrier layer 6, an electron blocking layer 7, a p-AlGaN layer 8, a p-GaN contact layer 9, a Ni layer 10, and an Al reflecting electrode 11.

FIG. 4B illustrates a structure with a transparent p-AlGaN contact layer 8a that does not absorb deep ultraviolet light, and has the same structure as that in FIG. 4A in a portion of from the sapphire substrate 1 to the electron blocking layer 7. Provided below the electron blocking layer 7 are the transparent p-AlGaN contact layer 8a and the Al reflecting electrode 11. Herein, an ultrathin Ni layer (1 nm) was omitted due to the limitations of computational resources. Herein, the output decrease rate per thickness of 1 nm of the Ni layer, as determined through another analysis for reference, was found to be 7%.

TABLE 4

|  | Output (w) | Output Magnification | Output Magnification for 1 nm Ni (~7%) Correction | Light Extraction Efficiency (LEE) |
| --- | --- | --- | --- | --- |
| Structure in FIG. 4A | 2.30E−16 | 1.00 | 1.00 | 10% |
| Structure in FIG. 4B | 4.18E−16 | 1.76 | 1.69 | 17% |
| Structure in FIG. 4C | 3.12E−16 | 1.31 | 1.31 | 13% |
| Structure in FIG. 4D | 4.31E−16 | 1.82 | 1.82 | 18% |
| Structure in FIG. 4E | 5.99E−16 | 2.53 | 2.46 | 25% |
| Structure in FIG. 4F | 5.20E−16 | 2.19 | 2.19 | 22% |

When the conventional structure in FIG. 4A is provided with the transparent p-AlGaN contact layer in FIG. 4B, the LEE increased by 1.69 times, which is about equal to 1.7 times that of non Patent Literature 1. In addition, when FIG. 4D (a structure obtained by adding PhC to the conventional structure), FIG. 4E (a structure obtained by adding PhC to the transparent p-AlGaN contact layer), and FIG. 4F (a structure obtained by adding PhC to the Ni layer with a thickness of 10 nm and the transparent p-AlGaN contact layer) are compared with one another, it is found that a reflection effect of the photonic crystal periodic structure is not perfect since TM light slightly passes through the PhC and is absorbed by the p-GaN contact layer or the Ni layer with a thickness of 10 nm as illustrated in FIG. 4F.

Meanwhile, with the structure in FIG. 4E obtained by providing a photonic crystal periodic structure in a structure based on a transparent p-AlGaN contact layer and an ultra-thin Ni layer, in the range of the thickness direction of the transparent p-AlGaN contact layer, it is possible to suppress an output decrease, which would otherwise occur due to absorption of deep ultraviolet light as seen as a phenomenon peculiar to deep ultraviolet LEDs, almost completely.

Therefore, it is found that the structure in FIG. 4E is suitable as a base structure (template) to be devised for improving the light extraction efficiency as described in a variety of embodiments described below.

As described above, according to this embodiment, it is possible to suppress absorption of light propagating in the upward and downward directions in a deep ultraviolet LED and thus improve the light extraction efficiency 5 times or more that of the conventional structure.

Second Embodiment

Next, the second embodiment of the present invention will be described.

A deep ultraviolet LED in accordance with the second embodiment of the present invention is adapted to have further improved light extraction efficiency by having, in addition to the reflecting photonic crystal periodic structure provided in the transparent p-AlGaN contact layer in the first embodiment, a projection/recess structure or photonic crystals provided on the other light extraction plane. FIG. 5 is a cross-sectional view illustrating an example of such a structure.

More specifically, as illustrated in FIG. 5, in the structure in FIG. 4E, a second photonic crystal periodic structure 110 is provided in addition to the first photonic crystal periodic structure 100 located in a region of from the transparent p-AlGaN contact layer 8a to the interface between the transparent p-AlGaN contact layer 8a and the Al reflecting electrode 11. Such a second photonic crystal periodic structure 110 is provided on the rear surface of the sapphire substrate 1, and is a transmissive photonic crystal periodic structure that transmits light with the wavelength λ by having a photonic band gap. The second photonic crystal periodic structure 110 includes hole (pillar) structures, which are columnar structures 111 each having a higher refractive index than that of the air, such as sapphire, formed in a triangular lattice pattern with a period of a along the x-direction and the y-direction as illustrated in a cross-sectional view of FIG. 5(a) and an xy plan view of FIG. 5(b).

Figure 6:
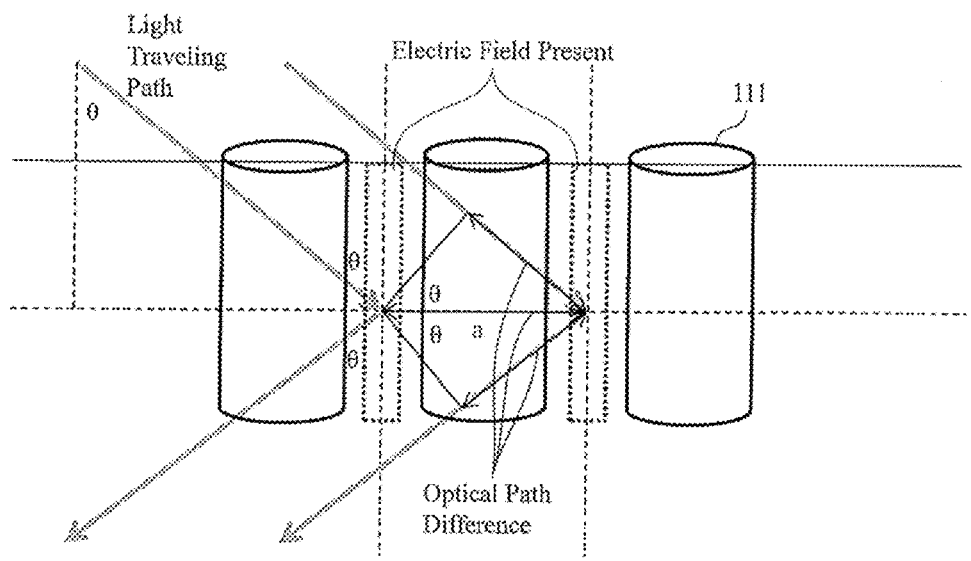
FIG. 6 illustrates an image of a view of transmission of TM light that has become incident on a photonic crystal (pillar).

FIG. 6 illustrates an image of a view of transmission of TM light that has become incident on a photonic crystal (pillar). As illustrated in FIG. 6, an electric field of TM light is likely to accumulate in a dielectric spot that exists in a perpendicular direction between the adjacent pillar-structure rods (pillars) 111(p), and it can thus be understood that when the average refractive index $n_{av}$, the period a, and the design wavelength λ satisfy the Bragg condition, Bragg scattering of TM light occurs on the plane of the electric field, that is, TM light passes through the plane of the periodic structure in this embodiment.

In order to know the physical properties of photonic crystals with respect to TM light, it is effective to perform analysis by obtaining a photonic band (PB) structure using the plane wave expansion method. The eigenvalue equation of TM light can be derived as follows from the Maxwell's equation.

$$\sum_{G'} \varepsilon^{-1}(G - G')|k + G||k + G'|E'(G') = \omega^2/c^2 E'(G) \quad (5)$$

Herein, $E'=|k+G|E(G)$, $\varepsilon$ denotes the relative dielectric constant, G denotes the reciprocal lattice vector, k denotes the wave number, ω denotes the frequency, c denotes the light velocity, and E denotes the electric field.

Figure 7:
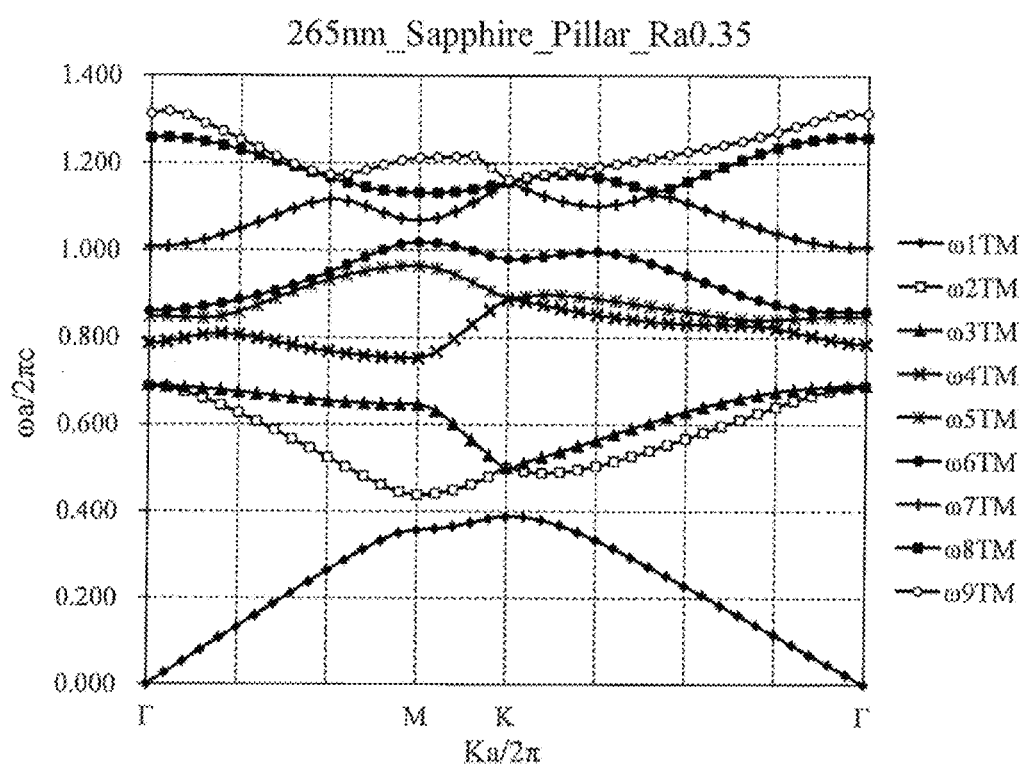
FIG. 7 is a graph illustrating an exemplary photonic band structure of photonic crystals.

FIG. 7 is a graph illustrating an exemplary photonic band (PB) structure of photonic crystals (pillar structures with R/a=0.35). As illustrated in FIG. 7, degeneracy disappears at each of points Γ, M, and K that are the points of symmetry of the photonic crystals so that each scattered wave produces a stationary wave.

As illustrated in FIG. 7, abnormality in the group velocity (dω/dk=0) occurs at such points of symmetry, and the light propagating direction thus changes. Therefore, focusing on the physical properties of light at such points of symmetry of each photonic band can obtain a guideline for optimizing the light extraction efficiency and the light distribution property of the photonic crystals.

Therefore, photonic bands (PBs) that generate stationary waves at the points Γ, M, and K are focused on. This is because as the difference between refractive indices at the interface is greater, a plurality of PBGs for TM light will appear.

The ratio between the period a and the radius R (R/a) of the photonic crystal periodic structure 110 is a value determined so as to obtain a high light transmission effect on the basis of the photonic bands for TM light.

Figure 8B:
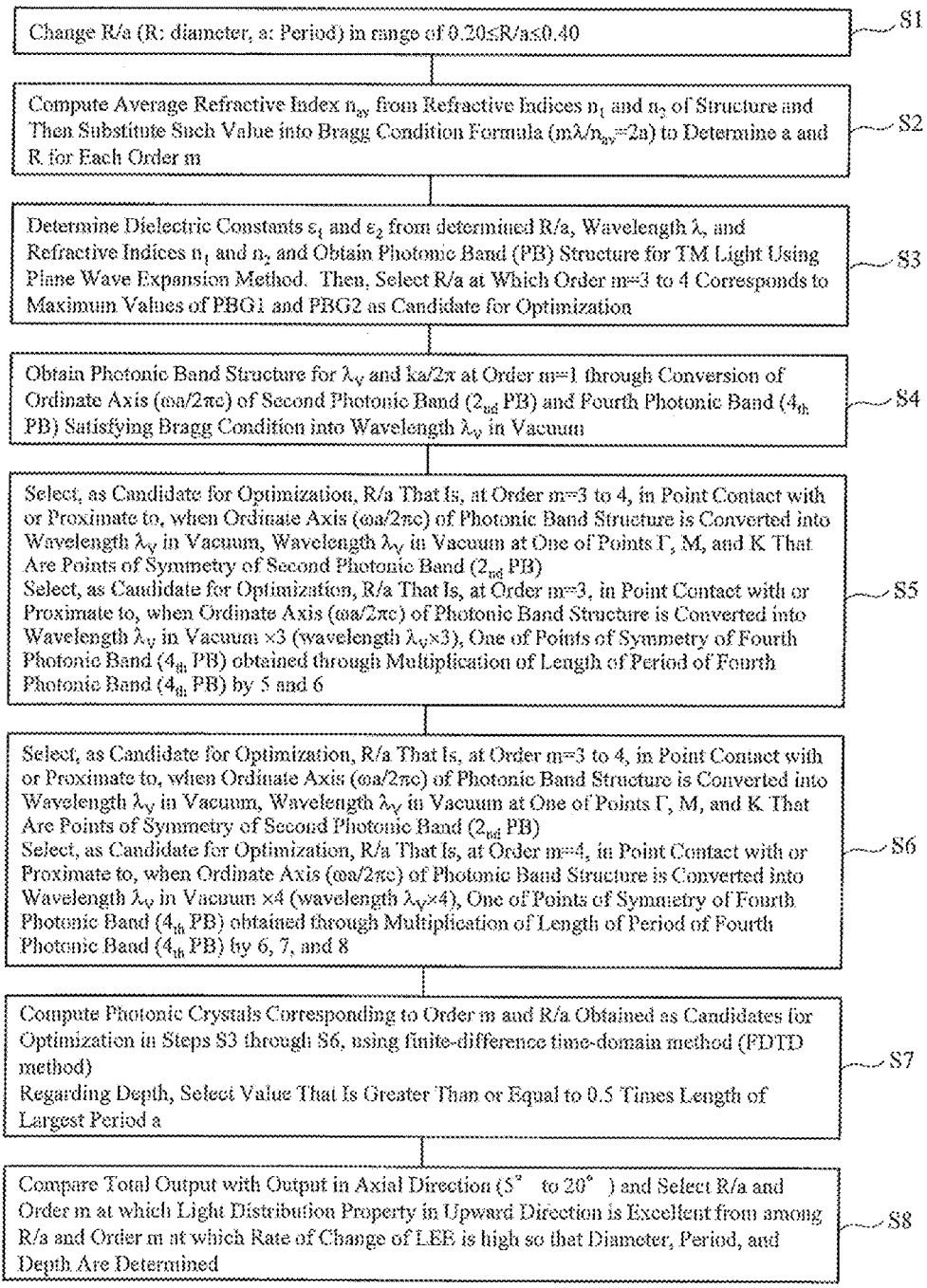
FIG. 8B is a flowchart illustrating an exemplary computation simulation process for determining a second photonic crystal periodic structure in accordance with the second embodiment of the present invention.

Hereinafter, a summary of a computation simulation process flow that has been conduced while focusing on the aforementioned point will be described. FIG. 8B is a flowchart illustrating an exemplary computation simulation process for determining the photonic crystal periodic structure 110 in accordance with the second embodiment of the present invention.

(Step S1)

In step S1, R/a (R: radius, a: period) is changed in increments of 0.01, for example, in the range of $0.20 \leq R/a \leq 0.40$.

(Step S2)

A scattered wave that satisfies the Bragg condition corresponds to one of the photonic bands (PBs). Therefore, the period a with which light with the design wavelength $\lambda$ is passed through the photonic crystal periodic structure is associated with the formula of the Bragg condition. The photonic band focused herein corresponds to a scattered wave (k+G) that satisfies the Bragg condition.

That is, in step S2, the average refractive index $n_{av}$ is computed from the refractive indices $n_1$ and $n_2$ of the structure and R/a, and the average refractive index $n_{av}$ is substituted into the formula of the Bragg condition ($m\lambda/n_{av}=2a$) so as to obtain a and R for each order m.

Herein, $$n_{av}^2 = n_2^2 + (n_1^2 - n_2^2) \times (2\pi/\sqrt{3}) \times (R/a)^2 \quad (6)$$

According to the definition of photonic crystals, the period a is close to the wavelength $\lambda$, and the period at the order m=3 and 4 corresponds to such a wavelength region.

For example, the following computation can be performed when R/a=0.35 (m=4).

Provided that $n_1$=1.84 and $n_2$=1.0, $$n_{av}^2 = (1.84)^2 + ((1.84)^2 - (1.0)^2) \times (2\pi/\sqrt{3}) \times (0.35)^2 = (1.435)^2 \quad (7)$$

Therefore, $n_{av}$=1.435. When the order m=4 and the wavelength=265 nm in a vacuum are substituted into the formula of the Bragg condition, a=369 nm. In addition, from R/a=0.35, d(2R)=258 nm.

(Step S3)

In Step S3, the dielectric constants $\in_1$ and $\in_2$ are determined from R/a determined in step S2, the wavelength $\lambda$, and the refractive indices $n_1$ and $n_2$, and a photonic band (PB) structure for TM light is obtained using the plane wave expansion method. R/a at which the order m=3 to 4 corresponds to the maximum values of PBG1 and PBG2 is selected as a candidate for optimization.

Figure 9:
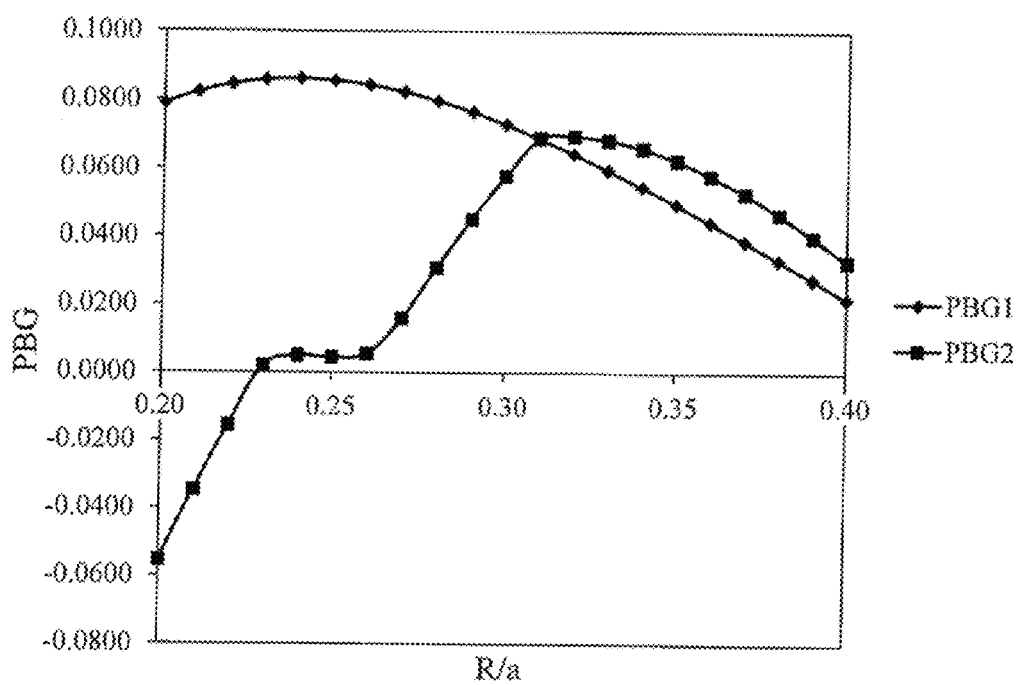
FIG. 9 is a graph illustrating the relationship between a PBG for TM light and R/a of a second photonic crystal periodic structure (pillar structure) in accordance with the second embodiment.

FIG. 9 is a graph illustrating the relationship between a PBG for TM light and R/a of the second photonic crystal structure (pillar structure) 110. Herein, FIG. 9 illustrates the relationship between R/a and PBG, where a photonic band gap (PBG) between the $1_{st}$ PB and the $2_{nd}$ PB and a photonic band gap between the $3_{rd}$ PB and the $4_{th}$ PB are indicated by PBG 1 and PBG 2, respectively.

As illustrated in FIG. 9, the photonic band gaps PBG 2 and PBG 1 have maximum values when R/a=0.24 and R/a=0.32, respectively. Since the size of each photonic band gap is correlated with the light extraction efficiency, R/a obtained from FIG. 9 is a dominant candidate for optimizing the LEE and the like independently of the order.

(Step S4)

The ordinate axis ($\omega a/2\lambda c$) of the second photonic baud ($2_{nd}$ PB) and the fourth photonic band ($4_{th}$ PB) satisfying the Bragg condition are converted into the wavelength $\lambda_v$ in a vacuum so that a photonic band structure for $\lambda_v$ and $ka/2\pi$ at the order m=1 is obtained. The ordinate axis can be converted into $\omega a/2\pi c = a/\lambda_{PhC}$. It should be noted that $\lambda_{PhC}$ is the wavelength in the photonic crystals (PhC). Therefore, $\lambda_v = \lambda_1 = a_1/(\omega a/2\pi c) \times n_{av}$. In addition, from the formula of the Bragg condition, that is, $1 \times \lambda_v/n_{av} = 2a_1$, $a_1 = \lambda_v/2n_{av}$ is derived.

Herein, the reason why the second photonic band ($2_{nd}$ PB) and the fourth photonic band ($4_{th}$ PB) are selected is that as illustrated in FIG. 9, the PBG 1 and the PBG 2 open widely in the range of $0.20 \leq R/a \leq 0.40$, and the second photonic band ($2_{nd}$ PB) and the fourth photonic band ($4_{th}$ PB) generate stationary waves at each point of symmetry, and thereafter change the propagation direction of light.

Figure 10B:
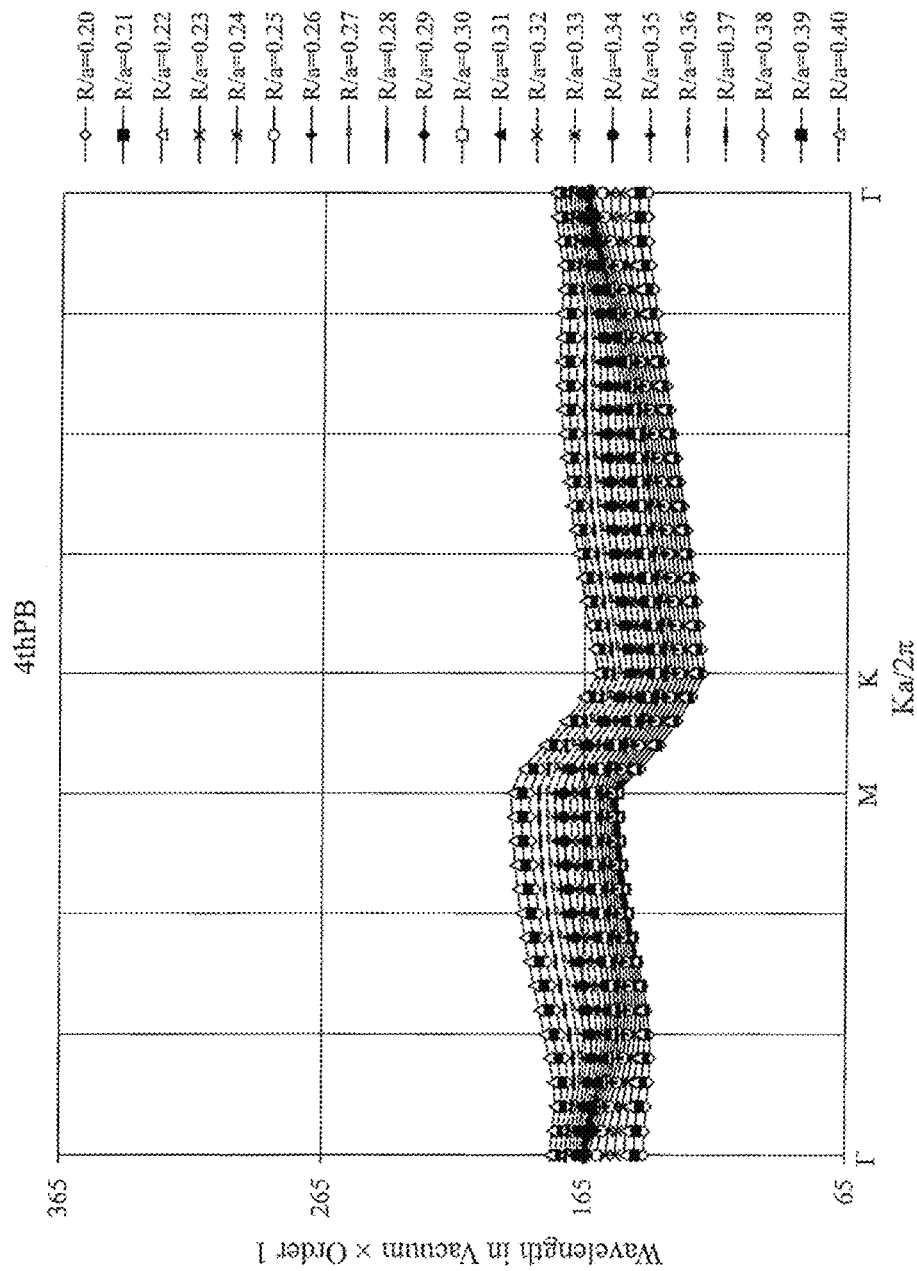
FIG. 10B is a graph illustrating a photonic band structure for $\lambda_v$ and $ka/2\pi$ at the order m=1 that is obtained through conversion of the ordinate axis ($\omega a/2\pi c$) of a fourth photonic band ($4_{th}$ PB) satisfying the Bragg condition into the wavelength $\lambda_v$ in a vacuum.

Their principles will be described with reference to FIG. 10A and FIG. 10B. FIG. 10A is a graph illustrating a photonic band structure for $\lambda_v$ and $ka/2\pi$ at the order m=1 that is obtained through conversion of the ordinate axis ($\omega a/2\pi c$) of the second photonic band ($2_{nd}$ PB) satisfying the Bragg condition into the wavelength $\lambda_v$ in a vacuum. FIG. 10B is a graph illustrating a photonic band structure for $\lambda_v$ and $ka/2\pi$ at the order m=1 that is obtained through conversion of the ordinate axis ($\omega a/2\pi c$) of the fourth photonic band ($4_{th}$ PB) satisfying the Bragg condition into the wavelength $\lambda_v$ in a vacuum.

Herein, R/a at which the second photonic band ($2_{nd}$ PB) generates a stationary wave at each point of symmetry corresponds to R/a that is in point contact with or proximate to the wavelength of 265 nm in a vacuum.

Therefore, from FIG. 10A, it is found that such R/a corresponds to R/a=0.28 at the point M and R/a=0.35 at the point K. In FIG. 10B, none of R/a is in proximity to the wavelength of 265 nm in a vacuum in the range of $0.20 \leq R/a \leq 0.40$. Therefore, no stationary waves are generated.

(Step S5)

First, R/a determined at the order m=3 is considered. FIG. 11A is a view illustrating R/a determined at the order m=3, specifically, a condition where the second photonic band ($2_{nd}$ d PB) when R/a=0.35 (order m=1) generates a stationary wave. FIG. 11B is a view illustrating R/a determined at the order m=3, specifically, a condition where the fourth photonic band ($4_{th}$ PB) at R/a generates a stationary wave.

As illustrated in FIG. 11A, the second photonic band ($2_{nd}$ PB) at R/a=0.35 (order m=1) in step S2 generates a stationary wave. The length of the period at the order m=3 is three times that of the period at the order m=1, and the phase is maintained. Therefore, a stationary wave with three anti-nodes is generated. Therefore, $\lambda_3 = a_3/(\omega a/2\pi c) \times n_{av}$, $a_3 = 3\lambda_v/2n_{av}$.

The length of the period at m=3 is three times that of the period at m=1. Therefore, the magnitude of the wavelength on the ordinate axis also becomes the wavelength $\lambda_v$ in a vacuum ×3 (order m).

Figure 12A:
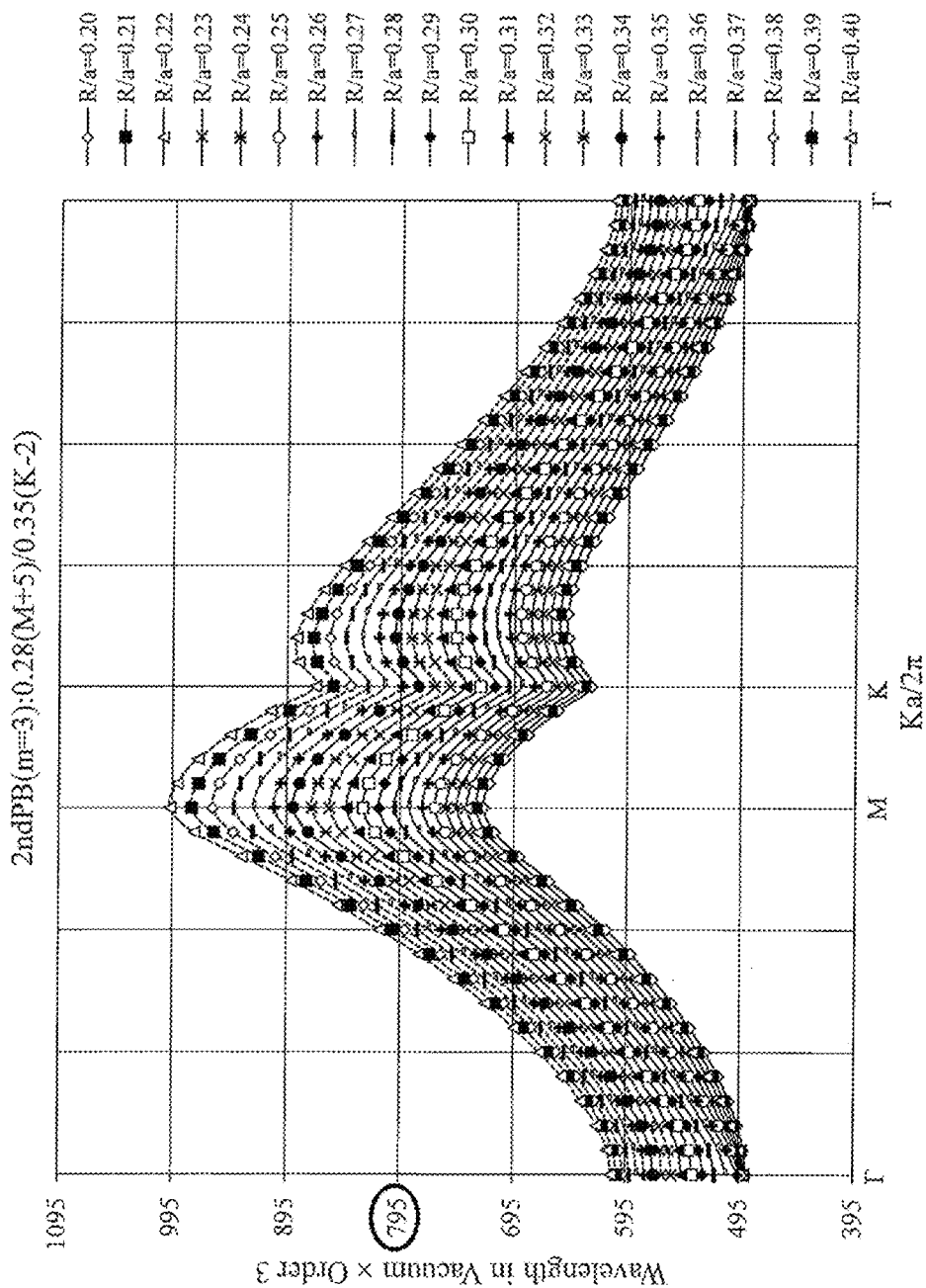
FIG. 12A is a graph illustrating a photonic band structure where the ordinate axis indicates $3\lambda_v$ and the abscissa axis indicates $ka/2\pi$ that is obtained through conversion of the ordinate axis ($\omega a/2\pi c$) of the second photonic band ($2_{nd}$ PB) satisfying the Bragg condition into the wavelength $\lambda_v$ in a vacuum and multiplying the result by the order (m=3) that is an integer.

In addition, R/a that generates a stationary wave corresponds to R/a that is in point contact with or proximate to the wavelength in a vacuum ×3=795 nm at each point of symmetry, specifically, the point M (R/a=0.28) and the point K (R/a=0.35) similarly to at the order m=1. Therefore, such R/a becomes a candidate for optimization. FIG. 12A illustrates a photonic band structure of the second photonic band ($2_{nd}$ PB) regarding the wavelength in a vacuum ×3 (order) and the wave number.

Figure 12B:
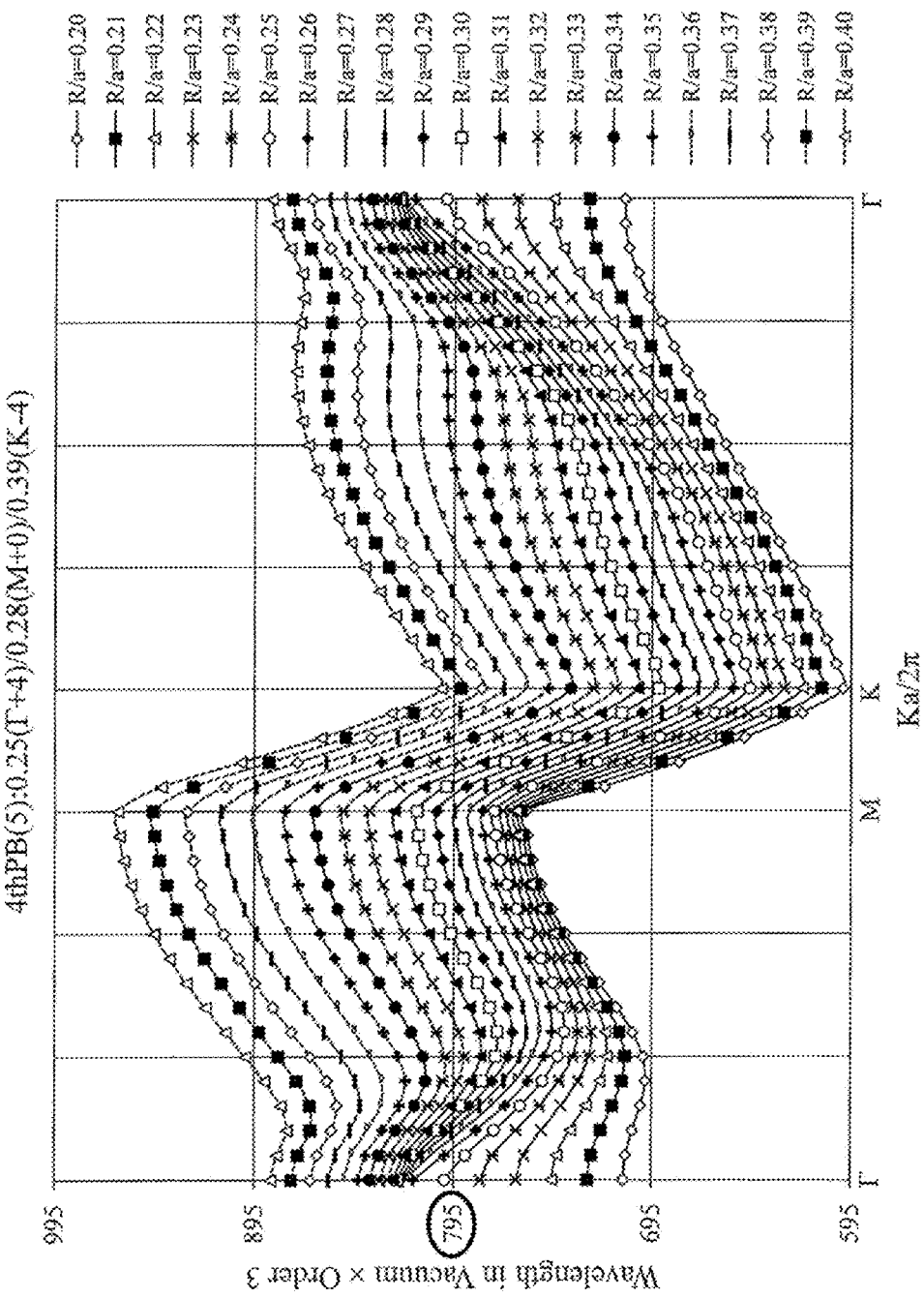
FIG. 12B is a graph illustrating a photonic band structure where the ordinate axis indicates $3\lambda_v$ and the abscissa axis indicates $ka/2\pi$ that is obtained through conversion of the ordinate axis ($\omega a/2\pi c$) of the fourth photonic band ($4_{th}$ PB) satisfying the Bragg condition into the wavelength $\lambda_v$ in a vacuum and multiplying the result by 5.

Meanwhile, the frequency of the fourth photonic band ($4_{th}$ PB) at m=1 is higher than, specifically, double the frequency of the second photonic band ($2_{nd}$ PB). In addition, stationary waves are not generated at any R/a in the range of $0.20 \leq R/a \leq 0.40$. However, at the order m=3, the length of the period becomes large in proportion to the order, and the same phase is attained at given R/a, thus generating a stationary wave. As illustrated in FIG. 12B, the fourth photonic band ($4_{th}$ PB) at given R/a generates a stationary wave under the condition that the length of the period is five times and six times the length of the period at given R/a at m=1, and stationary waves with five anti-nodes and six anti-nodes are generated in the length of the period at m=3.

Herein, FIGS. 12B and 12C illustrate photonic band structures obtained through multiplication of the length of the period of the fourth photonic band ($4_{th}$ PB) at all R/a determined in step S4 by five and six, respectively, in order to determine R/a that is in point contact with or proximate to the wavelength in a vacuum ×3=795 nm at each point of symmetry. When the length of the period of the fourth photonic band is multiplied by 5, the point Γ (R/a=0.25), the point M (R/a=0.28), and the point K (R/a=0.39) appear. When the length of the period of the fourth photonic band is multiplied by 6, the point Γ (there is no corresponding R/a), the point M (there is no corresponding R/a), and the point K (R/a=0.27) appear, all of which are candidates for optimization.

(Step S6)

Figure 13C:
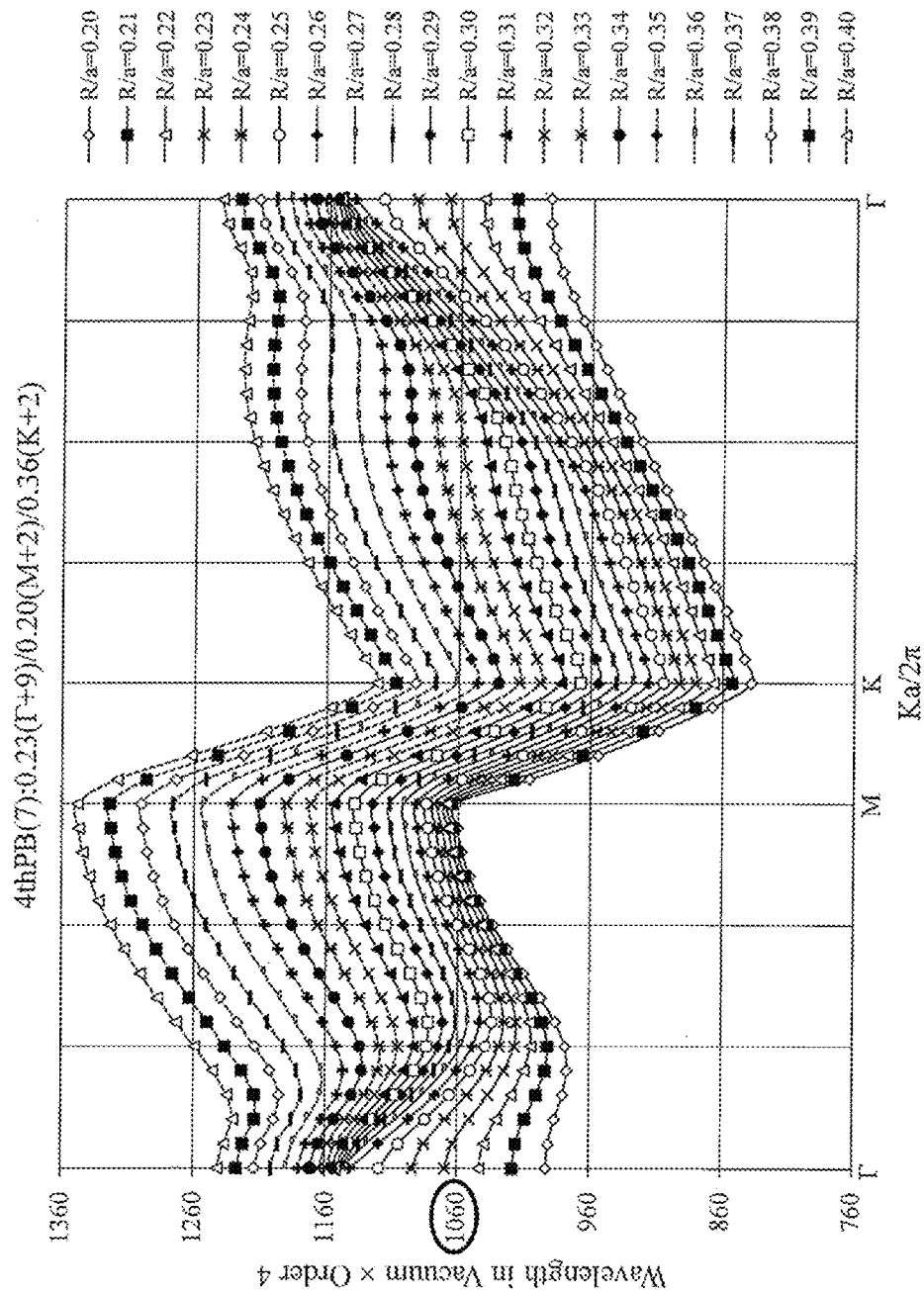
FIG. 13C is a graph illustrating a photonic band structure where the ordinate axis indicates $4\lambda_v$ and the abscissa axis indicates $ka/2\pi$ that is obtained through conversion of the ordinate axis ($\omega a/2\pi c$) of the fourth photonic band ($4_{th}$ PB) satisfying the Bragg condition into the wavelength $\lambda_v$ in a vacuum and multiplying the result by 7.
Figure 13D:
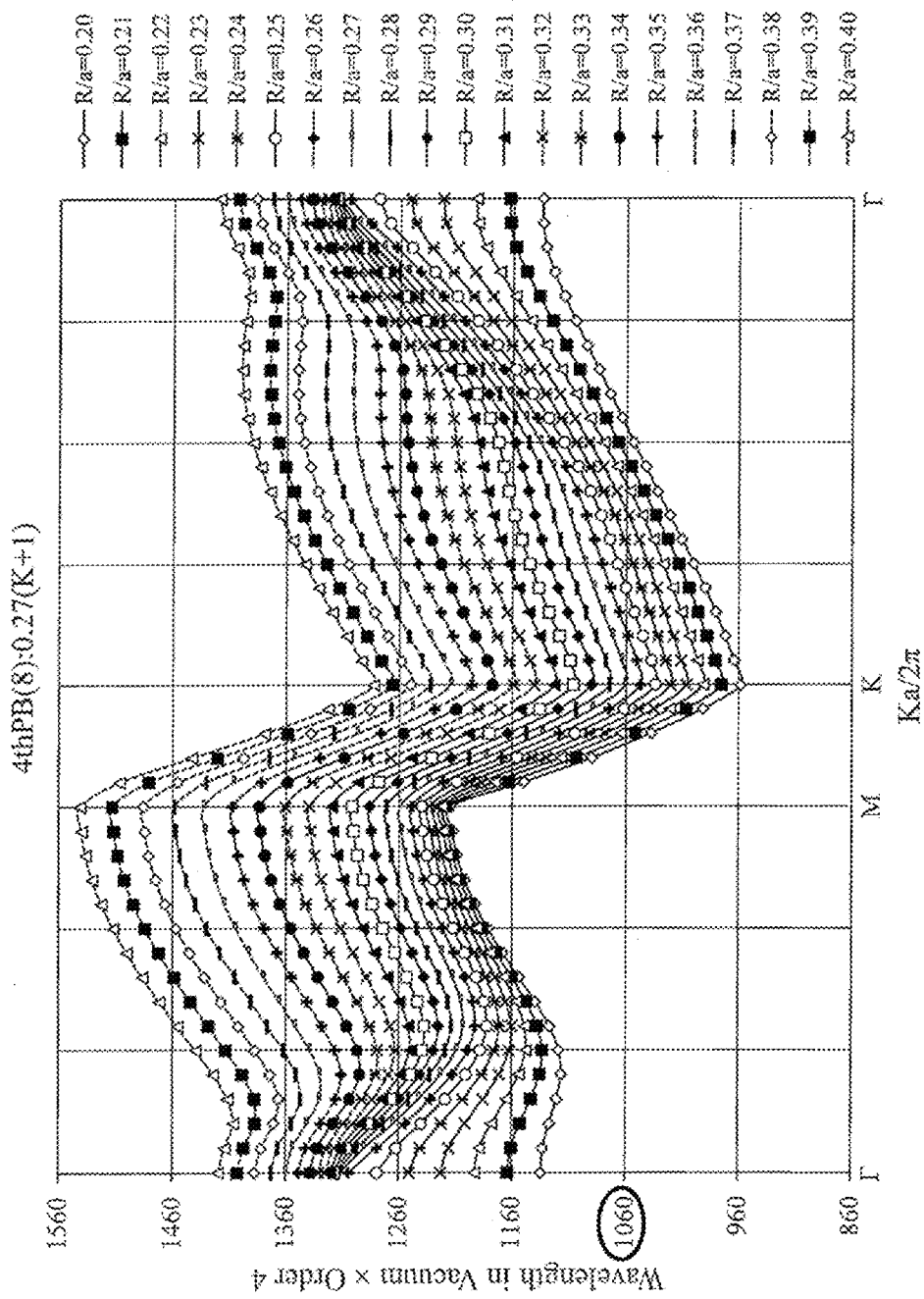
FIG. 13D is a graph illustrating a photonic band structure where the ordinate axis indicates $4\lambda_v$ and the abscissa axis indicates $ka/2\pi$ that is obtained through conversion of the ordinate axis ($\omega a/2\pi c$) of the fourth photonic band ($4_{th}$ PB) satisfying the Bragg condition into the wavelength $\lambda_v$ in a vacuum and multiplying the result by 8.

At the order m=4, $\lambda_4 = a_4/(\omega a/2\pi c) \times n_{av}$ and $a_4 = 4\lambda_4/2n_{av}$. FIG. 13A illustrates a photonic band structure of the second photonic band ($2_{nd}$ PB) regarding the wavelength in a vacuum and the wave number. R/a that is proximate to the wavelength in a vacuum ×4=1060 nm at each point of symmetry is at the point M (R/a=0.28) and the point K (R/a=0.35) similarly to at the order m=1. In addition, the fourth photonic band ($4^{th}$ PB) at given R/a generates a stationary wave under the condition that the length of the period is 6, 7, or 8 times the length of the period at given R/a at m=1. Herein, when R/a that is in point contact with or proximate to the wavelength in a vacuum ×4=1060 nm at each point of symmetry is determined, the point Γ (R/a=0.40) and the point M (R/a=0.35) appear when the length of the period is multiplied by 6 (FIG. 13B); the point Γ (R/a=0.23), the point M (R/a=0.20), and the point K (R/a=0.36) appear when the length of the period is multiplied by 7 (FIG. 13C); and the point Γ (there is no corresponding R/a), the point M (there is no corresponding R/a), and the point K (R/a=0.27) appear when the length of the period is multiplied by 8 (FIG. 13D). Thus, all of such R/a are candidates for optimization.

(Step S7)

Photonic crystals corresponding to the order m and R/a obtained as the candidates for optimization in steps S3 through S6 are computed using the finite-difference time-domain method (FDTD method). Regarding the depth, a given value that is greater than or equal to 0.5 times the length of the period a that is the largest at the order m=3 to 4 is selected.

(Step S8)

The entire output of the LED element is compared with the output in the axial direction (angles of 5° to 20°) so that R/a and the order m at which the light distribution property in the axial direction is excellent are selected from among R/a and the order m at which the rate of change of LEE is high. Therefore, the diameter, the period, and the depth that are the parameters for optimizing the photonic crystals are determined.

TABLE 11

|  | Po(w) | Rate of Change | Po(<20°) | Rate of Change |
| --- | --- | --- | --- | --- |
| pAlGaN(Ni0 nm_Hole | 5.99E-16 | — | 3.91E-17 | — |
| Pillar(Ra0.20_m4) | 7.32E-16 | 22.2% | 4.91E-17 | 26% |
| Pillar(Ra0.23_m4) | 7.37E-16 | 23.0% | 5.13E-17 | 31% |
| Pillar(Ra0.25_m3) | 7.50E-16 | 25.2% | 5.64E-17 | 44% |
| Pillar(Ra0.27_m3) | 7.25E-16 | 21.0% | 5.87E-17 | 50% |
| Pillar(Ra0.27_m4) | 7.51E-16 | 25.3% | 5.12E-17 | 31% |
| Pillar(Ra0.28_m3) | 7.49E-16 | 25.0% | 5.45E-17 | 39% |
| Pillar(Ra0.28_m4) | 7.47E-16 | 24.6% | 5.45E-17 | 39% |
| Pillar(Ra0.35_m3) | 7.28E-16 | 21.4% | 5.63E-17 | 44% |
| Pillar(Ra0.35_m4) | 7.49E-16 | 25.0% | 5.40E-17 | 38% |
| Pillar(Ra0.36_m4) | 7.70E-16 | 28.5% | 5.35E-17 | 37% |
| Pillar(Ra0.39_m3) | 7.36E-16 | 22.9% | 5.53E-17 | 41% |
| Pillar(Ra0.40_m4) | 7.36E-16 | 22.8% | 5.14E-17 | 31% |

Figure 25:
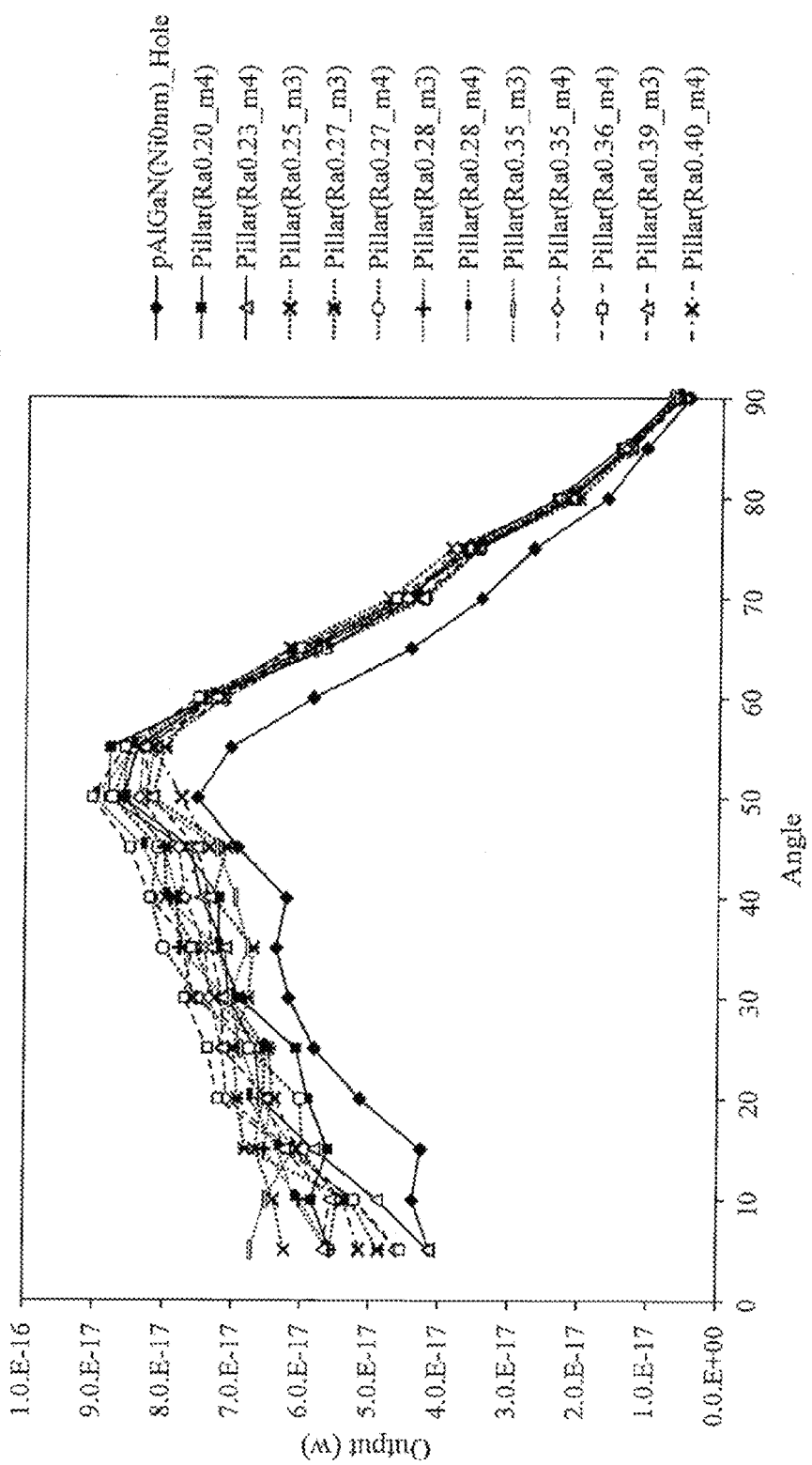
FIG. 25 is a graph illustrating the light distribution properties of candidate LEDs for optimizing photonic crystals.

The computation results of step S7 are shown in Table 11 and FIG. 25. Herein, Po(w) in Table 11 indicates the output of the entire LED element, and Po (<20°) indicates the output in the axial direction.

FIG. 25 is a graph of the angle dependence of the output, and represents the light distribution properties of LEDs. The results can confirm that the aforementioned optimization method is appropriate because the LEE as well as the output in the axial direction of a photonic crystal corresponding to each R/a indicates high values.

Third Embodiment

Next, a deep ultraviolet LED in accordance with a third embodiment of the present invention will be described with reference to the drawings.

Figure 14B:
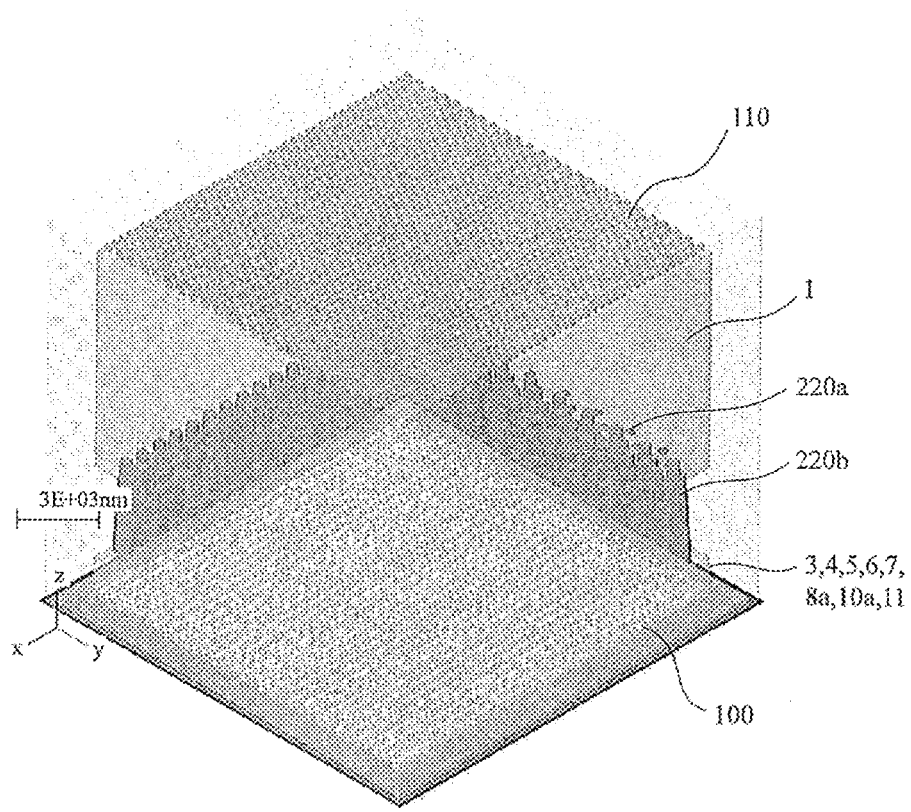
FIG. 14B is a bird's-eye view of the deep ultraviolet LED in FIG. 14A.

A deep ultraviolet LED in accordance with this embodiment is adapted to have improved light extraction efficiency by further having a periodic structure (projection/recess structure) described below in addition to the reflecting photonic crystal structure (first photonic crystal periodic structure) provided in the transparent p-AlGaN contact layer and the transmissive photonic crystal periodic structure (second photonic crystal periodic structure) provided on the rear surface of the sapphire substrate. FIG. 14A is a cross-sectional view illustrating an exemplary configuration of the deep ultraviolet LED in accordance with this embodiment, and FIG. 14B is a perspective view (bird's-eye view) thereof.

As illustrated in the xy plan views of FIGS. 14A(b) and 14A(a), nano-PSS and connected-pillar periodic structure 220 are circular truncated cone structures that are formed in a triangular lattice pattern with a period of a along the x-direction and the y-direction. For example, the front surface of the sapphire substrate 1 (surface on the lower side in FIG. 14A) has a nano-PSS (Patterned Sapphire Substrate) periodic structure (triangular pyramidal or conical holes) 220a with a period of about 1 μm, for example. Such a recess structure can be formed by processing the front surface of the sapphire substrate 1 through wet etching using a mask pattern, such as photoresist formed on the front surface.

Next, for the recess structure, an AlN film is formed to a thickness of about several μm through epitaxial growth in the nano-PSS periodic structure 220a using CVD or the like. Then, the recess structure is filled with the AlN film, and AlN connected pillars 220b, which are truncated hexagonal pyramidal in shape, are selectively formed thereon in the thickness direction. Finally, a flat epitaxial film is obtained.

At this time, the number of threading dislocations generated in the initial stage of the AlN epitaxial growth decreases to a value of less than or equal to $5 \times 10^8/\text{cm}^3$ after the film has grown to a thickness of about several μm. Therefore, the crystallinity of the quantum well layer 5 is improved than those of the conventional LEDs, and thus the internal quantum efficiency (IQE) of the deep ultraviolet LED is improved.

In addition, according to such a structure, deep ultraviolet light emitted from the quantum well layer 5 propagates through the AlN connected pillars 220b formed as truncated hexagonal pyramids as waveguides, and then becomes incident on the sapphire substrate 1. Therefore, total internal reflection at the interface between the sapphire substrate 1 and the nano-PSS periodic structure 220a is suppressed, and thus the light extraction efficiency is improved.

The effects of the deep ultraviolet LED in accordance with the third embodiment will be described. Computation models analyzed with the FDTD method have a design wavelength of 265 nm and a degree of polarization of 0.07. FIGS. 15A to 15C illustrate specific examples of such structures.

In addition, Table 5 shows the thickness of each structure.

TABLE 5

|  | Structure in FIG. 15A | Structure in FIG. 15B | Structure in FIG. 15C |
|---|---|---|---|
| Photonic Crystals (Piliars) on the Rear Surface of the Substrate | 300 nm | 300 nm | 300 nm |
| Sapphire Substrate | 10 μm | 10 μm | 10 μm |
| Nano-PSS on the Front Surface of the Substrate | 200 nm | 200 nm | 200 nm |
| AlN Connected-Pillar Columnar Structure | 4 μm | 4 μm | 4 μm |
| n-AlGaN Layer | 1.4 μm | 1.4 μm | 1.4 μm |
| Barrier Layer | 10 nm | 10 nm | 10 nm |
| Quantum Well Layer | 10 nm | 10 nm | 10 nm |
| Barrier Layer | 10 nm | 10 nm | 10 nm |
| Electron Blocking Layer | 40 nm | 40 nm | 40 nm |
| p-AlGaN Layer | — | — | 200 nm |
| Transparent p-AlGaN Contact Layer | 350 nm | 350 nm | — |
| p-GaN Contact Layer | — | — | 200 nm |
| Photonic Crystals (Holes) in the Contact Layer | 300 nm | 300 nm | 300 nm |
| Ni Layer | 0 nm | 10 nm | 10 nm |
| Al Reflecting Electrode | 200 nm | 210 nm | 150 nm |
| Total | 16,030 nm | 16,030 nm | 16,030 nm |

It should be noted that the diameter, the period, and the depth of the photonic crystals (pillars) provided on the rear surface of the sapphire substrate are 258 nm, 369 nm, and 300 nm, respectively.

FIG. 15A illustrates a structure provided with a transparent p-AlGaN contact layer 8a that does not absorb deep ultraviolet light, and includes, sequentially from the top of the view, a photonic crystal (pillar) periodic structure (second photonic crystal periodic structure) 110 formed on the rear surface of a sapphire substrate 1, the sapphire substrate 1, a nano-PSS (triangular pyramidal) periodic structure 220a formed on the front surface of the sapphire substrate 1, AlN connected pillars 220b, an n-AlGaN layer 3, a barrier layer 4, a quantum well layer 5, a barrier layer 6, an electron blocking layer 7, a transparent p-AlGaN contact layer 8a, a photonic crystal (hole) periodic structure (first photonic crystal periodic structure) 100, and an Al reflecting electrode 11. Herein, an ultrathin Ni layer (1 nm) was omitted due to the limitations of computational resources.

FIG. 15B illustrates a structure for seeing an output decrease due to absorption when the thickness of the Ni layer 10 is increased to 10 nm in the structure illustrated in FIG. 15A. The sequentially stacked structure of up to the electron blocking layer 7 from the top of the view is the same as that in FIG. 15A. The structure further includes, on the electron blocking layer 7, a transparent p-AlGaN contact layer 8a, a photonic crystal (hole) periodic structure 100, a Ni layer 10, and an Al reflecting electrode 11.

FIG. 15C illustrates a structure with a p-GaN contact layer 9 and a Ni layer 10 (10 nm) that absorb deep ultraviolet light. The sequentially stacked structure of up to the electron blocking layer 7 from the top of the view is the same as that in FIG. 15A. The structure further includes, on the electron blocking layer 7, a p-AlGaN layer 8, a p-GaN contact layer 9, a photonic crystal (hole) periodic structure 100, a Ni layer 10, and an Al reflecting electrode 11.

The output value of each structure was determined in a far field.

In addition, the output magnification of the output value of each structure relative to the output value of the conventional structure illustrated in FIG. 4A was determined. Further, regarding the output magnification of the structure in FIG. 15A computed with an ultrathin Ni layer with a thickness of 1 nm omitted due to the limitations of computational resources, correction was applied through subtraction therefrom a magnification corresponding to an output decrease of 7% for an ultrathin Ni layer with a thickness of 1 nm, as determined through another analysis. Further, the light extraction efficiency (LEE) of the conventional structure in FIG. 4A was 10%, and the LEE of each of the other structures was determined through multiplication by a correction magnification (see Table 6).

TABLE 6

| | Output (w) | Output Magnification | Output Magnification for 1 nm Ni (−7%) Correction | Light Extraction Efficiency (LEE) |
|---|---|---|---|---|
| Structure in FIG. 15A | 6.62E−16 | 2.79 | 2.72 | 27% |
| Structure in FIG. 15B | 5.34E−16 | 2.25 | 2.25 | 23% |
| Structure in FIG. 15C | 4.27E−16 | 1.80 | 1.8 | 18% |

When a photonic crystal (pillar) periodic structure and a nano-PSS-derived AlN connected-pillar structure were added to the rear surface of the sapphire substrate in the structure that has mounted thereon the transparent p-AlGaN contact layer, the photonic crystal (hole) periodic structure, and the ultrathin Ni layer (1 nm) as illustrated in FIG. 15A, the light extraction efficiency further increased to 27% from 25% of the structure in FIG. 4E, that is, increased by 2%.

As illustrated in FIG. 15B, when the thickness of the Ni layer was increased from 1 nm to 10 nm, the Ni layer absorbed light to some extent, and the light extraction efficiency increased from 22% to 23%, that is, increased by 1%.

To the contrary, when a photonic crystal (pillar) periodic structure and a nano-PSS-derived AlN connected-pillar structure are added to the rear surface of the sapphire substrate in the structure including the p-GaN contact layer and the Ni layer with a thickness of 10 nm that absorb deep ultraviolet light as illustrated in FIG. 15C, the light extraction efficiency remained 18% and not increased at all.

Consequently, it is found that with a structure based on the transparent p-AlGaN contact layer, the photonic crystal (hole) periodic structure, and the ultrathin Ni layer (1 nm), absorption of deep ultraviolet light can be suppressed. Therefore, such a structure can also be used as a base for improving a variety of structures for improving the light extraction efficiency, such as a nano-PSS-derived AlN connected-pillar structure, for example.

Fourth Embodiment

Figure 16:
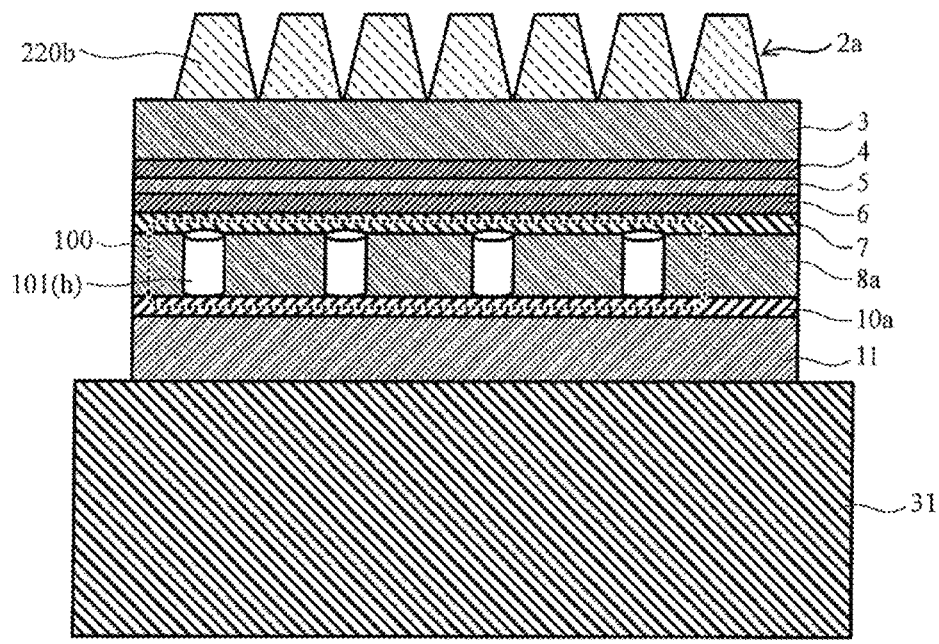
FIG. 16 is a cross-sectional view of a deep ultraviolet LED obtained by providing photonic crystals (holes) in a structure based on a transparent p-AlGaN contact layer and an ultrathin Ni layer and peeling a sapphire substrate off the LED and attaching a support substrate to the LED so that nano-PSS-derived AlN connected pillars are located on a light extraction plane.

A deep ultraviolet LED in accordance with the fourth embodiment of the present invention is, as illustrated in FIG. 16, based on the deep ultraviolet LED (FIG. 15A) including a nano-PSS-derived AlN connected-pillar structure in the third embodiment. In addition, the LED has a structure obtained by fabricating a deep ultraviolet LED including the transparent p-AlGaN contact layer 8a, the photonic crystal (hole) periodic structure 100, and the ultrathin Ni layer (1 nm) 10a, and then attaching a support substrate 31 to the side of the Al reflecting electrode layer 11 and peeling the sapphire substrate 1 off the LED so that the AlN connected pillars 220b are located on the light extraction plane.

That is, as a specific example, the structure includes the AlN connected pillars 220b, the n-AlGaN layer 3, the barrier layer 4, the quantum well layer 5, the barrier layer 6, the electron blocking layer 7, the transparent p-AlGaN contact layer 8a, the photonic crystal (hole) periodic structure 100, the ultrathin layer 10a, the Al reflecting electrode layer 11, and the support substrate 31.

Such a structure has the following three features.

The first feature is that the sapphire substrate 1 is peeled off the LED. Light from the LED is extracted from the rear surface and four sidewall surfaces of the sapphire substrate 1. In particular, the proportion of internal loss of deep ultraviolet light, which has been emitted from the quantum well layer 5 and has propagated, occurring on the four sidewall surfaces due to total internal reflection is large. Therefore, if the sapphire substrate 1 is peeled off the LED, the depth (thickness) of a portion formed by the semiconductor excluding the sapphire substrate 1 becomes about several μm, and the surface area of the four sidewall surfaces of the portion becomes smaller than the surface area of the front surface (surface). Therefore, internal light loss can be suppressed to an ignorable level.

The second feature is that since the AlN connected pillars 220b are exposed, deep ultraviolet light is radiated directly to the air from the AlN connected pillars 220b. The AlN connected pillars 220b have high effects of waveguides, and thus light is extracted to the outside of the LED in a manner condensed from the front surface. Therefore, the light extraction efficiency in the axial direction (5° to 20°) can be significantly improved.

The third feature is that since the support substrate 31 with excellent thermal conductivity is attached, the external heat radiation efficiency is improved, and thus the lifetime of the deep ultraviolet LED is extended.

It should be noted that not all of the aforementioned features 1 to 3 need to be provided.

Such a deep ultraviolet LED in accordance with the fourth embodiment will be described more specifically.

A computation model analyzed with the FDTD method has a design wavelength of 265 nm and a degree of polarization of 0.07, and thus has the same structure as that in FIG. 16. Therefore, a specific thickness is as follows.

As illustrated in FIG. 16, the computation model includes, sequentially from the top of the view, AlN connected pillars 220b (4 μm), an n-AlGaN layer 3 (1.4 μm), a barrier layer 4 (10 nm), a quantum well layer 5 (10 nm), a barrier layer 6 (10 nm), an electron blocking layer 7 (40 nm), a transparent p-AlGaN contact layer 8a (350 nm), an Al reflecting electrode layer 11 (210 nm), and a support substrate 31 (10 μm). The total thickness is 16,030 nm, which is the same thickness as that of the model in each embodiment described above.

The output value was determined in a far field, and the output magnification of the output value of the structure in each embodiment relative to the output value of the conventional LED structure illustrated in FIG. 4A was determined.

Further, regarding the output magnification of the LED structure in FIG. 16 computed with an ultrathin Ni layer with a thickness of 1 nm omitted due to the limitations of computational resources, correction was applied through subtraction therefrom a magnification corresponding to an output decrease of 7% for an ultrathin Ni layer with a thickness of 1 nm, as determined through another analysis.

The result was also compared with the LED structure in accordance with the third embodiment illustrated in FIG. 15A. Further, the light extraction efficiency in the axial direction (in the range of angles of 5° to 20°) was added.

The light extraction efficiency (LEE) of the conventional LED structure illustrated in FIG. 4A was 10%, and the LEE of the other structures was determined through multiplication by a correction magnification (see Table 7A).

TABLE 7A

| | Output (w) | Output Magnification | Output Magnification for 1 nm Ni (−7%) Correction | Light Extraction Efficiency (LEE) | Output Magnification in the Axial Direction |
|---|---|---|---|---|---|
| Structure in FIG. 15A | 6.62E−16 | 2.79 | 2.72 | 27% | 4.33 |
| Structure in FIG. 16 | 6.68E−16 | 2.81 | 2.74 | 27% | 6.70 |

Table 7A is a table representing the properties of the structure in FIG. 15A and the structure in FIG. 16.

As is obvious from the results in Table 7A, the LED structure in accordance with this embodiment illustrated in FIG. 16 has a light extraction efficiency of 27%, which is the highest value. In addition, the LED structure in accordance with this embodiment illustrated in FIG. 16 has the highest magnification of the light extraction efficiency in the axial direction that is 6.7 times that of the conventional deep ultraviolet LED with a p-GaN contact. This value is high even when compared with the value in FIG. 15A.

Accordingly, it was confirmed that peeling the sapphire substrate 1 off the LED can suppress deterioration of the light extraction efficiency due to total internal reflection occurring on the sidewalls of the substrate 1 and thus has the effect of improving the light extraction efficiency in the axial direction with the aid of the waveguide effects of the AlN connected pillars 220b.

In practice, the photonic crystal (hole) periodic structure 100 included in the LED structure illustrated in FIG. 16 contributes to improving the light extraction efficiency in the axial direction. Therefore, in order to verify the waveguide effects of the AlN connected pillars 220b alone, computation models were created using the structures in FIGS. 4A and 4B and a structure obtained by removing the photonic crystal (hole) periodic structure 100 from the structure in FIG. 16 (referred to as an "AlN connected-pillar LED structure"). Table 7B shows the results of performing analysis using the FDTD method and directly comparing the output magnifications of the LED structures in the axial direction.

It should be noted that the structure in FIG. 4A is the structure of the conventional LED with a p-GaN contact layer, and the structure in FIG. 4B is an LED structure obtained by replacing the p-GaN contact layer with a transparent p-AlGaN contact layer.

Figure 23:
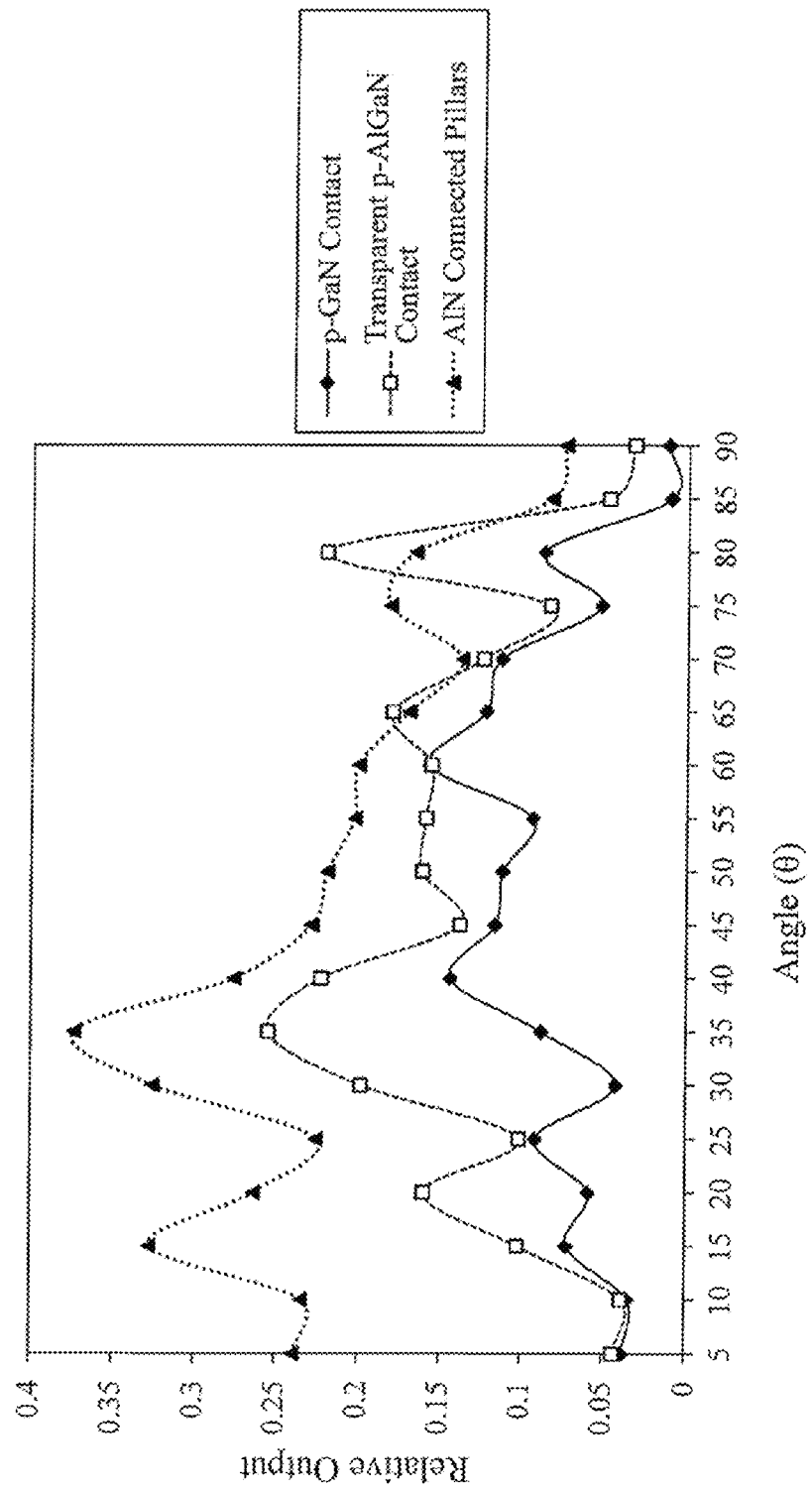
FIG. 23 is a graph illustrating the light distribution properties of a conventional LED, an LED with a transparent p-AlGaN contact layer, and an LED with AlN connected pillars.

In addition, FIG. 23 is a graph illustrating the light distribution properties of the conventional LED, the LED with a transparent p-AlGaN contact layer, and the LED with AlN connected pillars. Table 7B shows an output value obtained by adding up all outputs at 5° to 90° (the horizontal direction is 90° and the vertical direction is 0°).

TABLE 7B

|  | Output (w) | Output Magnification in the Axial Direction (Relative to the Structure in FIG. 4A) | Output Magnification in the Axial Direction (Relative to the Structure in FIG. 4B) |
| --- | --- | --- | --- |
| Structure in FIG. 4A | 2.37E-1 6 | | |
| Structure in FIG. 4B | 4.18E-1 6 | 1.9 | |
| Structure Obtained by Removing the Photonic Crystal Periodic Structure from the Structure in FIG. 16 | 5.82E-16 | 4.9 | 2.6 |

The results in Table 7B can confirm that the output magnification in the axial direction of the AlN connected pillars of the AlN connected-pillar LED, is 4.9 times that of the structure of the conventional LED, and is also 2.6 times that of the structure based on a transparent p-AlGaN contact layer. Comparing such value of the AlN connected-pillar LED with the value 6.7 of the LED structure illustrated in FIG. 16 (an AlN connected-pillar LED provided with photonic crystals) can verify that the degree of contribution of the AlN connected pillars to improving the output magnification in the axial direction is as high as 4.9/6.7=73%, and thus can verify the waveguide effects of the AlN connected pillars.

It should be noted that as is clear from FIG. 23 indicating the light distribution property of the LED with the structure shown in Table 7B, the waveguide effects of the AlN connected pillars are quite high in the range of angles of about 5° to 40°. The results of the light distribution property can also confirm the advantage of the waveguide effects of the AlN connected pillars of the LED.

Fifth Embodiment

Next, the fifth embodiment of the present invention will be described in detail with reference to the drawings.

Figure 17B:
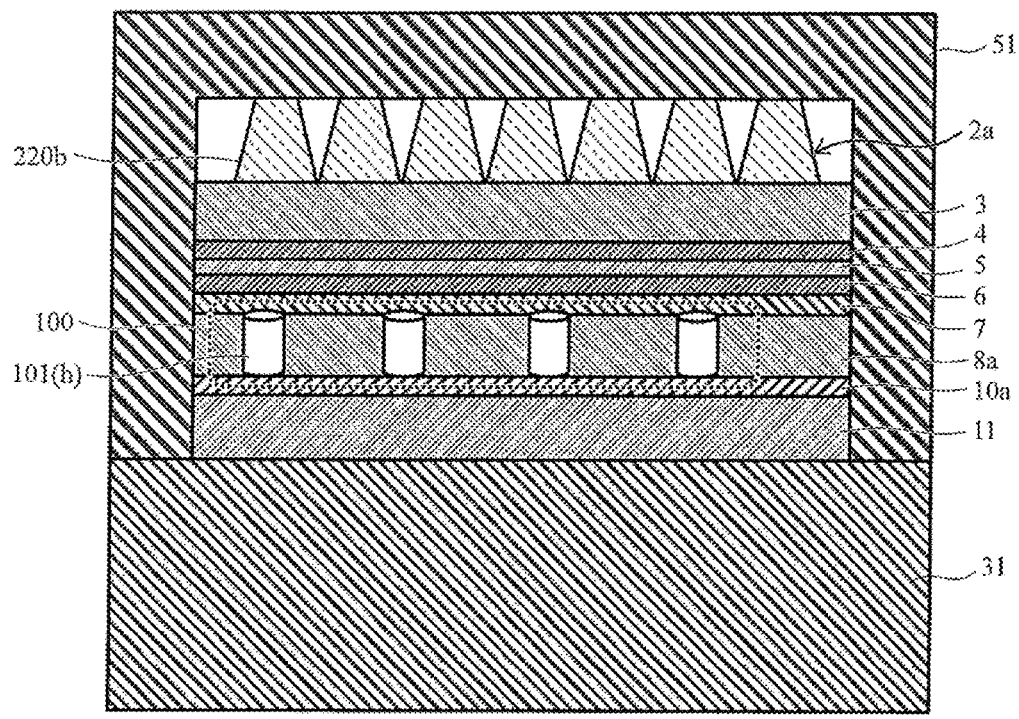
FIG. 17B is a cross-sectional view of a deep ultraviolet LED obtained by providing photonic crystals (holes) in a structure based on a transparent p-AlGaN contact layer and an ultrathin Ni layer and peeling a sapphire substrate off the LED and attaching a support substrate to the LED so that nano-PSS-derived AlN connected pillars are located on a light extraction plane, and further, encapsulating the LED in resin.

A deep ultraviolet LED in accordance with this embodiment is obtained by, for example, forming a resin structure, which has a refractive index of about 1.5 and is transparent to deep ultraviolet light, on the outer side of the deep ultraviolet LED structure described in the third embodiment or fourth embodiment through an encapsulation process or the like. FIGS. 17A and 17B are cross-sectional views of exemplary LED structures.

The LED structure illustrated in FIG. 17A is obtained by providing resin 41 for encapsulation on the outer side of the structure in FIG. 15B.

As illustrated in FIG. 17A, the deep ultraviolet LED in accordance with this embodiment has a photonic crystal (pillar) periodic structure 110 formed on the rear surface of a sapphire substrate 1, and includes, sequentially arranged on the sapphire substrate 1 toward the side of the front surface (toward the lower side of the view), a nano-PSS (triangular pyramidal) periodic structure 220a formed on the front surface of the sapphire substrate 1, AlN connected pillars 220b, an n-AlGaN layer 3, a barrier layer 4, a quantum well layer 5, a barrier layer 6, an electron blocking layer 7, a transparent p-AlGaN contact layer 8a, a photonic crystal (hole) periodic structure 100, an ultrathin Ni layer 10a, an Al reflecting electrode 11, and resin 41 for encapsulation.

Meanwhile, the LED structure illustrated in FIG. 17B is similar to the structure in FIG. 16, and includes, sequentially from the top of the view, AlN connected pillars 220b, an n-AlGaN layer 3, a barrier layer 4, a quantum well layer 5, a barrier layer 6, an electron blocking layer 7, a transparent p-AlGaN contact layer 8a, a photonic crystal (hole) periodic structure 100, an ultrathin Ni layer 10a, an Al reflecting electrode 11, a support substrate 31, and resin 51 for encapsulation.

The main features of the structures are as follows.

In the deep ultraviolet LED structure illustrated in FIG. 17A, light is extracted from the rear surface and the four sidewall surfaces of the sapphire substrate 1. Since the sapphire and the air have a large difference in refractive index, light is totally internally reflected at the interface therebetween.

In the deep ultraviolet LED structure illustrated in FIG. 17B also, there is a large difference in refractive index between the semiconductor layer and the air on the four sidewall surfaces of the sapphire substrate 1, and light is totally internally reflected at the interface therebetween.

Herein, if transparent resin 41 and 51, each having a refractive index of about an intermediate level between the air and the sidewalls, is provided at a position surrounding the outer side of the deep ultraviolet LED structure, it becomes possible to mitigate the influence of total internal reflection occurring on the side surfaces of the sapphire substrate 1, and thus improve the light extraction efficiency.

In particular, the influence of an internal loss of deep ultraviolet light, which has been emitted from the quantum well layer 5 and has propagated, occurring on the four sidewall surfaces of the sapphire substrate 1 due to total internal reflection is large. If the sapphire substrate 1 is peeled off the LED, an internal light loss can be suppressed to an ignorable level because the surface area of the four sidewall surfaces of the semiconductor portion with a depth of about several μm is smaller than the surface area of the front surface.

The deep ultraviolet LED in accordance with this embodiment will be described more specifically. Computation models analyzed with the FDTD method have a design wavelength of 265 nm and a degree of polarization of 0.07. Specific structures are the same as those in FIGS. 15B and 16 except that the ultrathin Ni layer (1 nm) 10a is omitted due to the limitations of computational resources. Table 8 represents the thickness of each structure.

TABLE 8

|  | Structure in FIG. 17A | Structure in FIG. 17B |
| --- | --- | --- |
| Photonic Crystals (Pillars) on the Rear Surface of the Substrate | 300 nm | — |
| Sapphire Substrate | 10 μm | — |
| Nano-PSS on the Front Surface of the Substrate | 200 nm | — |
| AlN Connected-Pillar Columnar Structure | 4 μm | 4 μm |

TABLE 8-continued

|  | Structure in FIG. 17A | Structure in FIG. 17B |
|---|---|---|
| n-AlGaN Layer | 1.4 μm | 1.4 μm |
| Barrier Layer | 10 nm | 10 nm |
| Quantum Well Layer | 10 nm | 10 nm |
| Barrier Layer | 10 nm | 10 nm |
| Electron Blocking Layer | 40 nm | 40 nm |
| p-AlGaN Layer | — | — |
| Transparent p-AlGaN Contact Layer | 350 nm | 350 nm |
| p-GaN Contact Layer | — | — |
| Photonic Crystals (Holes) in the Contact Layer | 300 nm | 300 nm |
| Al Reflecting Electrode | 200 nm | 10200 nm |
| Total | 16,030 nm | 16,030 nm |
| Resin for Encapsulation | 1 μm | 1 μm |

The output value was determined in a far field, and the output magnification of the output value of each of the structures (FIG. 17A, FIG. 17B) relative to the output value of the deep ultraviolet LED with the conventional structure illustrated in FIG. 4A was determined. For the values in Table 8, correction of the output magnification was applied through subtraction therefrom a magnification corresponding to an output decrease of 7% for an ultrathin Ni layer with a thickness of 1 nm that has been omitted in the computation models analyzed with the FDTD method. In addition, the values of the light extraction efficiency in the axial direction (5° to 20°) are also shown. The light extraction efficiency (LEE) of the deep ultraviolet LED with the conventional structure in FIG. 4A was 10%, and the LEE of the other structures (FIG. 17A, FIG. 17B) was determined through multiplication by a correction magnification (see Table 8).

TABLE 9

|  | Output (w) | Output Magnification | Output Magnification for 1 nm Ni (−7%) Correction | Light Extraction Efficiency (LEE) | Output Magnification in the Axial Direction |
|---|---|---|---|---|---|
| Structure in FIG. 17A | 7.47E−16 | 3.15 | 3.08 | 31% | 4.9 |
| Structure in FIG. 17B | 7.45E−16 | 3.14 | 3.07 | 31% | 4.5 |

As shown in Table 9, the light extraction efficiency of each of FIGS. 17A and 17B is 31%, which is the highest value. Thus, it was confirmed that encapsulating the entire deep ultraviolet LED in transparent resin can mitigate total internal reflection and thus improve the light extraction efficiency.

It should be noted that as the extraction efficiency of light from the four sidewall surfaces was improved, the effect of improving the light extraction efficiency in the axial direction was not seen in the structure of FIG. 17B from which the sapphire substrate 1 had been peeled off.

As described above, regarding the deep ultraviolet LED in accordance with this embodiment, it was found that encapsulating the entire deep ultraviolet LED in transparent resin can mitigate total internal reflection and thus improve the light extraction efficiency.

Sixth Embodiment

Next, the sixth embodiment of the present invention will be described in detail.

A deep ultraviolet LED in accordance with the sixth embodiment of the present invention has improved light extraction efficiency by being formed as a package structure in which an Al reflecting film 61 is provided on the outer side of the sidewall of the deep ultraviolet LED described in each of the third embodiment and the fifth embodiment. FIGS. 18A and 18B are cross-sectional views illustrating exemplary structures thereof. FIG. 18A illustrates a structure corresponding to FIG. 14A, and FIG. 18B illustrates a structure corresponding to FIG. 17A.

Light emitted to the outside of the LED is designed to be reflected in the upward direction of the view by the Al reflecting film 61. Therefore, the extraction efficiency of light from the axial direction is significantly improved.

However, part of light that has reached the Al reflecting film 61 on the side surface returns to the inside of the LED. Since the reflectivity of an Al reflecting film with respect to light with a wavelength of 265 nm is about 90%, 10% of the light will be lost in one reflection. In order to suppress such a phenomenon, the light extraction efficiency in the axial direction should be improved.

The deep ultraviolet LED in accordance with the sixth embodiment will be described in more detail. Computation Models analyzed with the FDTD method have a design wavelength of 265 nm and a degree of polarization of 0.07. The structures used for the analysis are the cross-sectional structures in FIGS. 19A and 19B corresponding to FIGS. 18A and 18B, respectively.

The thickness of each of the specific structures is the same as that of the structure of FIG. 17A shown in Table 8.

That is, the structures in FIGS. 19A and 19B are different from the actual structures in FIGS. 18A and 18B, respectively due to the limitations of computational resources. Specifically, each structure has an Al reflecting film 61a (with a thickness of 200 nm) provided on each sidewall portion that stands upright in the perpendicular direction with respect to the interface of the semiconductor of the LED.

Therefore, in comparison with the actual structures in FIGS. 18A and 18B, light that has reached the Al reflecting film 61a is reflected to the inside of the LED, and returns to the Al reflecting film again, and such reflection and absorption are repeated. In such a structure, the light extraction efficiency decreases in comparison with that of the actual structures. Therefore, the computation method was devised as follows.

An output monitor that detects an output was disposed only at the top portion to determine the output value in a far field, and the output magnification of the output value of the top portion of each of the structures relative to the output value of the output portion of the conventional structure in FIG. 4A was determined. In addition, for the models, the output magnification was corrected through subtraction therefrom a magnification corresponding to an output decrease of 7% for an omitted ultrathin Ni layer with a thickness of 1 nm. Further, the light extraction efficiency in the axial direction (5° to 20°) was added. The light extraction efficiency (LEE) of the conventional structure in FIG. 4A was 10%, and the LEE of the other structures was determined through multiplication by a correction magnification (see Table 10).

TABLE 10

| | Output of the Top Portion (w) | Output Magnification | Output Magnification for 1 nm Ni (−7%) Correction | Light Extraction Efficiency (LEE) | Output Magnification in the Axial Direction |
|---|---|---|---|---|---|
| Structure in FIG. 4A | 4.71E−17 | — | — | — | — |
| Structure in FIG. 19A | 2.75E−16 | 5.85 | 5.68 | 57% | 7.7 |
| Structure in FIG. 19B | 2.80E−16 | 5.96 | 5.89 | 59% | 7.1 |

In each of the computation models herein, an output monitor was disposed only at the top portion. Therefore, it is difficult to simply compare an output value of each model with that obtained in each embodiment.

However, from Table 10, it is found that the effect of the contribution of the Al reflecting film 61a in accordance with this embodiment to improving the light extraction efficiency is quite high. Specifically, in each of the structures in FIGS. 19A and 19B, the light extraction efficiency was significantly improved to 57% to 59%, which are five times or more that of the conventional structure.

In particular, it was found that the output magnification in the axial direction (5° to 20°) was significantly improved, specifically, to 7.1 to 7.7 times that of the conventional structure. The results mean that considering the fact that the reflectivity of an Al reflecting electrode or an Al reflecting film with respect to deep ultraviolet light is about 90%, high efficiency, which is not inferior to a reflectivity of 80% of commercially available blue or white LEDs is achieved. That is, when the measure in accordance with each embodiment of the present invention is taken, specifically, when various measures described in the third to sixth embodiments are applied to a base structure obtained through an appropriate arrangement of a photonic crystal periodic structure in accordance with the first and second embodiments, high efficiency can be achieved as with commercially available blue and white LEDs. Therefore, according to the deep ultraviolet LED structure in accordance with this embodiment, the efficiency can be increased to the level of the commercially available LEDs.

Seventh Embodiment

Hereinafter, the seventh embodiment of the present invention will be described in detail.

The seventh embodiment of the present invention shows that the photonic crystal periodic structure, the nano-PSS periodic structure, and the like described in each embodiment are formed using an imprinting technique based on a nanoimprint lithography method.

According to the first to sixth embodiments, a large-area periodic structure is preferably imprinted onto a surface of an object to be processed at once.

Hereinafter, a production method that uses a technique of imprinting a photonic crystal periodic structure and a nano-PSS periodic structure using a nanoimprint lithography method will be described in more detail.

Nanoimprinting is an excellent technique of imprinting a large-area photonic crystal pattern of a mold onto organic resist, which has been applied to a substrate through spin coating, at once. If a resin film mold is used, it is possible to imprint a pattern even when the substrate is warped to a degree of about hundred microns. However, since priority is placed on the fluidity for organic resist for nanoimprinting, the etch selectivity of the resist with respect to a material on which a pattern is to be formed may not be always sufficient. Further, the pattern size of the mold does not coincide with the size of a pattern-formed portion after etching. In order to solve such problems, a process using bi-layer resist is performed as follows.

1) An imprinting technique using a bi-layer resist method is used in which a structure to be processed is first coated with lower-layer resist having high etch selectivity with respect to the structure, and then, the lower-layer resist is coated with upper-layer resist having fluidity and oxygen resistance.

2) It is also possible to use a mold for imprinting and use a resin film for the mold. More specifically, the surface of a substrate on which a periodic structure is to be formed is spin-coated with organic lower-layer resist having high etch selectivity with respect to the substrate, for example. Next, the surface of the lower-layer resist is spin-coated with silicon-containing upper-layer resist having fluidity and oxygen resistance performance, for example.

3) Next, a periodic structure is imprinted onto the surface of the upper-layer resist using a nanoimprint lithography method with the use of a mold.

4) Next, the upper-layer resist having the periodic structure imprinted thereto is exposed to oxygen plasma so that oxygen resistance is imparted thereto and the residual film of the upper-layer resist remaining after the nanoimprinting is removed.

5) Next, the organic lower-layer resist is etched with oxygen plasma using the upper-layer resist with oxygen resistance as a mask so that a mask for dry-etching the substrate is formed.

6) Finally, the substrate is dry-etched with ICP plasma using the mask as an etching mask.

The steps in 1) to 6) above are the imprinting technique that uses the bi-layer resist method for the substrate.

It should be noted that when such a process technology is used, it is possible to obtain, on an imprinted object (on a sapphire substrate, for example), an etch depth of about 1.5 times the depth of the periodic structure on the mold by changing the thickness of the lower-layer resist.

Further, if the upper-layer resist having a pattern imprinted thereto and having oxygen resistance is used as an etching mask, and each condition of oxygen plasma treatment is changed during oxygen plasma etching of the organic lower-layer resist so as to change the oxygen plasma condition in forming a mask of the upper-layer resist for the lower-layer resist, for example, it becomes possible to adjust the size of a pattern to be imprinted by about 30% the diameter of the periodic structure on the mold.

When such a method is used, it is possible to reproduce a fine periodic structure on an object to be processed accurately, correctly, and in a controllable state using the nanoimprint lithography method.

Hereinafter, examples of more specific steps will be described in detail with reference to the drawings. In order to obtain high light extraction efficiency, it is necessary to form a pattern on the order of nm as computed.

Figure 20:
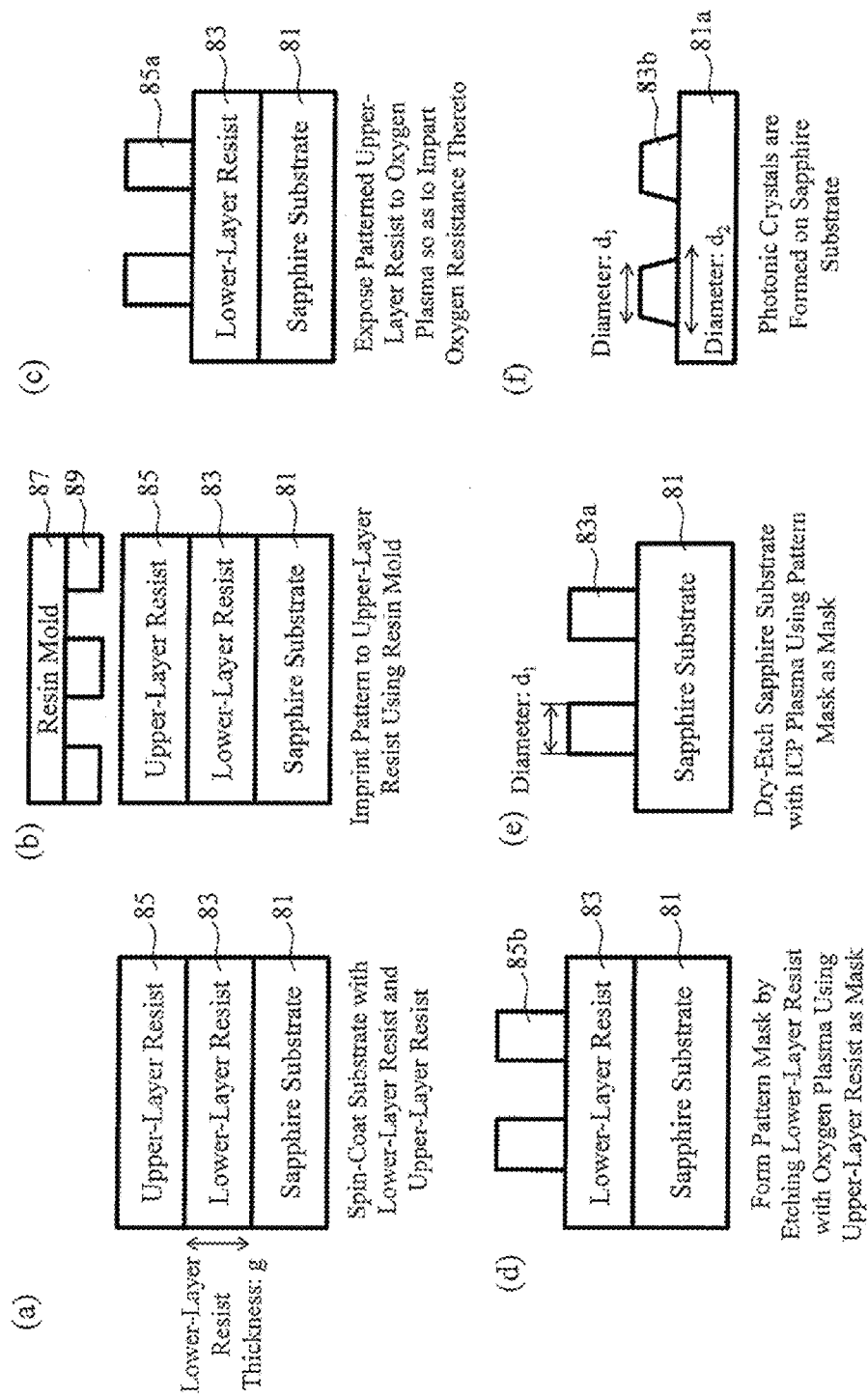
FIG. 20 are detailed views illustrating a process of forming photonic crystals using bi-layer resist.

FIG. 20 are views illustrating exemplary steps of producing a periodic structure in accordance with this embodiment.

In a method for producing a photonic crystal periodic structure and the like of a deep ultraviolet LED in accordance with this embodiment, an imprinting technique based on a nanoimprint lithography method using bi-layer resist, which has both the features of fluidity and etch selectivity, is used. Using the technique, a photonic crystal periodic structure with a fine pattern on the order of nm, for example, was imprinted to a sapphire substrate. Hereinafter, description will be made with reference to FIG. 20.

First, as illustrated in FIG. 20, a mold for correctly reproducing a periodic structure optimized in each embodiment onto a sapphire substrate is created. For the mold, a resin mold can also be used as illustrated in FIG. 20(b) so that it can follow warp of a sapphire substrate 81.

Next, organic lower-layer resist 83 with high etch selectivity is formed on the sapphire substrate 81 to a thickness of g through spin coating. It should be noted that the thickness g is selectively determined in accordance with the etch selectivity of the lower-layer resist 83 with respect to the sapphire substrate 81. After that, silicon-containing upper-layer resist 85 with fluidity and oxygen resistance performance are formed on the surface of the lower-layer resist 83 to a predetermined thickness through spin coating (FIG. 20(a)).

Next, patterns of the mold (resin mold) 87 and 89 are imprinted to the upper-layer resist 85 using a nanoimprinting system (FIG. 20(b)).

Next, the upper-layer resist 85, which has the patterns 87 and 89 of the mold imprinted thereto, is exposed to oxygen plasma so that oxygen resistance is imparted thereto and the residual film of the upper-layer resist remaining after the nanoimprinting is removed (FIG. 20(c)). Accordingly, an upper-layer resist pattern 85a is formed.

Next, the organic lower-layer resist 83 is etched with oxygen plasma using the upper-layer resist pattern 85a with oxygen resistance as a mask so that a pattern mask 85b for dry-etching the sapphire substrate 81 is formed (FIG. 20(d)). It should be noted that the diameter $d_1$ of the pattern mask on the sapphire substrate 81 side illustrated in FIG. 20(e) can be finely adjusted within the range of about 30% of $d_1$ if the oxygen plasma condition is adjusted.

Next, the sapphire substrate 81 is dry-etched with ICP plasma via the pattern mask so that a periodic structure 81a optimized in each embodiment of the present invention can be formed on the sapphire substrate 81 (FIG. 20(e)).

If the periodic structure is a pillar structure, the shape after the etching becomes a trapezoidal shape that roughly satisfies $d_1 < d_2$ as illustrated in FIG. 20(f), and the angle of each sidewall depends on the etch selectivity of the organic lower-layer resist. It should be noted that if the thickness g of the organic lower-layer resist is changed, the depth of the photonic crystal periodic structure that is formed on the sapphire substrate 81a after dry etching can be easily made about 1.5 times the depth of the mold.

In addition, if the diameter $d_1$ is changed during formation of the pattern mask instead of creating a new mold again, the diameter of the periodic structure can be easily changed by about 30%. Therefore, the time for producing the mold can be saved, which in turn contributes to reducing the cost or advantageously reducing the cost for producing a semiconductor light emitting element.

Figure 21:
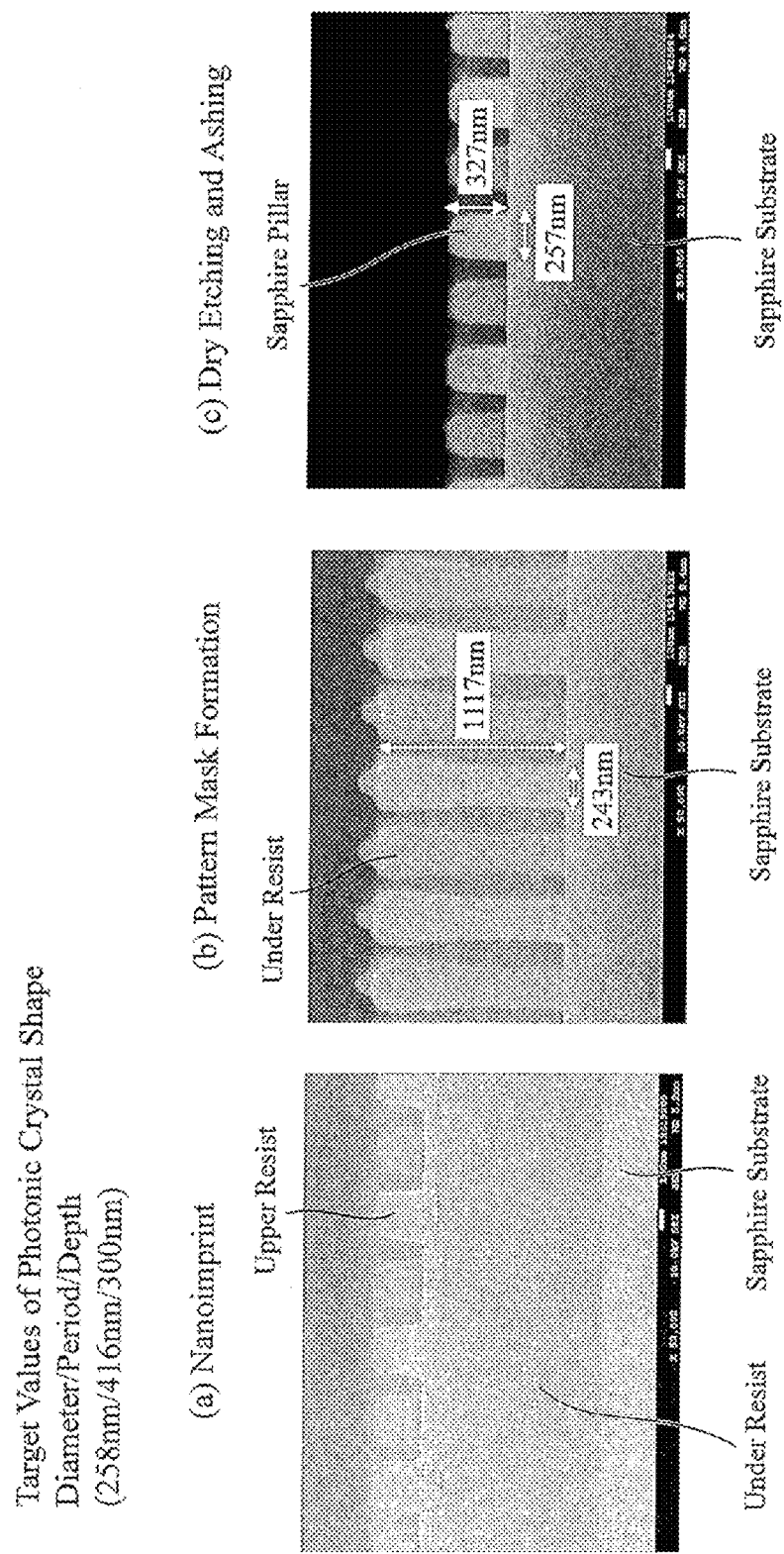
FIG. 21 are cross-sectional views each illustrating a cross-sectional SEM image during a process of forming photonic crystals.

FIGS. 21(a) to 21(c) illustrate the actual SEM photographs (nanoimprint-process phC pillar cross-sectional SEM) as "nanoimprint," "pattern mask formation," and "dry etching/ashing" taken when the steps in FIGS. 20(b), 20(d), and 20(f) were performed, respectively. A process and control that can produce a fine periodic structure as described above can be implemented through software processing by means of a CPU (Central Processing Unit) or a GPU (Graphics Processing Unit) or hardware processing by means of ASIC (Application Specific Integrated Circuit) or FPGA (Field Programmable Gate Array).

In the aforementioned embodiments, the configurations and the like illustrated in the attached drawings are not limited thereto, and the configurations and the like can be changed as appropriate within the range that the advantageous effects of the present invention are exerted. Besides, the configurations and the like can be changed as appropriate within the scope of the object of the present invention.

In addition, each constituent element of the present invention can be freely selected, and an invention that has the selected element(s) is also encompassed by the present invention.

It is also possible to perform a process of each unit by recording a program for implementing the function described in the embodiment on a computer-readable recording medium, causing a computer system to read the program recorded on the recording medium and execute it. It should be noted that the "computer system" as referred to herein includes an OS and hardware such as a peripheral device.

In addition, the "computer system" herein includes a website-providing environment (or display environment) if the WWW system is used.

Further, the "computer-readable recording medium" herein includes a portable medium such as a flexible disk, a magneto-optical disk, ROM, or CD-ROM, and a storage device such as a hard disk built in the computer system. Further, the "computer-readable recording medium" includes a medium that dynamically holds a program for a short period of time, like a communication line used to transmit a program over a network such as the Internet, or a communication line such as a telephone line, and a medium that holds a program for a given period of time, like a volatile memory in the computer system that serves as a server or a client in that case. In addition, the program can implement some of the aforementioned functions. Alternatively, the aforementioned functions can be implemented by being combined with a program that is already recorded in the computer system. At least some of the functions can also be implemented by hardware, such as an integrated circuit.

All publications, patents, and patent applications cited in this specification are all incorporated by reference into this specification.

INDUSTRIAL APPLICABILITY

The present invention is applicable to deep ultraviolet LEDs.

REFERENCE SIGNS LIST a Period of photonic crystal periodic structure
R Radius of periodic structure
h Depth of periodic structure obtained through processing
1 Sapphire substrate
2 AlN buffer layer
3 n-AlGaN layer
4 Barrier layer
5 Quantum well layer
6 Barrier layer
7 Electron blocking layer
8 p-AlGaN layer
8a Transparent p-AlGaN contact layer
10 Ni layer
10a Ultrathin Ni layer
11 Al reflecting electrode layer
31 Support substrate
41, 51 Resin for encapsulation
61, 71 Al reflecting film
100 First (reflecting) photonic crystal periodic structure 101(h) Circular void (columnar structure (hole))
110 Second photonic crystal periodic structure
111(p) Pillar
220 Nano-PSS and connected-pillar periodic structure
220a Nano-PSS periodic structure
220b AlN connected pillars All publications, patents, and patent applications cited in this specification are all incorporated by reference into this specification.

The invention claimed is:

1. A deep ultraviolet LED with a design wavelength λ, comprising:
a reflecting electrode layer, an ultrathin metal layer, and a transparent p-AlGaN contact layer that are sequentially arranged from a side opposite to a growth substrate; and
a first reflecting photonic crystal periodic structure including a plurality of voids provided in a range of a thickness direction of the transparent p-AlGaN contact layer,
wherein:
the first reflecting photonic crystal periodic structure has a photonic band gap that opens for traversal electric (TE) polarized components,
the design wavelength λ and a period a and an average refractive index $n_{av}$ of the first reflecting photonic crystal periodic structure satisfy a formula of a Bragg condition (m×λ/$n_{av}$=2a),
an order m of the Bragg condition is in a range of 2<m<5, and
provided that a radius of each void is R, R/a at which a maximum photonic band gap is obtained is selected, and
provided that a depth of the void is h, h≥2/3a.

2. The deep ultraviolet LED according to claim 1, wherein the first reflecting photonic crystal periodic structure is provided such that it further extends in the thickness direction to a range of the reflecting electrode layer.

3. A method for producing the deep ultraviolet LED according to claim 1, wherein the first reflecting photonic crystal periodic structure is formed using an imprinting technique based on a nanoimprint lithography method.

4. The method for producing the deep ultraviolet LED according to claim 3, wherein the first reflecting photonic crystal periodic structure is formed using dry etching based on a bi-layer resist method that uses resist with high fluidity and resist with high etch selectivity.

5. A method for producing the deep ultraviolet LED according to claim 1, wherein parameters of the first reflecting photonic crystal periodic structure are determined using a parameter computation method including:
a step of tentatively determining a ratio (R/a) between the period a and a radius R of each void that are parameters of the periodic structure;
a step of computing the average refractive index $n_{av}$ from refractive indices $n_1$ and $n_2$ of the void and the R/a, and substituting the average refractive index $n_{av}$ into a formula of the Bragg condition, thereby obtaining the period a and the radius R for each order m;
a step of analyzing a photonic band structure for TE light using a plane wave expansion method that uses the R/a, the wavelength λ, and dielectric constants $\in_1$ and $\in_2$ of the structure obtained from the refractive indices $n_1$ and $n_2$;
a step of determining R/a at which a PBG between a first photonic band and a second photonic band for TE light becomes maximum by repeatedly changing a value of the tentatively determined R/a;
a step of determining, for R/a at which the PBG becomes maximum, light extraction efficiency for light with the wavelength λ through a simulation analysis using a finite-difference time-domain method (FDTD method) that is performed by using as variables the individual period a and radius R corresponding to each order m of the Bragg condition and a given depth h of the periodic structure; and
a step of determining the order m of the Bragg condition at which the light extraction efficiency for light with the wavelength λ becomes maximum, and the radius R and the depth h that are the parameters of the periodic structure corresponding to the order m by repeatedly performing simulation analysis using the FDTD method.

6. The deep ultraviolet LED according to claim 1, further comprising a second photonic crystal periodic structure on a rear surface (side) of the growth substrate, the second photonic crystal periodic structure including two structures with different refractive indices,
wherein:
the second photonic crystal periodic structure includes a second structure having a periodic structure of the air and a medium of the growth substrate.

7. The deep ultraviolet LED according to claim 6, wherein:
in the second photonic crystal periodic structure, the design wavelength λ in a vacuum and the period a and the radius R, which are the parameters of the periodic structure, satisfy the Bragg condition, and a photonic band structure for TM light includes two photonic band gaps within first to fourth photonic bands when R/a is in a range of 0.20 to 0.40,
the photonic band gap is open for TM light and thus has a high transmission effect,
the R/a is a value corresponding to a maximum value of each photonic band gap at the order m=3 or 4, or
the R/a is a value that is, at the order m=3 or 4, in point contact with or proximate to, when an ordinate axis (ωa/2πc) of the photonic band structure is converted into the wavelength $λ_v$ in a vacuum, the wavelength $λ_v$ in a vacuum ×m at one of points Γ, M, and K that are points of symmetry of a second photonic band ($2_{nd}$ PB), or
the R/a is a value that is, at the order m=3, in point contact with or proximate to, when the ordinate axis (ωa/2πc) of the photonic band structure is converted into the wavelength $λ_v$ in a vacuum ×3 ($λ_v$×3), one of points of symmetry of the fourth photonic band ($4_{th}$ PB) obtained through multiplication of the length of the period of the fourth photonic band ($4_{th}$ PB) by 5 and 6, or
the R/a is a value that is, at the order m=4, in point contact with or proximate to, when the ordinate axis (ωa/2πc) of the photonic band structure is converted into the wavelength $λ_v$ in a vacuum ×4 ($λ_v$×4), one of points of symmetry of the fourth photonic band ($4_{th}$ PB) obtained through multiplication of the length of the period of the fourth photonic band ($4_{th}$ PB) by 6, 7, and 8, and
parameters of each periodic structure are parameters obtained by computing photonic crystals having the selected R/a and the depth h that is greater than or equal to 0.5a, using the FDTD method, and are finally determined so as to optimize a rate of change of the light extraction efficiency and a light distribution property.

8. A method for producing the deep ultraviolet LED according to claim 7, wherein parameters of the second photonic crystal periodic structure are determined using a parameter computation method including:
a first step of changing a ratio (R/a) between a period a and a radius R of the second structure that are parameters of the periodic structure;
a second step of computing an average refractive index $n_{av}$ from refractive indices $n_1$ and $n_2$ of the second structure and the R/a, and substituting the average refractive index $n_{av}$ into the formula of the Bragg condition, thereby obtaining the period a and the radius R for each of the order m=3 and m=4;
a third step of analyzing a photonic band structure for TM light using a plane wave expansion method that uses the R/a, the wavelength λ, and dielectric constant $\in_1$ and $\in_2$ of the structure obtained from the refractive indices $n_1$ and $n_2$;
a fourth step of converting the ordinate axis (ωa/2πc) of each of the second photonic band ($2_{nd}$ PB) and the fourth photonic band ($4_{th}$ PB) for TM light into the wavelength $λ_v$ in a vacuum and obtaining a photonic band structure for $λ_v$ and ka/2π at the order m=1;
a fifth step of determining R/a that is, at the order m=3 and m=4, in point contact with or proximate to the wavelength $λ_v$ in a vacuum xm at each of points of symmetry of the second photonic band ($2_{nd}$ PB) and the fourth photonic band ($4_{th}$ PB) for TM light, and selecting the determined R/a as a candidate for optimization; and
a sixth step of computing the rate of change of the light extraction efficiency and the light distribution property of the photonic crystals corresponding to the R/a selected in the fifth step and selecting, as the depth, a given value that is greater than or equal to 0.5 times the length of the period a that is the largest at the order m=3 to 4.

9. A method for producing the deep ultraviolet LED according to claim 6, wherein parameters of the second photonic crystal periodic structure are determined using a parameter computation method including:
a first step of changing the ratio (R/a) between the period a and the radius R of the structure that are the parameters of the periodic structure;
a second step of computing an average refractive index $n_{av}$ from refractive indices $n_1$ and $n_2$ of the second structure and the R/a, and substituting the average refractive index $n_{av}$ into the formula of the Bragg condition, thereby obtaining the period a and the radius R for each of the order m=3 and m=4;
a third step of selecting, as a candidate for optimization, R/a at which the order m=3 and 4 correspond to maximum values of two photonic band gaps that are obtained by analyzing a photonic band structure for TM light using a plane wave expansion method that uses the R/a, the wavelength λ, and the dielectric constants $\in_1$ and $\in_2$ of the structure obtained from the refractive indices $n_1$ and $n_2$;
a fourth step of converting the ordinate axis (ωa/2πc) of each of the second photonic band ($2_{nd}$ PB) and the fourth photonic band ($4_{th}$ PB) for TM light into the wavelength $λ_v$ in a vacuum and obtaining a photonic band structure for $λ_v$ and ka/2π at the order m=1;
a fifth step of determining R/a that is, at the order m=3 and 4, in point contact with or proximate to the wavelength $λ_v$ in a vacuum xm at each of points of symmetry of the second photonic band ($2_{nd}$ PB) and the fourth photonic band ($4_{th}$ PB) for TM light, and selecting the determined R/a as a candidate for optimization;
a sixth step of computing a rate of change of the light extraction efficiency and the light distribution property of the photonic crystals corresponding to the R/a selected in the fifth step and selecting, as the depth, a given value that is greater than or equal to 0.5 times the length of the period a that is the largest at the order m=3 to 4; and
a seventh step of selecting the R/a and the order m at which the rate of change of the light extraction efficiency (LEE) is high and the light distribution property is high, thereby determining the parameters that are the diameter, the period, and the depth.

10. A method for producing the deep ultraviolet LED according to claim 6, wherein the second photonic crystal periodic structure is formed using an imprinting technique based on a nanoimprint lithography method.

11. A method for producing the deep ultraviolet LED according to claim 6, wherein the second photonic crystal periodic structure is formed by dry etching based on a bi-layer resist method that uses resist with high fluidity and resist with high etch selectivity.

12. The deep ultraviolet LED according to claim 6, further comprising a waveguide structure between the first reflecting photonic crystal periodic structure and the second photonic crystal periodic structure.

13. The deep ultraviolet LED according to claim 12, wherein the waveguide structure includes a triangular pyramidal nano-PSS periodic structure provided on a front surface of the growth substrate, and an AlN connected-pillar periodic structure that is truncated hexagonal pyramidal in shape and is formed continuously with the nano-PSS periodic structure in the thickness direction.

14. A method for producing the deep ultraviolet LED according to claim 12, wherein the growth substrate is peeled off the LED, and a support substrate is attached to the reflecting electrode layer.

15. A method for producing the deep ultraviolet LED according to claim 13, wherein the growth substrate including the nano-PSS periodic structure is removed so that the AlN connected-pillar periodic structure is located on a side of a light extraction plane.

16. The deep ultraviolet LED according to claim 12, further comprising resin on an outer side of the deep ultraviolet LED, the resin being transparent to deep ultraviolet light, wherein a refractive index of the resin is greater than that of the air and is less than that of a compound semiconductor layer including the growth substrate.

17. The deep ultraviolet LED according to claim 16, further comprising an Al reflecting film on an outer side of a sidewall of the deep ultraviolet LED, wherein the Al reflecting film has a structure formed to reflect deep ultraviolet light reaching the Al reflecting film such that the light propagates in an upward direction of the deep ultraviolet LED.

18. The deep ultraviolet LED according to claim 1, wherein the ultrathin metal layer has a thickness of about 1 nm.

19. A method for producing the deep ultraviolet LED according to claim 1, comprising:
a step of preparing a stacked structure with a design wavelength λ, the stacked structure including, sequentially arranged from a side opposite to a growth substrate, a reflecting electrode layer, a metal layer, and a p-AlGaN layer that is transparent to light with the wavelength λ;
a step of preparing a mold for forming a photonic crystal periodic structure to be provided in a range of a thickness direction of the p-AlGaN layer;

a step of forming a resist layer on the stacked structure and imprinting a structure of the mold to the resist layer; and a step of sequentially etching the stacked structure using the resist layer as a mask, thereby forming the photonic crystal periodic structure.

20. The method for producing a deep ultraviolet LED according to claim 19, wherein:

the step of forming the resist layer on the stacked structure and imprinting a structure of the mold to the resist layer includes:

a step of performing dry etching on the stacked structure based on a bi-layer resist method that uses a first resist layer with high fluidity and a second resist layer with high etch selectivity with respect to the first resist layer, and a step of imprinting the structure of the mold to the first resist layer using a nanoimprint lithography method, and the step of sequentially etching the stacked structure using the resist layer as a mask, thereby forming the photonic crystal periodic structure includes:

a step of etching the first resist layer and the second resist layer until the second resist layer is exposed and also etching a pattern projection portion of the first resist layer, and a step of sequentially etching the stacked structure using the second resist layer as a mask to form the photonic crystal periodic structure.

21. A deep ultraviolet LED comprising:

a reflecting electrode layer, an ultrathin metal layer, and a transparent p-AlGaN contact layer that are sequentially arranged from a side opposite to a growth substrate; and an AlN buffer layer including:

a nano-PSS (patterned sapphire substrate) periodic structure with triangular pyramidal holes or conical holes provided on a front surface of the growth substrate on the transparent p-AlGaN contact layer side, AlN that fills each of the triangular pyramidal holes or conical holes of the nano-PSS periodic structure, an AlN connected-pillar periodic structure formed in the thickness direction on the AlN, and a flat AlN film.

22. The deep ultraviolet LED according to claim 21, wherein the flat AlN film is in contact with an n-AlGaN layer that is provided on a side opposite to the transparent p-AlGaN contact layer with a quantum well layer interposed therebetween.

23. A method for producing the deep ultraviolet LED according to claim 21, wherein the triangular pyramidal holes or conical holes are formed through wet etching.

24. The deep ultraviolet LED according to claim 21, wherein the flat AlN film is provided in a range of from the triangular pyramidal holes or conical holes of the nano-PSS periodic structure to a terminal end of the AlN connected-pillar periodic structure.

25. A method for producing the deep ultraviolet LED according to claim 24, wherein the AlN connected-pillar periodic structure is formed through epitaxial growth.

26. A method for producing the deep ultraviolet LED according to claim 24, wherein the growth substrate including the nano-PSS periodic structure is removed so that the AlN connected-pillar periodic structure is located on a light extraction plane.

* * * * *